(12) United States Patent     (10) Patent No.: US 9,600,237 B2
Katoh     (45) Date of Patent: Mar. 21, 2017

(54) RANDOM NUMBER PROCESSING APPARATUS AND RANDOM NUMBER PROCESSING METHOD

(71) Applicant: Panasonic Intellectual Property Management Co., Ltd., Osaka (JP)

(72) Inventor: Yoshikazu Katoh, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 212 days.

(21) Appl. No.: 14/679,722

(22) Filed: Apr. 6, 2015

(65) Prior Publication Data

US 2015/0301802 A1     Oct. 22, 2015

(30) Foreign Application Priority Data

Apr. 16, 2014 (JP) ................. 2014-084173

(51) Int. Cl.
    *G06F 7/58*     (2006.01)
    *G11C 13/00*     (2006.01)
    *G06F 5/01*     (2006.01)

(52) U.S. Cl.
    CPC ............ *G06F 7/58* (2013.01); *G06F 5/01* (2013.01); *G06F 7/588* (2013.01); *G11C 13/0002* (2013.01); *G11C 13/0007* (2013.01)

(58) Field of Classification Search
None
See application file for complete search history.

(56) References Cited

U.S. PATENT DOCUMENTS

| 8,680,906 | B1 | 3/2014 | McDonald et al. |
| 2007/0174374 | A1 | 7/2007 | Inoha |
| 2009/0309646 | A1 | 12/2009 | Kobayashi et al. |
| 2009/0327379 | A1 | 12/2009 | Matsumoto et al. |
| 2010/0057820 | A1 | 3/2010 | Matsumoto et al. |

(Continued)

FOREIGN PATENT DOCUMENTS

| DE | 10358392 | 7/2005 |
| JP | 2008-146526 | 6/2008 |

(Continued)

OTHER PUBLICATIONS

The Extended European Search Report dated Sep. 17, 2015 for the related European Patent Application No. 15163087.8.

(Continued)

*Primary Examiner* — David H Malzahn
(74) *Attorney, Agent, or Firm* — McDermott Will & Emery LLP

(57) ABSTRACT

A random number processing apparatus includes a memory cell and a control circuitry. The memory cell has a characteristic in which a resistance value reversibly shifts between a plurality of resistance value ranges in accordance with an electric signal applied. The control circuitry generates random number data on the basis of a plurality of items of resistance value information obtained, at a plurality of different times, from the memory cell whose resistance value is in a certain resistance value range of the plurality of resistance value ranges. The resistance value of the memory cell randomly changes over time while the resistance value is within the certain resistance value range.

20 Claims, 29 Drawing Sheets

(56) References Cited

U.S. PATENT DOCUMENTS

| | | |
|---|---|---|
| 2011/0066670 A1 | 3/2011 | Yu |
| 2011/0123022 A1 | 5/2011 | Oishi et al. |
| 2012/0026784 A1* | 2/2012 | Kanai ............... G06F 7/588 365/158 |
| 2012/0030268 A1 | 2/2012 | Liu et al. |
| 2013/0073598 A1 | 3/2013 | Jacobson et al. |
| 2014/0056056 A1 | 2/2014 | Takagi et al. |
| 2014/0067890 A1 | 3/2014 | Zhu et al. |
| 2014/0136583 A1* | 5/2014 | Hyde ............... G06F 7/588 708/250 |
| 2014/0146607 A1 | 5/2014 | Nagai et al. |
| 2015/0213885 A1 | 7/2015 | Katoh |
| 2015/0213890 A1 | 7/2015 | Katoh |
| 2015/0227738 A1* | 8/2015 | Katoh ............... G09C 1/00 713/168 |
| 2015/0301802 A1* | 10/2015 | Katoh ............... G06F 5/01 708/190 |
| 2015/0340092 A1* | 11/2015 | Ogasahara ........ G11C 13/004 711/105 |
| 2015/0364192 A1* | 12/2015 | Yoshimoto ....... G11C 13/0069 365/148 |
| 2016/0011782 A1* | 1/2016 | Kurotsuchi ....... G06F 12/16 711/104 |
| 2016/0028544 A1* | 1/2016 | Hyde ............... H04L 9/0869 380/44 |
| 2016/0355140 A1* | 12/2016 | Condon ............ B60R 9/06 |

FOREIGN PATENT DOCUMENTS

| | | |
|---|---|---|
| JP | 2008-299595 | 12/2008 |
| JP | 2011-113136 | 6/2011 |
| JP | 2012-252195 | 12/2012 |
| WO | 2005/073842 | 8/2005 |
| WO | 2013/121792 | 8/2013 |
| WO | 2014/119327 | 8/2014 |
| WO | 2014/119329 | 8/2014 |

OTHER PUBLICATIONS

Stafford et al: "Random Character Generator", IP.Com Journal, IP.Com Inc., West Henrietta, NY, US, Nov. 1960 (Nov. 1960).

Yasuda S et al: "Physical Random Number Generator Based on MOS Structure After Soft Breakdown", IEEE Journal of Solid-State Circuits, vol. 39, No. 8, Aug. 2004 (Aug. 2004).

Akima H et al: "Single Electron Random Number Generator", IEICE Transactions on Electronics, vol. E87-C, No. 5, May 2004 (May 2004).

Andrew Rukhin et al., "A Statistical Test Suite for Random and Pseudorandom Number Generators for Cryptographic Applications" NIST, SP800-22 Revision 1a, Apr. 2010.

* cited by examiner

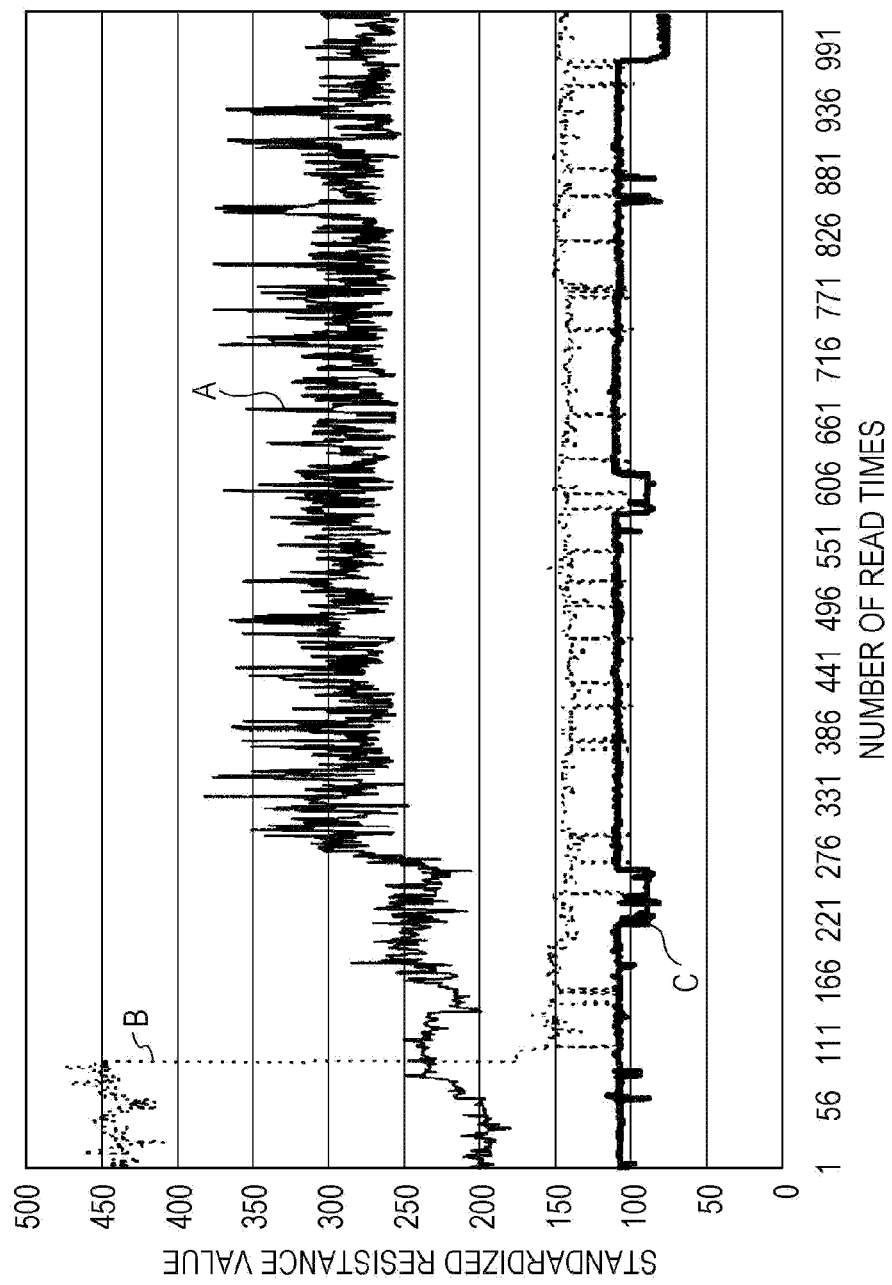

FIG. 19

HEXADECIMAL NOTATION

| | | | | | |
|---|---|---|---|---|---|
| 255 | 255 | 255 | 255 | | 0 |
| 255 | 255 | 255 | 9 | | 1 |
| 255 | 255 | 10 | 255 | | 2 |
| 255 | 255 | 11 | 9 | | 3 |
| 255 | 11 | 255 | 255 | | 4 |
| 255 | 9 | 255 | 10 | | 5 |
| 255 | 10 | 10 | 255 | | 6 |
| 255 | 10 | 10 | 10 | | 7 |
| 15 | 255 | 255 | 255 | | 8 |
| 11 | 255 | 255 | 9 | | 9 |
| 13 | 255 | 10 | 255 | | A |
| 9 | 255 | 9 | 10 | | B |
| 9 | 10 | 255 | 255 | | C |
| 9 | 10 | 255 | 9 | | D |
| 9 | 10 | 9 | 255 | | E |
| 9 | 11 | 10 | 10 | | F |

FIG. 20

HEXADECIMAL NOTATION

| | | | | | |
|---|---|---|---|---|---|
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 255 | 255 | 255 | 255 | | 0 |
| 11 | 255 | 255 | 255 | | 8 |
| 10 | 255 | 255 | 255 | | 8 |
| 11 | 255 | 255 | 255 | | 8 |
| 10 | 255 | 21 | 255 | | A |
| 11 | 255 | 255 | 255 | | 8 |

US 9,600,237 B2

RANDOM NUMBER PROCESSING APPARATUS AND RANDOM NUMBER PROCESSING METHOD

BACKGROUND

1. Technical Field

The present disclosure relates to a random number processing apparatus and a random number processing method.

2. Description of the Related Art

In accordance with the recent development of information societies, there is an increasing demand for advanced information security technologies. As a means of providing such technologies, various cryptographic systems are being utilized.

In cryptographic systems, pseudorandom numbers are typically used. The security of cryptographic systems is dependent on the randomness of random number values. The randomness of random number values of non-deterministic random numbers or physical random numbers is higher than that of pseudorandom numbers. In other words, it is more difficult to predict non-deterministic random numbers and physical random numbers than pseudorandom numbers.

Japanese Unexamined Patent Application Publication No. 2008-299595 discloses a technology for generating random numbers from random noise which occurs in a source-drain current by the application of a pulse voltage to a gate electrode.

Japanese Unexamined Patent Application Publication No. 2011-113136 discloses a technology for generating random numbers by supplying a spin injection current, which causes magnetization reversal with a probability of 1/2, to a magnetoresistive random access memory (MRAM).

SUMMARY

One non-limiting and exemplary embodiment provides an unprecedented random number processing method which is applicable to, for example, higher-security cryptographic technologies.

A random number processing apparatus according to one aspect of the present disclosure includes: a memory cell in which a resistance value reversibly shifts between a plurality of resistance value ranges in accordance with an electric signal applied and in which the resistance value randomly changes over time while the resistance value is within a certain resistance value range, at least part of which is included in the plurality of resistance value ranges; and control circuitry that generates random number data on the basis of a plurality of items of resistance value information obtained, at a plurality of different times, from the memory cell whose resistance value is within the certain resistance value range.

It should be noted that comprehensive or specific embodiments may be implemented as a cryptographic system, a random number processing method, an integrated circuit (IC) card, a computer program, a storage medium, or any selective combination thereof.

According to one aspect of the present disclosure, it is possible to provide an unprecedented random number processing method which is applicable to higher-security cryptographic technologies.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 7 is a graph illustrating an example of resistance value obtained by sequentially reading the resistance value of a memory cell which is within one variable resistance value range;

FIG. 19 illustrates an example of a result of reading data written in the special write mode by the process shown in FIG. 18 in a special read mode;

FIG. 20 illustrates an example of a result of reading data written in the special write mode by the process shown in FIG. 18 in a normal read mode;

DETAILED DESCRIPTION

Figure 1:
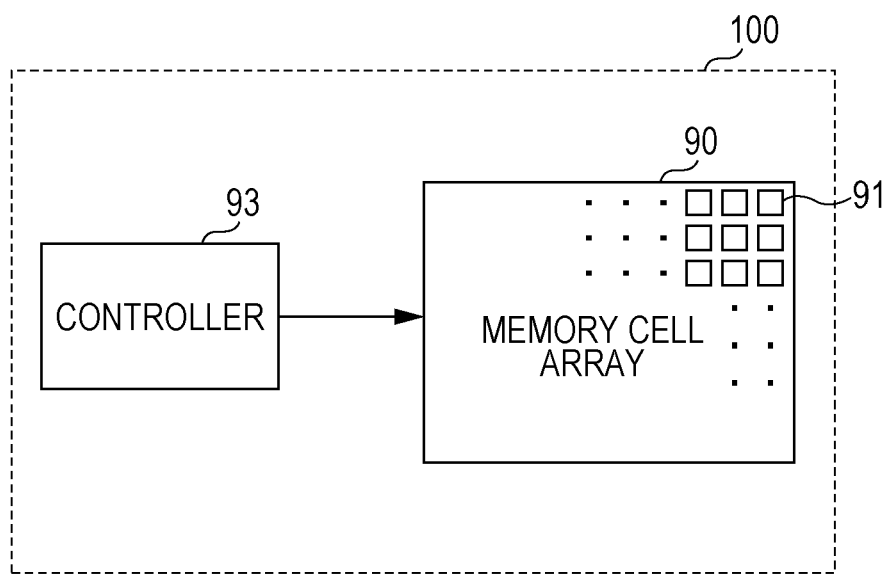
FIG. 1 is a block diagram illustrating an example of the schematic configuration of a random number processing apparatus according to an embodiment.

Underlying Knowledge Forming Basis of the Present Disclosure

An IC card is a card in which a semiconductor IC chip is integrated. The IC chip includes, for example, a logic circuit, a volatile memory and/or a non-volatile memory, and a microprocessor. These elements of the IC chip implement various information security functions, such as cryptographic functions, digital signatures, and digital authentication functions. When executing these functions, a private key is used. In this case, if non-deterministic random numbers are generated within the IC card and are applied to the private key, the security is enhanced.

However, in ultra-small devices, such as IC cards, it is demanded that a circuit for generating random numbers be reduced in size. Additionally, in IC cards without batteries, it is necessary to execute various functions in a short time by using power obtained by wireless power transfer in communication. That is, in generating random numbers, lower power consumption and more speedy generation of random numbers are demanded at the same time. Accordingly, the present inventors have examined some technologies of the related art to implement generators for generating non-deterministic random numbers that may satisfy the above-described demands.

If non-deterministic random numbers are generated by utilizing a physical phenomenon, such as a technology disclosed in Japanese Unexamined Patent Application Publication No. 2008-299595, a circuit for generating random numbers is required as a separate element. Accordingly, the addition of a circuit for generating random numbers may make it difficult to apply such a technology to ultra-small devices, such as IC cards.

Japanese Unexamined Patent Application Publication No. 2011-113136 discloses the following technology. By supplying a spin injection current (write current), which causes magnetization reversal with a probability of 1/2, to a memory element, "0" or "1" is randomly written into the memory element. However, the current which causes magnetization reversal with a probability of 1/2 varies depending on the chip or the lot. Thus, the adjustment of the spin injection current (write current) may be very difficult.

The present inventors have also examined the generating speed for random numbers. In a known system for generating physical random numbers, the generating speed is low.

In a dedicated circuit for generating random numbers, if random numbers are generated in parallel in a plurality of channels, the generating speed of random numbers may be increased. However, in a known system, if a dedicated circuit for generating random numbers is formed into a plurality of channels, the size of the dedicated circuit is increased. That is, in the known system, it is difficult to enhance the generating speed for random numbers and also to reduce the size of a device in which a random number generating circuit is integrated.

Lately, for enhancing the security of cryptography, a key length has been increased. For example, if the generating speed for cryptographic keys is 250 Kbits per second, it requires a long time, such as about 8 msec or longer, to generate a key of a length of 2048 bits. In a device which handles significant personal information, such as digital passports and basic resident registration cards, the use of large-amount digital data, such as fingerprints and identification photographs, for authentication is being considered. For supporting communications of such large-amount digital data, more speedy generation of random numbers is demanded.

The present inventors have conducted intensive and extensive study of an unprecedented random number processing method which may solve the above-described problems. As a result, the present inventors have found a phenomenon where the resistance of a variable resistance element randomly changes over time, and have conceived that this phenomenon would be applied to the generation of random numbers. By utilizing this phenomenon, it is possible to provide an unprecedented random number processing method which is applicable to higher-security cryptographic technologies. With this method, it is possible for a common element to implement a plurality of functions, such as a random numbers generating function, a random numbers storing function, and a data storing function, thereby reducing the size of a circuit for generating random numbers. The resistance of a variable resistance element changes at very short intervals (for example, 10 nsec order), thereby increasing the speed for generating random numbers.

The foregoing description has been given merely for explaining the underlying knowledge forming the basis of the present disclosure, and has not been given for restricting the present disclosure.

Embodiments of the present disclosure will be described below with reference to the accompanying drawings. All of the embodiments described below illustrate comprehensive or specific examples. Numeric values, configurations, materials, composition, components, arrangement positions thereof, connection states thereof, steps, order of steps, and electrical characteristics illustrated in the following embodiments are only examples, and are not described for limiting the present disclosure. Among the components illustrated in the following embodiments, components that are not recited in the independent claims which embody the broadest concept of the present disclosure will be described as optional components. In all the drawings, the same or similar elements are designated by like reference numerals, and an explanation of the same or similar elements designated by a like reference numeral may be given only once. In the drawings, for facilitating the understanding, the components are schematically shown, and thus, the shapes and dimensional ratios of the components may not be illustrated as actual shapes and ratios. In a manufacturing method, the order of steps may be changed, and/or another known step may be added, according to the necessity.

Overview of Embodiments

A random number processing method according to one aspect of the present disclosure includes: (a) obtaining, at each of a plurality of different times, resistance value information from a memory cell whose resistance value is in a certain variable resistance value range so as to obtain a plurality of items of resistance value information; and (b) generating random number data by using the plurality of items of resistance value information. The memory cell has a characteristic in which the resistance value reversibly shifts between a plurality of variable resistance value ranges in accordance with an electric signal applied. The memory cell also has a characteristic in which the resistance value randomly changes over time while the resistance value is within a certain variable resistance value range of the plurality of the variable resistance value ranges.

With this configuration, it is possible to provide an unprecedented random number processing method which is applicable to, for example, higher-security cryptographic technologies.

The resistance value information may be obtained by directly detecting the resistance value or by detecting another physical quantity related to the resistance value. Another physical quantity is, for example, the current volume or the attenuation time of a voltage.

In the above-described random number processing method, the memory cell may be a first memory cell included in a memory cell array, and the plurality of items of resistance value information may be a plurality of items of first resistance value information. In this case, the random number processing method may further include (a') obtaining, at each of a plurality of different times, resistance value information from a second memory cell whose resistance value is in one variable resistance value range so as to obtain a plurality of items of second resistance value information. In the step (b), the random number data may be generated by using the plurality of items of first resistance value information and the plurality of items of second resistance value information. The second memory cell may have a characteristic in which the resistance value reversibly shifts between the plurality of variable resistance value ranges when a plurality of different electric signals are applied to the second memory cell. The second memory cell may also have a characteristic in which the resistance value randomly changes over time while the resistance value is within the certain variable resistance value ranges. With this configuration, random numbers can be generated faster.

In other words, in the above-described random number processing method, in the step (a), resistance value information may be obtained, at each of a plurality of different times, from each of a plurality of memory cells in a memory cell array so as to obtain a plurality of items of resistance value information at each of a plurality of different times. In the step (b), the random number data may be generated by using the plurality of items of resistance value information obtained from the plurality of memory cells and at each of a plurality of different times. With this configuration, random numbers can be generated faster.

In the above-described random number processing method, the step (b) may include (b1) determining a difference between two of the plurality of items of resistance value information obtained from the memory cell at two different times, (b2) determining whether or not the difference is within a first range, and (b3) generating the random number data on the basis of a determination result in the step (b2).

In the above-described random number processing method, the step (b) may include (b4) determining a magnitude relation between two of the plurality of items of resistance value information obtained from the memory cell at two different times, and (b5) generating the random number data on the basis of a determination result in the step (b4).

In the above-described random number processing method, the step (b) may include: (b6) generating digital data by using the plurality of items of resistance value information; and (b7) generating the random number data by executing a predetermined algorithm by using the digital data.

In the above-described random number processing method, the step (b7) may be a step of generating the random number data by calculating a generator polynomial by using the digital data as at least one of an input value and an initial value.

In the above-described random number processing method, the digital data may be fixed-length data having a length of n, and, in the step (b7), the digital data may be input into a shift register having n stages. The shift register may generate the random number data by performing a shift operation a predetermined number of times in accordance with the following rules (A), (B), and (C).

(A) Output from an (x−1)-th stage or XOR between the output from the (x−1)-th stage and output from an n-th stage is input into an x-th stage, where x is an integer of two to n.

(B) Output from the n-th stage or XOR between one of bits of the digital data and the output from the n-th stage is input into a first stage.

(C) If the output from the n-th stage is input into the first stage, XOR between the output from the (x−1)-th stage and the output from the n-th stage is input into at least one of second through n-th stages, where x is an integer of two to n.

In the above-described random number processing method, the step (b) may include (b8) generating first digital data, which is fixed-length data having a length of m, by using the plurality of items of resistance value information, (b9) generating a plurality of items of new digital data by inverting at least one of bits of the first digital data with different combinations, (b10) selecting one item of data having a least frequency of appearance from among the first digital data and the plurality of items of new digital data and setting the selected item of data to be second digital data, (b11) generating the random number data by using the second digital data, and (b12) adding 1 to the frequency of appearance of the selected item of data.

In the above-described random number processing method, the step (b) may include (b13) outputting, as new resistance value information, a value obtained by multiplying a cumulative value by a coefficient which is greater than 0 and smaller than 1, (b14) storing, as a new cumulative value, a value obtained by adding the cumulative value to a value obtained by subtracting the new resistance value information from the resistance value information obtained in the step (a), and (b15) generating the random number data by using a plurality of items of the new resistance value information obtained by repeating the step (b13) and the step (b14).

In the above-described random number processing method, the memory cell in the variable state may have a characteristic in which, when a first electric signal is applied to the memory cell, the resistance value shifts from a second resistance value range to a first resistance value range higher than the second resistance value range, and in which, when a second electric signal is applied to the memory cell, the resistance value shifts from the first resistance value range to the second resistance value range. The memory cell may also have a characteristic in which the resistance value randomly changes over time when the resistance value is within the first resistance value range. In this case, in the step (a), resistance value information may be obtained, at each of a plurality of different times, from a memory cell whose resistance value is in the first resistance value range so as to obtain a plurality of items of resistance value information.

With this configuration, a memory cell in the first resistance value range in which the magnitude of a fluctuation in the resistance value is large is used for generating random numbers. It is thus possible to obtain higher-quality random number data.

In the above-described random number processing method, the memory cell in the variable state may have a characteristic in which, when a first electric signal is applied to the memory cell, the resistance value shifts from a second resistance value range to a first resistance value range higher than the second resistance value range, and in which, when a second electric signal is applied to the memory cell, the resistance value shifts from the first resistance value range to the second resistance value range. The memory cell may also have a characteristic in which the resistance value randomly changes over time when the resistance value is within the second resistance value range. In this case, in the step (a), resistance value information may be obtained, at each of a plurality of different times, from a memory cell whose resistance value is in the second resistance value range so as to obtain a plurality of items of resistance value information.

With this configuration, it is possible to reduce reading errors which may occur when resistance value information is obtained from a memory cell.

In the above-described random number processing method, the memory cell in the variable state may have a characteristic in which, when a first electric signal is applied to the memory cell, the resistance value shifts from a second resistance value range to a first resistance value range higher than the second resistance value range, and in which, when a second electric signal is applied to the memory cell, the resistance value shifts from the first resistance value range to the second resistance value range. The first resistance value range is, for example, a resistance value range which is determined to be a high resistance state when reading is performed. The second resistance value range is, for example, a resistance value range which is determined to be a low resistance state when reading is performed. When setting the resistance value of the memory cell in the variable state to be a high resistance state, the resistance value of the memory cell may be set to be equal to or higher than a first reference value included in the first resistance value range. When setting the resistance value of the memory cell in the variable state to be a low resistance state, the resistance value of the memory cell may be set to be smaller than a second reference value included in the second resistance value range. In other words, when setting the resistance value of the memory cell in the variable state to be within the first resistance value range, the resistance value of the memory cell may be set to be equal to or higher than the first reference value included in the first resistance value range. When setting the resistance value of the memory cell in the variable state to be within the second resistance value range, the resistance value of the memory cell may be set to be smaller than the second reference value included in the second resistance value range. In this case, in the step (a), resistance value information may be obtained, at each of a plurality of different times, from a memory cell whose resistance value is in a third resistance value range which is set between the first reference value and the second reference value so as to obtain a plurality of items of resistance value information.

With this configuration, a memory cell whose resistance value is located between the first resistance value range and the second resistance value range is used for generating random numbers. It is thus possible to generate higher-quality random number data.

The above-described random number processing method may further include (c) recording the random number data generated in the step (b) in a first plurality of memory cells by setting the resistance value of each of the first plurality of memory cells to be within one of the plurality of variable resistance value ranges. Each of the first plurality of memory cells may take an initial state or a variable state. The resistance value of the memory cell in the variable state may reversibly shift between a plurality of variable resistance value ranges when a plurality of different electric signals are applied to the memory cell. The resistance value of the memory cell in the initial state may not shift to within any of the plurality of variable resistance value ranges unless a forming stress, which is an electric signal that shifts the memory cell to the variable state, is applied to the memory cell, and may be within an initial resistance value range which does not overlap any of the plurality of variable resistance value ranges.

The term "initial resistance value range which does not overlap any of the plurality of variable resistance value ranges" means that, if a resistance value belongs to the initial resistance value range, it does not belong to any of the variable resistance value ranges, and if a resistance value belongs to a variable resistance value range, it does not belong to the initial resistance value range.

The forming stress may be greater than any of a plurality of different electric signals that reversibly shift the resistance value of a memory cell in the variable state between a plurality of variable resistance value ranges. For example, at least one of the amplitude and the pulse width of the forming stress is greater than those of any of a plurality of different electric signals that reversibly shift the resistance value of a memory cell in the variable state.

The random number data may be recorded in plaintext or in encrypted form. This also applies to other aspects of the present disclosure.

The memory cell array may include the memory cell from which the resistance value information is obtained in the step (a) and a first plurality of memory cells. With this configuration, a memory cell for processing random numbers and a memory cell for storing random number data can be included in the same memory cell array. It is thus possible to decrease the size of a device and also to reduce the power consumption.

The above-described random number processing method may further include (d) recording the random number data generated in the step (b) in the first plurality of memory cells in accordance with whether or not the resistance value of each of the first plurality of memory cells is in the initial resistance value range. Each of the first plurality of memory cells may take an initial state or a variable state. The resistance value of the memory cell in the variable state may reversibly shift between a plurality of variable resistance value ranges when a plurality of different electric signals are applied to the memory cell. The resistance value of the memory cell in the initial state may not shift to within any of the plurality of variable resistance value ranges unless a forming stress, which is an electric signal that shifts the memory cell to the variable state, is applied to the memory cell, and may be within an initial resistance value range which does not overlap any of the plurality of variable resistance value ranges.

With this configuration, it is possible to record random number data with higher reliability.

The first plurality of memory cells may include memory cells other than memory cells in the initial state and memory cells in the variable state. For example, the first plurality of memory cells may include a defective memory cell which belongs to neither of the initial resistance value range nor a variable resistance value range. For example, in a memory cell in which the resistance value is in a variable resistance value range, if the resistance value may enter the initial resistance value range over time, this memory cell may become defective. Such a defective memory cell may occur if, for example, it is left under high temperature environments. In a defective memory cell, error data may be corrected to correct data by performing error correcting processing.

For example, a memory cell in the variable state may be selectively in a high resistance state and a low resistance state. In this case, a memory cell in the initial state may be allocated to a first value of data, a memory cell in the high resistance state may be allocated to a second value of data, and a memory cell in the low resistance state may be allocated to a third value of data. Three-valued data obtained by allocating the memory cells in this manner may be recorded over a plurality of memory cells. The second value and the third value may be associated with different variable resistance value ranges, and then, memory cells may be allocated to the second value and the third value.

Multi-valued data is two- or more-valued data, for example, three-valued data or four-valued data.

The above-described random number processing method may further include (e) recording the random number data generated in the step (b) in a first plurality of memory cells as first random number data, and (f) recording second random number data in a second plurality of memory cells. Each of the plurality of first and second memory cells may take an initial state or a variable state. The resistance value of the memory cell in the variable state may reversibly shift between a plurality of variable resistance value ranges when a plurality of different electric signals are applied to the memory cell. The resistance value of the memory cell in the initial state may not shift to within any of the plurality of variable resistance value ranges unless a forming stress, which is an electric signal that shifts the memory cell to the variable state, is applied to the memory cell, and may be within an initial resistance value range which does not overlap any of the plurality of variable resistance value ranges. In the step (e), the first random number data may be recorded in accordance with whether each of the first plurality of memory cells is in at least one of the variable resistance value ranges. In the step (f), the second random number data may be recorded in accordance with whether each of the second plurality of memory cells is in the initial state or in the variable state.

The memory cell array may include the memory cell from which the resistance value information is obtained in the step (b), a first plurality of memory cells, and a second plurality of memory cells. With this configuration, a memory cell for generating the first random number data, a memory cell for storing the first random number data, and a memory cell for storing the second random number data can be included in the same memory cell array. It is thus possible to decrease the size of a device and also to reduce the power consumption.

In the above-described random number processing method, in the step (f), the second random number data may be generated and recorded by applying a forming stress to at least some of the second plurality of memory cells which are in the initial state.

With this configuration, by combining random numbers generated by a plurality of different mechanisms, an encryption processing system with higher reliability can be implemented.

In the above-described random number processing method, the step (f) may include (f1) obtaining, at each of a plurality of different times, resistance value information from a memory cell whose resistance value is in one variable resistance value range so as to obtain a plurality of items of resistance value information, (f2) generating the second random number data by using the plurality of items of resistance value information, and (f3) recording the second random number data in accordance with whether or not the resistance value of each memory cell is in the initial resistance value range.

With this configuration, it is possible to record the second random number data with higher reliability.

A random number processing apparatus according to one aspect of the present disclosure includes: a memory cell that has a characteristic in which a resistance value reversibly shifts between a plurality of variable resistance value ranges when a plurality of different electric signals are applied to the memory cell; and a controller that obtains, at each of a plurality of different times, resistance value information from the memory cell whose resistance value is in one variable resistance value range so as to obtain a plurality of items of resistance value information and that generates random number data by using the plurality of items of resistance value information. The memory cell has at least one variable resistance value range within each of which the resistance value randomly changes over time. The resistance value information is obtained from the memory cell whose resistance value randomly changes over time within a variable resistance value range.

With this configuration, it is possible to provide an unprecedented random number processing apparatus which is applicable to, for example, higher-security cryptographic technologies.

In the above-described random number processing apparatus, the memory cell may be a first memory cell included in a memory cell array, and the plurality of items of resistance value information may be a plurality of items of first resistance value information. In this case, the random number processing apparatus may include a memory cell array including the first memory cell and a second memory cell. The controller may obtain, at each of a plurality of different times, resistance value information from the second memory cell whose resistance value is in one variable resistance value range so as to obtain a plurality of items of second resistance value information and may generate the random number data by using the plurality of items of first resistance value information and the plurality of items of second resistance value information. The second memory cell may have the same resistance characteristics. That is, a resistance value of the second memory cell may reversibly shift between a plurality of variable resistance value ranges when a plurality of different electric signals are applied to the second memory cell, and the second memory cell may have at least one variable resistance value range within each of which the resistance value randomly changes over time. The first memory cell and the second memory cell may have the same structure, shape and constituent material. The resistance value information is obtained from the second memory cell whose resistance value randomly changes over time within a variable resistance value range. With this configuration, random numbers can be generated faster.

In other words, the above-described random number processing apparatus may include a memory cell array including a plurality of memory cells. The controller may obtain resistance value information, at each of a plurality of different times, from each of a plurality of memory cells in the memory cell array so as to obtain a plurality of items of resistance value information, and may generate random number data by using the plurality of items of resistance value information. With this configuration, random numbers can be generated faster.

In the above-described random number processing apparatus, the controller may include: a subtractor that determines a difference between two of the plurality of items of resistance value information obtained from the memory cell at two different times; a first determination unit that determines whether or not the difference is within a first range; and a first generator that generates the random number data on the basis of a determination result of the first determination unit.

In the above-described random number processing apparatus, the controller may include: a second determination unit that determines a magnitude relation between two of the plurality of items of resistance value information obtained from the memory cell at two different times; and a second generator that generates the random number data on the basis of a determination result of the second determination unit.

In the above-described random number processing apparatus, the controller may include: a third generator that generates digital data by using the plurality of items of resistance value information; and a fourth generator that generates the random number data by executing a predetermined algorithm by using the digital data.

In the above-described random number processing apparatus, the fourth generator may generate the random number data by calculating a generator polynomial by using the digital data as at least one of an input value and an initial value.

In the above-described random number processing apparatus, the digital data may be fixed-length data having a length of n, and the fourth generator may include a shift register having n stages which are connected in accordance with the following rules (A), (B), and (C).

(A) Output from an (x−1)-th stage or XOR between the output from the (x-1)-th stage and output from an n-th stage is input into an x-th stage, where x is an integer of two to n.

(B) Output from the n-th stage or XOR between one of bits of the digital data and the output from the n-th stage is input into a first stage.

(C) If the output from the n-th stage is input into the first stage, XOR between the output from the (x−1)-th stage and the output from the n-th stage is input into at least one of second through n-th stages, where x is an integer of two to n.

In the above-described random number processing apparatus, the controller may include: a fifth generator that generates first digital data, which is fixed-length data having a length of m, by using the plurality of items of resistance value information; a plurality of inverting units that generate a plurality of items of new digital data by inverting at least one of bits of the first digital data with different combinations; a selector that selects one item of data having a least frequency of appearance from among the first digital data and the plurality of items of new digital data and that sets the selected item of data to be second digital data; a sixth generator that generates the random number data by integrating the second digital data; and an adder that adds 1 to the frequency of appearance of the selected item of data.

In the above-described random number processing apparatus, the controller may include: an output unit that outputs, as new resistance value information, a value obtained by multiplying a cumulative value by a coefficient which is greater than 0 and smaller than 1; an accumulator that stores, as a new cumulative value, a value obtained by adding the cumulative value to a value obtained by subtracting the new resistance value information from the resistance value information; and a seventh generator that generates the random number data by using a plurality of items of the new resistance value information.

In the above-described random number processing apparatus, the memory cell in the variable state may have a characteristic in which, when a first electric signal is applied to the memory cell, the resistance value shifts from a second resistance value range to a first resistance value range higher than the second resistance value range, and in which, when a second electric signal is applied to the memory cell, the resistance value shifts from the first resistance value range to the second resistance value range. The memory cell may also have a characteristic in which the resistance value randomly changes over time while the resistance value is within the first resistance value range. In this case, the controller may obtain resistance value information, at each of a plurality of different times, from a memory cell whose resistance value is in the first resistance value range so as to obtain a plurality of items of resistance value information.

With this configuration, a memory cell in the first resistance value range in which the magnitude of a fluctuation in the resistance value is large is used for generating random numbers. Accordingly, resistance value information obtained from such a memory cell is more likely to reflect random fluctuations. It is thus possible to obtain higher-quality random number data.

In the above-described random number processing apparatus, the memory cell in the variable state may have a characteristic in which, when a first electric signal is applied to the memory cell, the resistance value shifts from a second resistance value range to a first resistance value range higher than the second resistance value range, and in which, when a second electric signal is applied to the memory cell, the resistance value shifts from the first resistance value range to the second resistance value range. The memory cell may also have a characteristic in which the resistance value randomly changes over time while the resistance value is within the second resistance value range. In this case, the controller may obtain resistance value information, at each of a plurality of different times, from a memory cell whose resistance value is in the second resistance value range so as to obtain a plurality of items of resistance value information.

With this configuration, it is possible to reduce reading errors which may occur when resistance value information is obtained from a memory cell.

In the above-described random number processing apparatus, the memory cell in the variable state may have a characteristic in which, when a first electric signal is applied to the memory cell, the resistance value shifts from a second resistance value range to a first resistance value range higher than the second resistance value range, and in which, when a second electric signal is applied to the memory cell, the resistance value shifts from the first resistance value range to the second resistance value range. The first resistance value range is, for example, a resistance value range which is determined to be a high resistance state when reading is performed. The second resistance value range is, for example, a resistance value range which is determined to be a low resistance state when reading is performed. When setting the resistance value of the memory cell in the variable state to be a high resistance state, the controller may set the resistance value of the memory cell to be equal to or higher than a first reference value included in the first resistance value range. When setting the resistance value of the memory cell in the variable state to be a low resistance state, the controller may set the resistance value of the memory cell to be smaller than a second reference value included in the second resistance value range. In other words, when setting the resistance value of the memory cell in the variable state to be within the first resistance value range, the controller may set the resistance value of the memory cell to be equal to or higher than the first reference value included in the first resistance value range. When setting the resistance value of the memory cell in the variable state to be within the second resistance value range, the controller may set the resistance value of the memory cell to be smaller than the second reference value included in the second resistance value range. In this case, the controller may obtain resistance value information, at each of a plurality of different times, from a memory cell whose resistance value is in a third resistance value range which is set between the first reference value and the second reference value so as to obtain a plurality of items of resistance value information.

With this configuration, a memory cell whose resistance value is located between the first resistance value range and the second resistance value range is used for generating random numbers. It is thus possible to generate higher-quality random number data.

In the above-described random number processing apparatus, the controller may record the random number data in a first plurality of memory cells by setting the resistance value of each of the first plurality of memory cells to be within one of the plurality of variable resistance value ranges. Each of the first plurality of memory cells may take an initial state or a variable state. The resistance value of the memory cell in the variable state may reversibly shift between a plurality of variable resistance value ranges when a plurality of different electric signals are applied to the memory cell. The resistance value of the memory cell in the initial state may not shift to within any of the plurality of variable resistance value ranges unless a forming stress, which is an electric signal that shifts the memory cell to the variable state, is applied to the memory cell, and may be within an initial resistance value range which does not overlap any of the plurality of variable resistance value ranges.

The memory cell array may include the memory cell from which the resistance value information is obtained and also include a first plurality of memory cells. With this configuration, a memory cell for processing random numbers and a memory cell for storing random number data can be included in the same memory cell array. It is thus possible to decrease the size of a device and also to reduce the power consumption.

In the above-described random number processing apparatus, the controller may record the random number data in a first plurality of memory cells. Each of the first plurality of memory cells may take an initial state or a variable state. The resistance value of the memory cell in the variable state may reversibly shift between a plurality of variable resistance value ranges when a plurality of different electric signals are applied to the memory cell. The resistance value of the memory cell in the initial state may not shift to within any of the plurality of variable resistance value ranges unless a forming stress, which is an electric signal that shifts the memory cell to the variable state, is applied to the memory cell, and may be within an initial resistance value range which does not overlap any of the plurality of variable resistance value ranges. The controller may record the random number data in accordance with whether or not the resistance value of each of the first plurality of memory cells is in the initial resistance value range.

With this configuration, it is possible to record random number data with higher reliability.

In the above-described random number processing apparatus, the controller may record the random number data in a first plurality of memory cells as first random number data and may also record second random number data in a second plurality of memory cells. Each of the plurality of first and second memory cells may take an initial state or a variable state. The resistance value of the memory cell in the variable state may reversibly shift between a plurality of variable resistance value ranges when a plurality of different electric signals are applied to the memory cell. The resistance value of the memory cell in the initial state may not shift to within any of the plurality of variable resistance value ranges unless a forming stress, which is an electric signal that shifts the memory cell to the variable state, is applied to the memory cell, and may be within an initial state where the resistance value is in an initial resistance value range which does not overlap any of the plurality of variable resistance value ranges. The controller may record the first random number data in accordance with whether or not the resistance value of each of the first plurality of memory cells is in at least one of the variable resistance value ranges. The controller may record the second random number data in accordance with whether each of the second plurality of memory cells is in the initial state or in the variable state.

The memory cell array may include a memory cell from which the resistance value information is obtained for generating random numbers, a first plurality of memory cells, and a second plurality of memory cells. With this configuration, a memory cell for generating the first random number data, a memory cell for storing the first random number data, and a memory cell for storing the second random number data can be included in the same memory cell array. It is thus possible to decrease the size of a device and also to reduce the power consumption.

In the above-described random number processing apparatus, the controller may generate and record the second random number data by applying a forming stress to at least some of the memory cells which are in the initial state.

With this configuration, by combining random numbers generated by a plurality of different mechanisms, an encryption processing system with higher reliability can be implemented.

In the above-described random number processing apparatus, the controller may obtain, at each of a plurality of different times, resistance value information from a memory cell whose resistance value is in one variable resistance value range so as to obtain a plurality of items of resistance value information. The controller may then generate the second random number data by using the plurality of items of resistance value information and record the second random number data in accordance with whether or not the resistance value of each memory cell is in the initial resistance value range.

With this configuration, it is possible to record the second random number data with higher reliability.

Embodiments

[Configuration of Apparatus]

Figure 2:
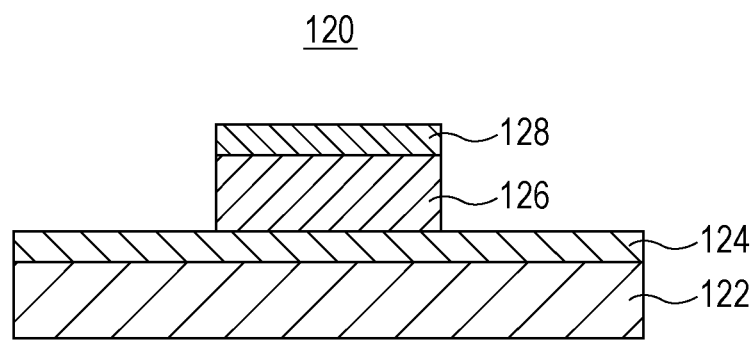
FIG. 2 is a sectional view illustrating an example of the schematic configuration of a memory cell included in a random number processing apparatus according to an embodiment.

FIG. 1 is a block diagram illustrating an example of the schematic configuration of a random number processing apparatus 100 according to an embodiment. FIG. 2 is a sectional view illustrating an example of the schematic configuration of a memory cell 91 according to an embodiment.

In the example shown in FIG. 1, the random number processing apparatus 100 includes a memory cell array 90 and a controller 93. The controller 93 may not have to be part of the random number processing apparatus 100. An external controller connected to the random number processing apparatus 100 may perform the operation described below.

The memory cell array 90 is constituted by a plurality of memory cells 91 arranged in an array. The random number processing apparatus 100 may not have to include a plurality of memory cells, for example, it may include only one memory cell.

The controller 93 obtains resistance value information at each of multiple different times from a memory cell 91 in which the resistance value is within one variable resistance value range, thereby obtaining a plurality of items of resistance value information. The controller 93 generates random number data by using these plural items of resistance value information.

Alternatively, the controller 93 may obtain resistance value information at each of multiple different times from a plurality of memory cells 91 included in the memory cell array 90, thereby obtaining a plurality of items of resistance value information at each of multiple different times. The controller 93 may generate random number data by using these plural items of resistance value information.

The resistance value information may be information concerning a factor correlated with the resistance value. The resistance value information may be the resistance value itself or a value which increases or decreases in accordance with the resistance value. The value which increases or decreases in accordance with the resistance value may be the discharge time of a capacitor connected in series or in parallel with the memory cells 91 and/or the count value corresponding to the discharge time. In this case, the capacitor may not be an element and may be a parasitic capacitance, such as that generated in a wire.

The resistance value information may be a value measured by a sense amplifier having a certain level of resolution. Alternatively, each of values measured by a sense amplifier may be classified as one of a plurality of resistance value ranges which are divided based on one or more thresholds, and then, the classified results may be used as the resistance value information. In this case, each of the plurality of resistance value ranges may be a range obtained by dividing an initial resistance value range or a variable resistance value range.

The reason why random number data can be generated by using resistance value information is that the resistance value randomly changes. The mechanism and a specific method for generating random number data will be described later.

The controller 93 may be configured to read data which has been recorded in the memory cell array 90 by determining whether each of the memory cells 91 is in the initial state or in the variable state.

In the example shown in FIG. 2, a variable resistance element 120 provided in the memory cell 91 includes a foundation layer 122, a first electrode 124, a variable resistance layer 126, and a second electrode 128. For selecting a specific memory cell, a selection element (not shown), such as a transistor or a diode, may be connected to each variable resistance element 120.

The memory cell 91 in the variable state has a characteristic in which the resistance value reversibly shifts between a plurality of variable resistance value ranges when a plurality of different electric signals are applied to the memory cell 91.

Figure 3:
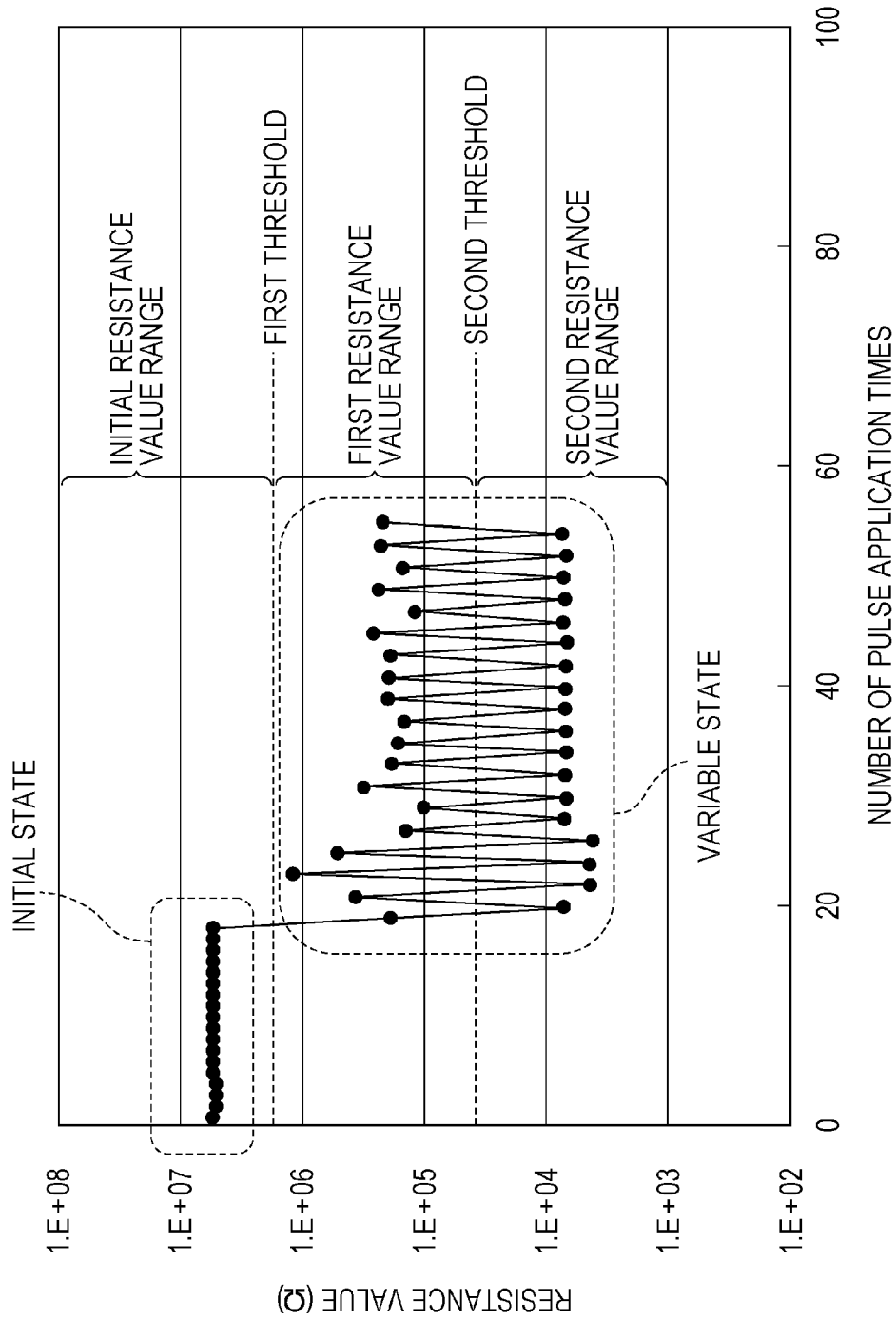
FIG. 3 is a graph illustrating an example of resistance value ranges of a memory cell included in a random number processing apparatus according to an embodiment.

FIG. 3 is a graph illustrating an example of resistance value ranges of the memory cell 91. As shown in FIG. 3, the memory cell 91 may have at least two states, such as the initial state and the variable state.

The variable state is a state in which the resistance value reversibly shifts between a plurality of variable resistance value ranges by the application of a plurality of different electric signals.

The initial state is a state in which the resistance value is within the initial resistance value range which does not overlap any of the variable resistance value ranges. A memory cell 91 which is in the initial state does not shift to the variable state unless a forming stress, which is an electrical stress that shifts the initial state to the variable state, is applied. A forming stress may be a cumulative stress. In this case, when the cumulative amount of stress exceeds a predetermined amount, the memory cell 91 is shifted from the initial state to the variable state. The memory cell 91 may be an element which is not possible to take the initial state. That is, the memory cell 91 may be a so-called formingless element, which takes only the variable state.

Some of the plurality of memory cells 91 included in the memory cell array 90 may be memory cells in the initial state, and the other memory cells 91 may be memory cells in the variable state. Data may have been recorded in the memory cell array 90 by utilizing the difference in the state of each memory cell 91, that is, whether each memory cell 91 is in the initial state or in the variable state.

In the memory cell array 90, for example, at least one of first type data and second type data, which will be described later, is recorded. The memory cell array 90 may include both of memory cells 91 in which the first type data is recorded and memory cells 91 in which the second type data is recorded.

After the memory cells 91 are manufactured and before they are subjected to forming, they may not be in the state in which the resistance value reversibly shifts between a plurality of variable resistance value ranges. Forming refers to shifting of a memory cell to a state in which the resistance value reversibly shifts between a plurality of variable resistance value ranges by applying a given electrical stress to the memory cell. The electrical stress to be applied for forming may be an electric pulse having a given voltage and a given time width, or may be a combination of a plurality of electric pulses.

The initial resistance value range is set such that it includes the resistance value of the memory cell 91 immediately after it is manufactured and such that it does not include the resistance value of the memory cell 91 after it has shifted to the variable state. The variable resistance value range is set such that it does not include the initial resistance value range and such that it includes the resistance value of the memory cell 91 after it has shifted to the variable state. A memory cell including a variable resistance element typically exhibits the above-described resistance characteristics. By using various known materials, a memory cell 91 having the above-described resistance characteristics may be manufactured.

The initial state of a memory cell 91 may include a state after a certain electrical stress other than a forming stress have been applied to the memory cell 91. In other words, the initial state of a memory cell 91 may include a state after one or more electrical stresses which do not shift the memory cell 91 to the variable state have been applied to the memory cell 91. The initial state of a memory cell 91 may include a state in which the resistance value thereof is changed, within the initial resistance value range, to a value different from an initial resistance value just after the memory cell 91 have been manufactured.

The controller 93 may read data which has been recorded in the memory cell array 90 by determining whether each of memory cells 91 is in the initial state or in the variable state.

In the variable resistance element 120 which indicates the resistance characteristic as shown in FIG. 3, the first electrode 124 is made of tantalum nitride (TaN), the second electrode 128 is made of iridium (Ir), and the variable resistance layer 126 is made of tantalum oxide. The thickness of the variable resistance layer 126 is, for example, about 50 nm or smaller. The variable resistance layer 126 has a double layered structure including two layers in which the oxygen concentration is different. Among the two layers of the variable resistance layer 126, the layer which is in contact with the first electrode 124 is a layer having a relatively low oxygen concentration. If the composition of this layer is expressed by $TaO_x$, x satisfies $0<x<2.5$. The other layer of the variable resistance layer 126 which is in contact with the second electrode 128 is a layer having a relatively high oxygen concentration. If the composition of this layer is expressed by $TaO_y$, y satisfies $y \geq 2.1$. The thickness of this layer is, for example, about 5.5 nm. The area of the contact surface between the first electrode 124 and the variable resistance layer 126 and that between the second electrode 128 and the variable resistance layer 126 are, for example, about 0.25 $\mu m^2$ or smaller. As the forming stress, a pulse voltage is repeatedly applied to the memory cell 91. The pulse voltage has, for example, a voltage of +3.5 V and a pulse width of 5 μsec.

In the example shown in FIG. 3, the memory cell 91 may take two variable resistance value ranges, that is, a first resistance value range and a second resistance value range. For the sake of simple description, the state in which the resistance value of a memory cell 91 is within the first resistance value range will be referred to as a "high resistance state", while the state in which the resistance value of the memory cell 91 is within the second resistance value range will be referred to as a "low resistance state". A pulse for shifting the resistance value of the memory cell 91 from the first resistance value range to the second resistance value range may be referred to as a "low resistance pulse", while a pulse for shifting the resistance value of the memory cell 91 from the second resistance value range to the first resistance value range may be referred to as a "high resistance pulse". The low resistance pulse is an example of a second electric signal. The high resistance pulse is an example of a first electric signal. The low resistance pulse has, for example, a voltage of −2.4 V and a pulse width of 50 nsec. The high resistance pulse has, for example, a voltage of +1.8 V and a pulse width of 50 nsec. In the memory cell structure shown in FIG. 2, when a positive voltage is applied to the second electrode 128 with reference to the first electrode 124, the polarity of the voltage is defined as the positive polarity.

In another example of the memory cell structure, the first electrode 124 and the second electrode 128 may be made of platinum (Pt), and the variable resistance layer 126 may be made of hafnium oxide. The thickness of the variable resistance layer 126 is, for example, 30 nm. The element region of the memory cell 91 may be a circular shape having a diameter of 3 μm. If the variable resistance layer 126 is made of $HfO_{1.6}$, the initial resistance value is about several MΩ, and the first resistance value range is 1000 to 3000Ω and the second resistance value range is 100 to 300Ω. In this case, each of multiple voltage pulses constituting the forming stress has, for example, a voltage of 2 to 3 V and a pulse width of 100 nsec. The low resistance pulse has, for example, a voltage of +1.0 V and a pulse width of 100 nsec, and the high resistance pulse has, for example, a voltage of −1.3 V and a pulse width of 100 nsec.

In the example shown in FIG. 3, the lower limit of the initial resistance value range is equal to or higher than the upper limits of both variable resistance value ranges. In other words, the lower limit of the initial resistance value range is equal to or higher than the upper limit of the resistance value range having the largest resistance value within a plurality of variable resistance values. For example, the lower limit of the initial resistance value range may be equal to the upper limit of the first resistance value range having the largest resistance value within the two variable resistance value ranges.

In the example shown in FIG. 3, a first threshold is equal to or lower than the lower limit of the initial resistance value range and is equal to or higher than the upper limits of all the variable resistance value ranges. In other words, the first threshold is equal to or lower than the lower limit of the initial resistance value range and is equal to or higher than the upper limit of the resistance value range having the largest resistance value within the plurality of variable resistance value ranges. For example, the first threshold may be equal to the upper limit of the first resistance value range having the largest resistance value within the two variable resistance value ranges. The first threshold may be equal to the lower limit of the initial resistance value range. The resistance value equal to the first threshold may be set such that it belongs to the initial resistance value range or to the variable resistance value range having the largest resistance value within the plurality of variable resistance value ranges.

In the example shown in FIG. 3, a second threshold is equal to or lower than the lower limit of the variable resistance value range having the largest resistance value within the plurality of variable resistance value ranges, and is equal to or higher than the upper limit of the variable resistance value range having the smallest resistance value within the plurality of variable resistance value ranges. For example, the second threshold is equal to or lower than the lower limit of the first resistance value range having the largest resistance value within the two variable resistance value ranges, and is equal to or higher than the upper limit of the second resistance value range having the smallest resistance value within the two variable resistance value ranges. The second threshold may be equal to the lower limit of the first resistance value range or the upper limit of the second resistance value range. The first resistance value range and the second resistance value range may be contiguous to each other. That is, the smaller value of the two end points which define the first resistance value range may coincide with the larger value of the two end points which define the second resistance value range. The resistance value equal to the second threshold may be set such that it belongs to a resistance value range including larger resistance values than the second threshold or that it belongs to a resistance value range including smaller resistance values than the second threshold.

Depending on the configuration of the memory cell 91, the resistance value of the memory cell 91 which has just been manufactured may be smaller than any of the variable resistance value ranges. That is, there may a case in which the initial resistance value range is smaller than any of the variable resistance value ranges. This characteristic is exhibited, for example, when the variable resistance layer 126 within the memory cell 91 is made of iron oxide.

The resistivity values of iron oxides, such as $Fe_3O_4$, FeO, and $Fe_2O_3$, are high to low in descending order. For example, the first electrode 124 and the second electrode 128 may be made of Pt, and the variable resistance layer 126 may be made of $Fe_3O_4$. In this case, the entire thickness of the variable resistance layer 126 is, for example, 50 nm or smaller.

For example, when the area of the contact surface between the first electrode 124 and the variable resistance layer 126 and that between the second electrode 128 and the variable resistance layer 126 are 0.25 $\mu m^2$ or smaller, the initial resistance value is about 200Ω, which is a very small value. In this case, a pulse of a voltage of 3.5 V (absolute value) and a pulse width of 10 μsec and of the same polarity as the first electric signal is applied to a memory cell 91 in the initial state a given number of times. By the application of this pulse, the resistance value of the memory cell 91 is shifted to a state in which the resistance value is larger than the initial resistance value, for example, to the high resistance state in which the resistance value is 2000 to 8000Ω. The reason for this may be as follows. The oxidation of the contact surface between the second electrode 128 and the variable resistance layer 126 has proceeded and a $Fe_2O_3$ resistance layer in the insulating state has been formed.

By the application of the second electric signal of a voltage of 2.4 V (absolute value), the resistance value of a memory cell 91 which is in the variable state may be shifted to the second resistance value range of 300 to 500Ω. By the application of the first electric signal of a voltage of 2.4 V (absolute value) and of the polarity opposite to the polarity of the second electric signal, the resistance value of a memory cell 91 which is in the variable state may be shifted to the first resistance value range of 2000 to 8000Ω.

In another example, the first electrode 124 and the second electrode 128 may be made of Pt, and the variable resistance layer 126 may be made of hafnium oxide. The thickness of the variable resistance layer 126 is, for example, 30 nm. The element region of the memory cell 91 may be a circular shape having a diameter of 3 μm. If the variable resistance layer 126 is made of $HfO_{0.9}$ and the initial resistance value does not vary, the memory cell 91 is shifted to the variable state by the application of a voltage pulse as a forming stress. In this case, the voltage pulse has, for example, a voltage of 4 V and a pulse width of 100 μsec. By the application of a low resistance pulse of a voltage of −1.3 V and a pulse width of 100 nsec, the resistance value of a memory cell 91 in the variable state may be shifted to the second resistance value range of 30 to 90Ω. By the application of a high resistance pulse of a voltage of +2.0 V and a pulse width of 100 nsec, the resistance value of a memory cell 91 in the variable state may be shifted to the first resistance value range of 100 to 300Ω.

In the above-described configuration, the upper limit of the initial resistance value range may be equal to or lower than the lower limits of all variable resistance value ranges. In other words, the upper limit of the initial resistance value range may be equal to or lower than the lower limit of the variable resistance value range having the smallest resistance value within a plurality of variable resistance value ranges. For example, the upper limit of the initial resistance value range may be equal to the lower limit of the second resistance value range having the smallest resistance value within the two variable resistance value ranges.

The first threshold may be equal to or higher than the upper limit of the initial resistance value range and is equal to or lower than the lower limits of all the variable resistance value ranges. In other words, the first threshold may be equal to or higher than the upper limit of the initial resistance value range and may be equal to or lower than the lower limit of the variable resistance value range having the smallest resistance value within the plurality of variable resistance value ranges. For example, the first threshold may be equal to the lower limit of the second resistance value range having the smallest resistance value within the two variable resistance value ranges. The first threshold may be equal to the upper limit of the initial resistance value range.

The second threshold may be equal to or higher than the upper limit of the variable resistance value range having the smallest resistance value within the plurality of variable resistance value ranges, and may be equal to or lower than the lower limit of the variable resistance value range having the largest resistance value within the plurality of variable resistance value ranges. For example, the second threshold may be equal to or higher than the upper limit of the second resistance value range having the smallest resistance value within the two variable resistance value ranges, and may be equal to or lower than the lower limit of the first resistance value range having the largest resistance value within the two variable resistance value ranges. The second threshold may be equal to the lower limit of the first resistance value range or the upper limit of the second resistance value range.

The upper limit of one resistance value range and the lower limit of the adjacent resistance value range may not have to be contiguous to each other, and instead, a certain margin may be set between adjacent resistance value ranges.

The controller 93 may selectively perform a first read mode and a second read mode. In the first read mode, the controller 93 determines whether or not the resistance value of a selected memory cell 91 is greater than the first threshold. In the second read mode, the controller 93 determines whether or not the resistance value of a selected memory cell 91 is greater than the second threshold. Data recorded in the memory cell array 90 is read in accordance with the determination results.

The first and second thresholds may not be fixed values, and may be variable to desired values.

Data recorded in the memory cell array 90 may include first type data and second type data. The first type data has been recorded in accordance with whether or not the resistance value of each memory cell 91 is within the initial resistance value range. The second type data has been recorded in accordance with whether or not the resistance value of each memory cell 91 is within at least one of variable resistance value ranges, instead of whether or not the resistance value of each memory cell 91 is within the initial resistance value range.

The memory cell array 90 may include a first write address area and a second write address area. In this case, the first type data may be recorded in the first write address area, while the second type data may be recorded in the second write address area. The first write address area and the second write address area may not be separated from each other as physical areas. For example, each of the memory cells 91 may be assigned to the first write address area or the second write address area according to the predetermined rules regarding addresses.

The second write address area is an area constituted by a plurality of memory cells 91 which are in the variable state. For example, by applying a forming stress to a plurality of memory cells 91 in the initial state, the second write address area may be formed. For example, the plurality of memory cells 91 in the initial state are included in a predetermined region of the memory cell array 90 which has just been manufactured. In this case, the forming stress may be used, not only for recording the first type data, but also for forming the second write address area in which the second type data will be recorded.

By selectively applying a forming stress to the plurality of memory cells 91 within the memory cell array 90, the first write address area and the second write address area may be set. Accordingly, the capacity distribution and the arrangement of the first and second write address areas may be selected as desired. If the forming stress is applied to a portion of the first write address area, the portion may be changed to the second write address area.

The first and second write address areas are disposed, for example, within the same memory cell array 90. This makes it possible to enhance the confidentiality of information when sending and receiving information between the first and second write address areas.

In the example shown in FIG. 3, the first type data has been recorded in accordance with whether or not the resistance value of each memory cell 91 is within the initial resistance value range. In the example shown in FIG. 3, the second type data has been recorded in accordance with whether or not the resistance value of each memory cell 91 is within the second resistance value range.

In the example shown in FIG. 3, the number of variable resistance value ranges is two. However, the number of variable resistance value ranges may be three or more. That is, the memory cell 91 may be a multi-valued memory.

In the example shown in FIG. 3, the initial resistance value range may be set to be $2\times10^6\Omega$ or higher and lower than $1\times10^7\Omega$. The two first and second variable resistance values ranges may be respectively set to be $5\times10^4\Omega$ or higher and lower than $2\times10^6\Omega$, and $5\times10^3\Omega$ or higher and lower than $5\times10^4\Omega$. In this case, for example, the first threshold is $2\times10^6\Omega$ and the second threshold is $5\times10^4\Omega$.

[Configuration of Variable Resistance Element]

In the example shown in FIG. 2, the variable resistance layer 126 intervenes between the first electrode 124 and the second electrode 128. The variable resistance layer 126 may be made of, for example, a metal oxide, and more specifically, a transition metal oxide. By the application of an electric signal between the first electrode 124 and the second electrode 128, the resistance value of the variable resistance element 120 of a memory cell 91 in the variable state is reversibly shifted between a plurality of variable resistance value ranges.

The variable resistance layer 126 of the variable resistance element 120 of a memory cell 91 in the initial state may insulate the first electrode 124 and the second electrode 128 from each other. The state in which the first electrode 124 and the second electrode 128 are insulated from each other refers to, for example, a state in which the resistance value between the first electrode 124 and the second electrode 128 is 2 MΩ or greater. The variable resistance layer 126 of the variable resistance element 120 may include a layer constituted by an insulator. The insulator is, for example, made of a material having a resistivity of 30 Ω·m or higher. By forming at least part of the variable resistance layer 126 of the variable resistance element 120 by using an insulator, the resistance characteristics of a memory cell 91 in the initial state may be stably maintained.

The initial state may be a state after the variable resistance elements 120 have been manufactured by a semiconductor process and before they are shifted to the variable state by the application of a forming stress.

The resistance value of a variable resistance element 120 in the initial state is, unlike that in the variable state, adjustable to a certain degree by the material, size, and configuration of the variable resistance element 120, and the manufacturing conditions therefor. In particular, if the variable resistance layer 126 has a multilayered structure, the resistance value of the variable resistance element 120 is adjustable to a desired value by the thickness of a layer having a high oxygen concentration and by the oxygen concentration when the variable resistance element 120 was formed.

The initial state is more stable than the variable state in which the resistance value is shifted by the application of an electric signal. Accordingly, by utilizing the difference between the initial state and the variable state, data may be stably stored.

The initial resistance value range includes, for example, a resistance value obtained by applying a read voltage to a variable resistance element 120 in the initial state. The read voltage is smaller than both of a forming stress and an electric signal that causes the resistance value of a variable resistance element 120 in the variable state to vary between a plurality of variable resistance value ranges.

A determination as to whether or not an electrical stress is a forming stress is made according to whether or not a subject memory cell 91 shifts from the initial state to the variable state. The conditions for shifting the subject memory cell 91 from the initial state to the variable state vary depending on the memory cell 91. That is, various parameters necessary for an electrical stress to be a forming stress are not absolute fixed values, but may vary depending on the memory cell 91. Examples of the parameters are the amplitude, pulse width, and cumulative application time of a voltage applied to the memory cell 91. The cumulative application time is a time corresponding to the total pulse widths of a plurality of electric pulses applied until the resistance state shifts from the initial state to the variable state.

Typically, the forming stress is stronger than the electric signal to be applied for reversibly shifting the resistance value of a memory cell 91 which is in the variable state between a plurality of variable resistance value ranges. For example, at least one of the absolute value of the voltage, pulse width, and cumulative application time of the forming stress may be greater than the counterparts of the electric signal to be applied for changing the resistance value of a memory cell 91 in the variable state.

A variable resistance element in which the resistance value shifts between variable resistance value ranges by the application of electric signals of the same polarity and of different voltages and/or pulse widths is called a unipolar variable resistance element. The unipolar variable resistance element is shifted to the high resistance state, for example, when an electric signal of a voltage of +2 V and a pulse width of 1 μsec is applied, and is shifted to the low resistance state, for example, when an electric signal of a voltage of +4 V and a pulse width of 50 nsec is applied. Concerning the polarity of the voltage of an electric signal, the direction of a current flowing from the second electrode 128 to the first electrode 124 is set to be the positive polarity.

On the other hand, a variable resistance element in which the resistance value shifts between variable resistance value ranges by the application of electric signals of different polarities is called a bipolar variable resistance element. The bipolar variable resistance element is shifted to the high resistance state, for example, when an electric signal of a voltage of +2 V and a pulse width of 50 nsec is applied, and is shifted to the low resistance state, for example, when an electric signal of a voltage of −2 V and a pulse width of 50 nsec is applied. Concerning the polarity of the voltage of an electric signal, the direction of a current flowing from the second electrode 128 to the first electrode 124 is set to be the positive polarity.

Regarding the bipolar variable resistance element, for stabilizing the operation thereof, for example, not only the polarities of the high resistance pulse and the low resistance pulse, but also the pulse width and the absolute value of the voltage of these pulses may be changed.

The variable resistance layer 126 may be made of a metal oxide. The variable resistance layer 126 may include a layer made of an oxygen-deficient metal oxide. The metal oxide contained in the variable resistance layer 126 may be at least one of transition metal oxide and aluminum oxide. The transition metal oxide may be at least one of tantalum oxide, iron oxide, hafnium oxide, and zirconium oxide.

Examples of the material for the variable resistance layer of a unipolar variable resistance element are titanium (Ti) oxide, nickel (Ni) oxide, and aluminum (Al) oxide. Examples of the material for the variable resistance layer of a bipolar variable resistance element are tantalum (Ta) oxide, hafnium (Hf) oxide, aluminum (Al) oxide, and iron (Fe) oxide.

It is possible that, even when the same oxide material is used, both of a unipolar variable resistance element and a bipolar variable resistance element be obtained depending on a combination of the oxide material and an electrode material and the multilayered structure of the oxide material. A detailed description will be given below by taking an example in which the variable resistance layer is made of tantalum oxide. When the variable resistance layer contains tantalum oxide, the variable resistance element can exhibit excellent characteristics.

Examples of the materials for the first and second electrodes 124 and 128 are iridium (Ir), platinum (Pt), tungsten (W), copper (Cu), aluminum (Al), titanium nitride (TiN), tantalum nitride (TaN), and titanium aluminum nitride (TiAlN). In the example shown in FIG. 2, the area of the first electrode 124 is larger than that of the second electrode 128. However, this is only an example. The first electrode 124 may be part of the wire. The first and second electrodes 124 and 128 may be formed into the optimal configuration in accordance with the semiconductor process. The foundation layer 122 may be omitted or changed in accordance with the semiconductor process.

The variable resistance layer 126 may be a multilayer body including a first variable resistance layer connected to the first electrode 124 and a second variable resistance layer connected to the second electrode 128.

The first variable resistance layer may be made of an oxygen-deficient first metal oxide, and the second variable resistance layer may be made of a second metal oxide having a smaller oxygen deficiency than the first metal oxide. The second variable resistance layer may be made of an insulator. For example, within the second variable resistance layer, a minute local area where the oxygen deficiency reversibly changes in accordance with the application of electric pulses is formed. Such a local area is considered to include a filament formed of oxygen defect sites. The local area may be a conductive path passing through the second variable resistance layer. The insulator may be made of a metal oxide, and the conductive path may be formed of an oxygen-deficient metal oxide having a lower oxygen content than the insulator.

The oxygen deficiency is the ratio of the deficient amount of oxygen contained in a certain metal oxide to the amount of oxygen contained in a stoichiometric metal oxide which consists of the same element as the certain metal oxide, where the deficient amount is an amount by subtracting the amount of oxygen contained in the certain metal oxide from that in the stoichiometric metal oxide. If there are plural kinds of stoichiometric metal oxides each of which consists of the same element as a certain metal oxide, the oxygen deficiency of the certain metal oxide is defined on the basis of one stoichiometric metal oxide having the largest resistance value among the plural kinds of stoichiometric metal oxides. A stoichiometric metal oxide is more stable and has a larger resistance value than a metal oxide having other compositions.

For example, in the case of tantalum (Ta), the stoichiometric metal oxide based on the above-described definition is $Ta_2O_5$, and may be expressed by $TaO_{2.5}$. The oxygen deficiency of $TaO_{2.5}$ is 0%. The oxygen deficiency of $TaO_{1.5}$ calculates to $(2.5−1.5)/2.5=40\%$. Conversely, in the case of an oxygen-enriched metal oxide, the oxygen deficiency is expressed by a negative value. In this disclosure, the oxygen deficiency includes positive values, 0, and negative values, unless otherwise stated.

A metal oxide having a small oxygen deficiency is closer to a stoichiometric metal oxide, and thus, it has a large resistance value. A metal oxide having a large oxygen deficiency is closer to a metal contained in the metal oxide, and thus, it has a small resistance value.

The oxygen content is the ratio of oxygen atoms to the total number of atoms. For example, the oxygen content ratio of $Ta_2O_5$ is the ratio of oxygen atoms to the total number of atoms (O/(Ta+O)) and calculates to be 71.4 atm %. Accordingly, the oxygen content of an oxygen-deficient tantalum oxide is greater than 0 and smaller than 71.4 atm %. For example, if the metal contained in the first metal oxide and the metal contained in the second metal oxide are the same type, the oxygen content ratio correlates with the oxygen deficiency. That is, when the oxygen content ratio of the second metal oxide is greater than that of the first metal oxide, the oxygen deficiency of the second metal oxide is smaller than that of the first metal oxide.

A metal element contained in the metal oxide of the variable resistance layer 126 may be a metal other than tantalum. An example of such a metal element is at least one of a transition metal and aluminum (Al). Examples of the transition metal are tantalum (Ta), titanium (Ti), hafnium (Hf), zirconium (Zr), niobium (Nb), tungsten (W), nickel (Ni), and iron (Fe). The transition metal may take multiple oxidation states, and thus may change to different resistance states due to the redox reaction.

For example, the variable resistance layer 126 may be formed of hafnium oxide. In this case, when the composition of the first metal oxide is expressed by $HfO_x$, x may be 0.9 to 1.6, and when the composition of the second metal oxide is expressed by $HfO_y$, y may be greater than x. With this arrangement, the resistance value of the variable resistance layer 126 can vary steadily and speedily. The thickness of the second metal oxide may be 3 to 4 nm.

Alternatively, the variable resistance layer 126 may be formed of zirconium oxide. In this case, when the composition of the first metal oxide is expressed by $ZrO_x$, x may be 0.9 to 1.4, and when the composition of the second metal oxide is expressed by $ZrO_y$, y may be greater than x. With this arrangement, the resistance value of the variable resistance layer 126 can vary steadily and speedily. The thickness of the second metal oxide may be 1 to 5 nm.

A first metal contained in the first metal oxide and a second metal contained in the second metal oxide may be different metals. In this case, the oxygen deficiency of the second metal oxide may be smaller than that of the first metal oxide. In other words, the resistance value of the second metal oxide may be larger than that of the first metal oxide. With this configuration, when a voltage is applied between the first electrode 124 and the second electrode 128, a greater portion of voltage is distributed to the second metal oxide than the first metal oxide, thereby encouraging the occurrence of the redox reaction in the second metal oxide.

The first metal contained in the first metal oxide of the first variable resistance layer and the second metal contained in the second metal oxide of the second variable resistance layer may be different metals. In this case, the standard electrode potential of the second metal may be lower than that of the first metal. The standard electrode potential indicates oxidation characteristics. A metal having a higher standard electrode potential is less likely to oxidize. Accordingly, the redox reaction is more likely to occur in the second metal oxide having a relatively low standard electrode potential.

For example, the first metal oxide may be oxygen-deficient tantalum oxide ($TaO_x$), and the second metal oxide may be titanium oxide ($TiO_2$). The standard electrode potentials of titanium and tantalum are −1.63 eV and −0.6 eV, respectively. In this manner, if the standard electrode potential of the second metal oxide is lower than that of the first metal oxide, the redox reaction is more likely to occur in the second metal oxide. Thus, the resistance value can be steadily changed. In another example of a combination of the first metal oxide and the second metal oxide, the first metal oxide may be oxygen-deficient tantalum oxide ($TaO_x$), and the second metal oxide may be aluminum oxide ($Al_2O_3$).

The resistance variation phenomenon in the variable resistance layer 126 having a multilayered structure may occur in the following manner. In the variable state, the layer made of the second metal oxide having a large resistance value has a minute local area. When the redox reaction occurs in the local area, the filament (conductive path) in the local area is changed, thereby varying the resistance value of the local area.

For example, when a positive voltage is applied to the second electrode 128 connected to the second metal oxide with reference to the first electrode 124, oxygen ions within the variable resistance layer 126 are attracted to the second metal oxide. This causes the oxidation reaction in the minute local area within the second metal oxide so as to decrease the oxygen deficiency in the local area. As a result, oxygen defect sites of a filament within the local area are less likely to be linked to each other, thereby increasing the resistance value.

Conversely, when a negative voltage is applied to the second electrode 128 connected to the second metal oxide with reference to the first electrode 124, oxygen ions within the variable resistance layer 126 are attracted to the first metal oxide. This causes the reduction reaction in the minute local area within the second metal oxide so as to increase the oxygen deficiency in the local area. As a result, oxygen defect sites of a filament within the local area are more likely to be linked to each other, thereby decreasing the resistance value.

The second electrode 128 connected to the second metal oxide having a smaller oxygen deficiency is made of, for example, platinum (Pt), iridium (Ir), or palladium (Pd). The standard electrode potential of the material of the second electrode 128 is higher than that of the metal contained in the second metal oxide and that of the material contained in the first electrode 124. The first electrode 124 connected to the first metal oxide having a greater oxygen deficiency is made of, for example, tungsten (W), nickel (Ni), tantalum (Ta), titanium (Ti), aluminum (Al), tantalum nitride (TaN), and titanium nitride (TiN). The standard electrode potential of the material of the first electrode 124 may be lower than that of the metal contained in the first metal oxide.

That is, the standard electrode potential V2 of the second electrode 128, the standard electrode potential Vr2 of the metal contained in the second metal oxide, the standard electrode potential Vr1 of the metal contained in the first metal oxide, and the standard electrode potential V1 of the first electrode 124 may satisfy the relationships expressed by Vr2<V2 and V1<V2, or may satisfy the relationships expressed by V2>Vr2 and Vr1≤V1.

With this configuration, within the second metal oxide near the interface between the second electrode 128 and the second metal oxide, the redox reaction selectively occurs. As a result, the resistance variation phenomenon can occur steadily.

The variable resistance layer 126 has a multilayered structure including a first variable resistance layer having a composition expressed by $TaO_x$ (0≤x<2.5) and a second variable resistance layer having a composition expressed by $TaO_y$ (x<y<2.5). The variable resistance layer 126 may also include a third variable resistance layer made of a metal oxide having a composition different from the compositions of the first and second variable resistance layers.

$TaO_x$ may also satisfy 0.8≤x<1.9, and $TaO_y$ may also satisfy 2.1≤y<2.5. The thickness of the second variable resistance layer may be 1 to 8 nm. By providing multilayers having different oxygen deficiencies, the directions in which the resistance value is shifted in a bipolar variable resistance element can be determined. For example, it is assumed that the second variable resistance layer contacts the second electrode 128 and the first variable resistance layer contacts the first electrode 124. In this configuration, when a voltage is applied in a direction in which a current flows from the second electrode 128 to the first electrode 124, the resistance value of the variable resistance element 120 is shifted to the high resistance state. Conversely, when a voltage is applied in a direction in which a current flows from the first electrode 124 to the second electrode 128, the resistance value of the variable resistance element 120 is shifted to the low resistance state. In a configuration in which the second variable resistance layer contacts the first electrode 124 and the first variable resistance layer contacts the second electrode 128, the relationships between the directions in which the voltage is applied and the directions in which the resistance value is shifted are reversed.

[Characteristics of Variable Resistance Element in Variable State]

Figure 4:
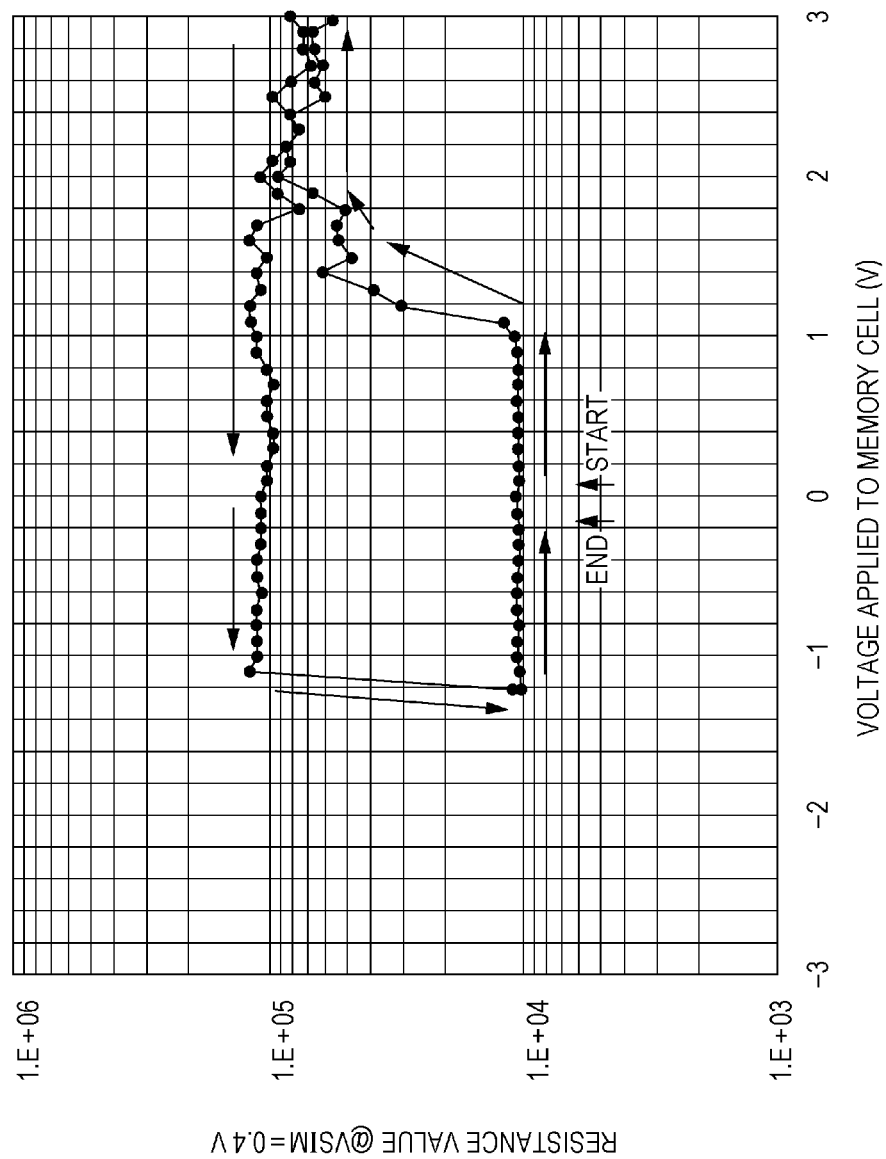
FIG. 4 is a graph illustrating an example of variable resistance characteristics of a bipolar variable resistance element in a variable state.

FIG. 4 is a graph illustrating one example of characteristics of a bipolar variable resistance element in the variable state. In the example shown in FIG. 4, the first electrode 124 is made of TaN, and the second electrode 128 is made of Ir. The variable resistance layer 126 includes a first tantalum-containing layer having a composition expressed by $TaO_x$ ($0<x<2.5$) and a second tantalum-containing layer having a composition expressed by $TaO_y$ ($x<y$). The first tantalum-containing layer contacts the first electrode 124, and the second tantalum-containing layer contacts the second electrode 128. $TaO_x$ contained in the first tantalum-containing layer satisfies $0.8 \leq x \leq 1.9$, and $TaO_y$ contained in the second tantalum-containing layer satisfies $2.1 \leq y \leq 2.5$. The thickness of the second tantalum-containing layer is, for example, 8 nm or smaller. The entire thickness of the variable resistance layer 126 is, for example, 50 nm or smaller. The area of the contact surface between the first tantalum-containing layer and the first electrode 124 and that between the second tantalum-containing layer and the second electrode 128 are equal to those of the variable resistance element 120 used for the measurements shown in FIG. 3.

The horizontal axis of the graph in FIG. 4 indicates the voltage of an electric signal to be applied, and the vertical axis indicates the resistance value of the variable resistance element 120 after the application of an electric signal. In this example, the polarity of an electric signal that causes a current to flow from the second electrode 128 to the first electrode 124 is defined as the positive polarity. The resistance value is calculated from a current when a read voltage VR is applied. The voltage of the electric signal is applied such that it increases in the positive direction from the start position in FIG. 4. After the applied voltage exceeds +1.1 V, the resistance value of the variable resistance element 120 gradually increases, and when the applied voltage is +2.0 V, the resistance voltage reaches about 100000Ω. Thereafter, the voltage of the electric signal is applied such that it approaches 0 and then increases in the negative direction. When the applied voltage is −1.1 V, the resistance value is about 10000Ω. Thereafter, the voltage of the electric signal is applied such that it approaches 0 again, and the resistance value returns to the value at the start position. In the example shown in FIG. 4, a high resistance voltage $V_H$ that causes the resistance value to shift from the low resistance state to the high resistance state and a low resistance voltage $V_L$ that causes the resistance value to shift from the high resistance state to the low resistance state substantially satisfy $|V_H|=|V_L|=2.0$ V. If the absolute value of the high resistance voltage and that of the low resistance value are substantially equal to each other, the resistance value of the variable resistance element 120 may be reversibly shifted by using a common power supply voltage.

Figure 5:
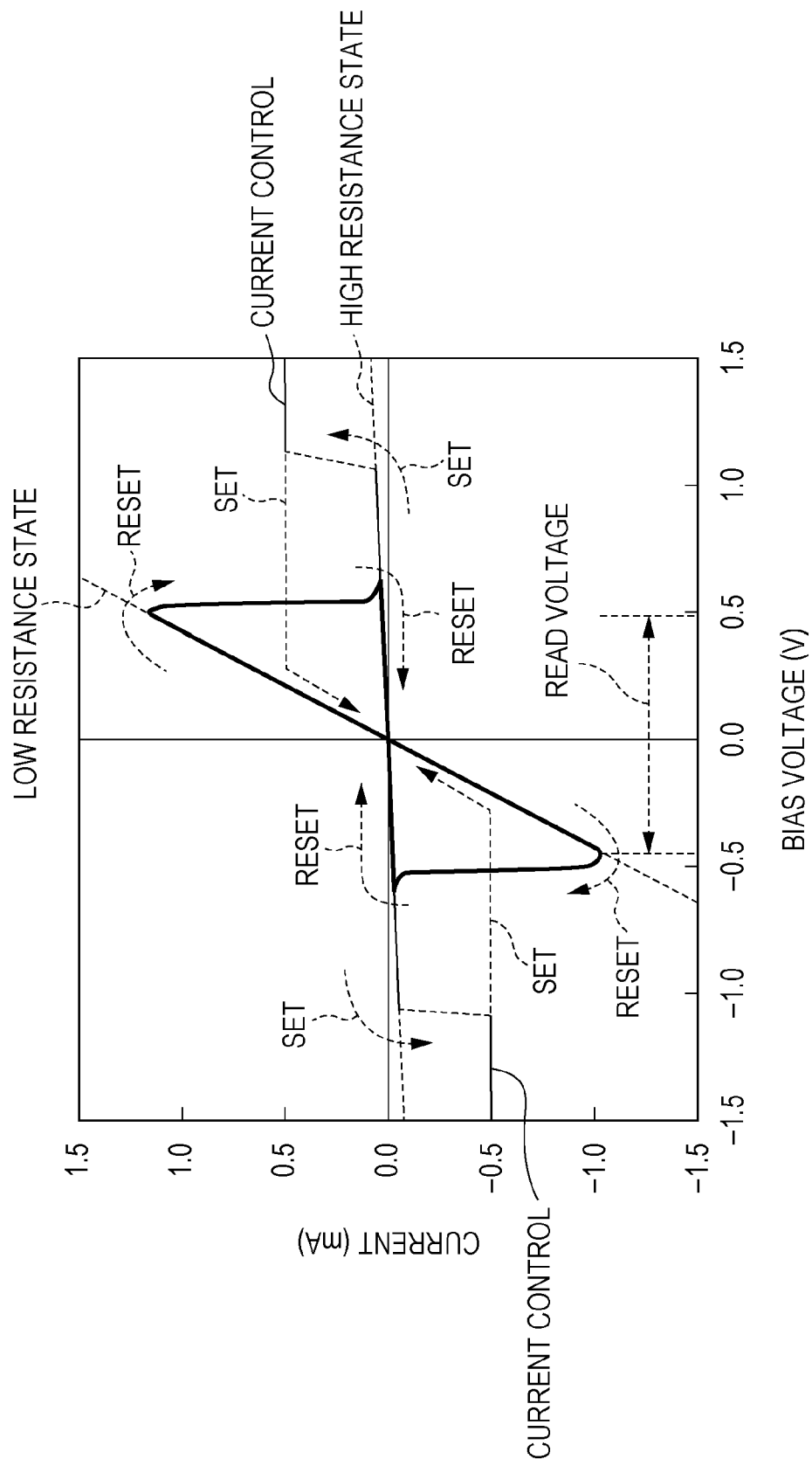
FIG. 5 is a graph illustrating an example of variable resistance characteristics of a unipolar variable resistance element in a variable state.

FIG. 5 is a graph illustrating an example of characteristics of a unipolar variable resistance element in the variable state, which are disclosed in IEDM (International Electron Devices Meeting) Technical Digest. 13-15 Dec. 2004, p. 587. This literature discloses that a variable resistance element having a variable resistance layer made of NiO, $TiO_2$, $HfO_2$, or $ZrO_2$ exhibits unipolar characteristics. Immediately after the variable resistance element has been manufactured, the variable resistance layer formed of one of the above-described transition metal oxides is an insulator, and when a forming stress is applied, the variable resistance layer is shifted to the variable state.

Depending on a combination of the material for the variable resistance layer and the materials for electrodes and on the material for impurities added to the material for the variable resistance layer, the resistance value of the unipolar variable resistance element may be changed symmetrically in the positive voltage and the negative voltage. FIG. 5 shows the characteristics of such a unipolar variable resistance element.

In the example shown in FIG. 5, when the absolute value of a bias voltage exceeds 0.5 V, the variable resistance element shifts to the reset state, that is, to the high resistance state. When the absolute value of a bias voltage exceeds 1.0 V, the variable resistance element shifts to the set state, that is, to the low resistance state. By the application of electric signals of the same polarity and of different voltages, the variable resistance element reversibly shifts between two resistance value ranges. In a unipolar variable resistance element having the characteristics shown in FIG. 5, however, when an electric signal of a positive voltage of +0.5 V or higher and lower than 1 V is applied, the unipolar variable resistance element shifts to the high resistance state, and when an electric signal of a negative voltage of −1 V or lower is applied, the unipolar variable resistance element shifts to the low resistance state. In other words, a variable resistance element having the characteristics shown in FIG. 5 may also be used as a bipolar variable resistance element.

The variable resistance element may be used as a multi-valued memory depending on a combination of the voltage value, pulse width, and the number of application times of an electric signal. For example, the variable resistance element having a variable resistance layer made of tantalum oxide, which exhibits excellent characteristics, may be applicable to a multi-valued memory.

Figure 6:
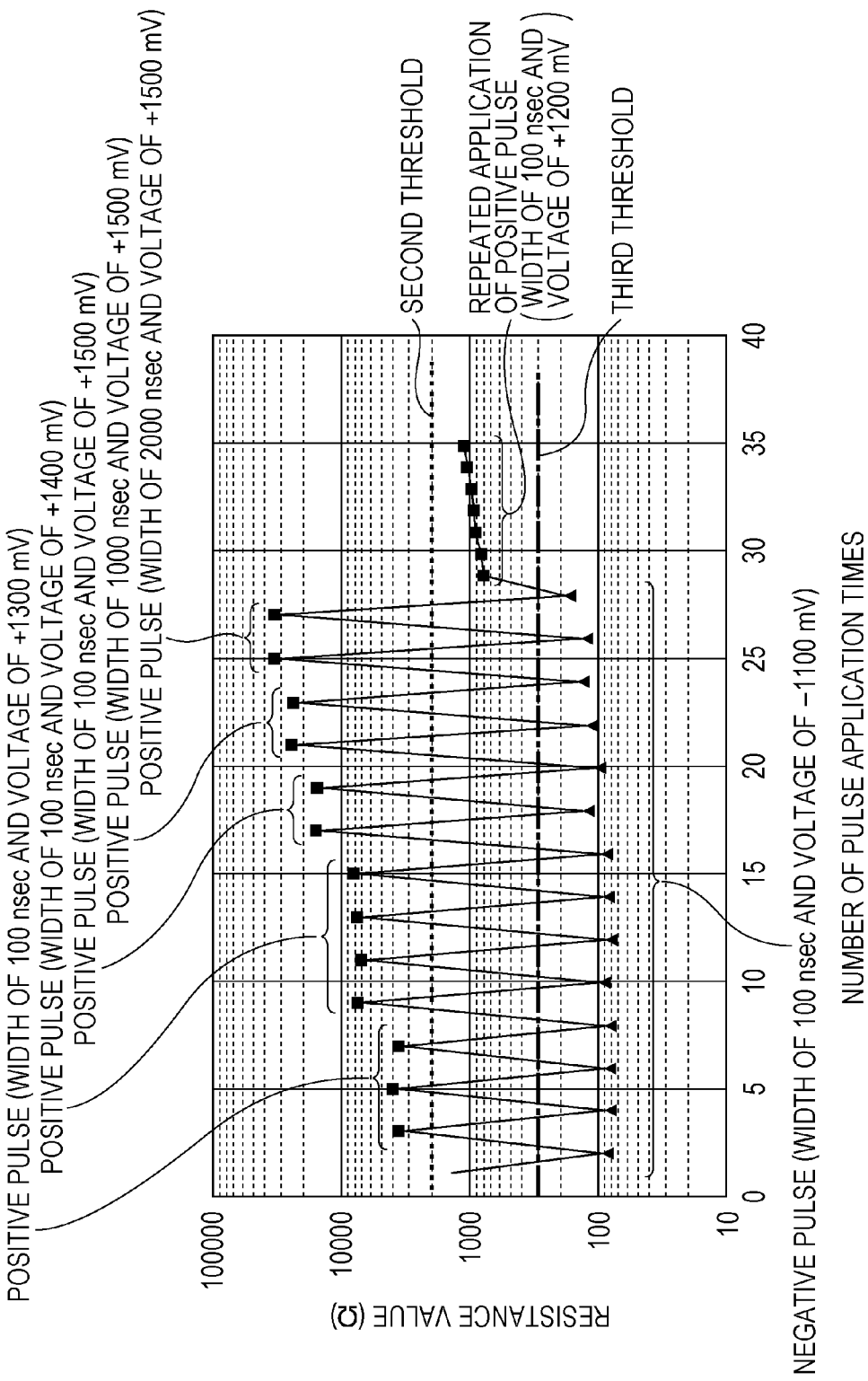
FIG. 6 is a graph illustrating an example of variable resistance characteristics of a variable resistance element.

FIG. 6 is a graph illustrating an example of the variable resistance characteristics of a variable resistance element. The horizontal axis indicates the number of application times of an electric signal, and the vertical axis indicates the resistance value after the application of an electric signal. As in the case of FIG. 4, the resistance value is calculated from a read current flowing through the variable resistance element when a read voltage VR is applied thereto. In FIG. 6, the solid triangles indicate the resistance value obtained by the application of a negative-polarity electric signal, and the solid squares indicate the resistance value obtained by the application of a positive-polarity electric signal.

In the example shown in FIG. 6, the configuration of the variable resistance element 120 is similar to that used for the measurements shown in FIG. 3.

FIG. 6 shows that, as the voltage value of a positive-polarity electric signal increases from 1300 to 1500 mV, the resistance value obtained by the application of the electric signal gradually increases. When the voltage value of a positive-polarity electric signal is fixed to 1500 mV, as the pulse width of the electric signal increases, such as 100 nsec, 1000 nsec, and 2000 nsec, the resistance value obtained by the application of the signal gradually increases. When the voltage value of a positive-polarity electric signal is fixed to 1200 mV, which is a relatively small value, and is repeatedly applied multiple times, the resistance value obtained by the application of the signal gradually increases. The resistance value of a variable resistance element 120 having such characteristics may be adjusted precisely by relatively small voltage pulses. That is, a variable resistance element 120 having the characteristics shown in FIG. 6 can be shifted among three or more variable resistance value ranges with high controllability.

For example, it is assumed that, when the resistance value read by a sense amplifier is greater than the second threshold, "0" is output, and when the resistance value is smaller than the second threshold, "1" is output. In this case, when a positive-polarity pulse of +1300 mV or higher is applied to a memory cell 91 having the characteristics shown in FIG. 6, "0" is output. On the other hand, when a negative-polarity pulse or a positive-polarity pulse of +1200 mV and 100 nsec is applied to a memory cell 91 having the characteristics shown in FIG. 6, "1" is output. If the resistance value of a memory cell 91 exactly coincides with the second threshold, either one of "1" and "0" may be assigned to such a memory cell 91.

For example, it is assumed that, when the resistance value read by a sense amplifier is greater than a third threshold, "0" is output, and when the resistance value is smaller than the third threshold, "1" is output. In this case, when a positive-polarity pulse of +1200 mV or higher is applied to a memory cell 91 having the characteristics shown in FIG. 6, "0" is output. On the other hand, when a negative-polarity pulse is applied to a memory cell 91 having the characteristics shown in FIG. 6, "1" is output.

In this manner, two types of digital data may be respectively generated on the basis of the two thresholds. Alternatively, three-valued data may be generated on the basis of the two thresholds.

A resistance change of the variable resistance element 120 occurs due to the generation of a conductive path, through which the second electrode 128 and the first electrode 124 are electrically connected to each other, within the variable resistance layer 126. This has been observed by a cross-section analysis. The diameter of the local area, which includes the conductive path, in the variable resistance layer 126 is about 30 to 10 nm or smaller. The conductive path is even smaller than the minimum size that can be processed by a lithographic technology of the most-advanced semiconductor process. That is, the conductive path is less likely to be influenced by process variations. Accordingly, the variable resistance element described above can exhibit stable variable resistance characteristics even if the design rules in the manufacturing process become smaller.

The variable resistance layer of the variable resistance element may be formed without being subjected to a heat treatment at a high temperature, such as about 200° C. or higher. Accordingly, degradation of the characteristics of complementary metal oxide silicon (C-MOS) transistors, which would by caused by a heating process, may be avoided. The variable resistance element has a higher affinity with a semiconductor process than a memory device using a floating-gate transistor, such as a flash memory. Accordingly, even with smaller design rules in the manufacturing process, the reliability of variable resistance elements is less likely to be decreased. Thus, even when a logic circuit, such as a controller, and a variable resistance element are formed on the same chip, the variable resistance element can be formed without substantially influencing the characteristics of the logic circuit. If the logic circuit and the variable resistance element are produced by the same process, the manufacturing cost can be reduced.

[Mechanism of Random Change in Resistance Value of Memory Cell]

The memory cell 91 has the following characteristics. When the resistance value of the memory cell 19 belongs to a variable resistance value range, it randomly changes within the variable resistance value range over time. The memory cell 91 has at least one variable resistance value range in which the resistance value in the variable resistance value range may randomly change over time.

FIG. 7 is a graph illustrating an example of resistance value obtained by sequentially reading the resistance values of memory cells which are each within one variable resistance value range. The term "the resistance value is within one variable resistance value range" refers to that a memory cell is in one resistance state. That is, in the case of a two-valued memory cell, for example, this memory cell is in the high resistance state, but not in the low resistance state.

The dimensions of the memory cells used for the experiment indicated by the graph of FIG. 7 are about 400 nm×400 nm. The lower electrode is made of TaN and has a thickness of about 50 nm. The upper electrode is made of iridium and has a thickness of about 100 nm. The variable resistance layer has a first tantalum-containing layer and a second tantalum-containing layer. The thickness of the first tantalum-containing layer is about 65 nm, and the thickness of the second tantalum-containing layer is about 5 nm. As a high resistance pulse, a voltage pulse of a voltage of 1.8 V and a pulse width of 50 nsec was applied across each memory cell including a selection element and the variable resistance layer. As a low resistance pulse, a voltage pulse of a voltage of 2.4 V and a pulse width of 50 nsec was applied across each memory cell including a selection element and the variable resistance layer. As a read pulse, a voltage pulse of a voltage of 0.4 V and a pulse width of 100 nsec was applied across each memory cell including a selection element and the variable resistance layer. It was observed that the variable resistance element reversibly shifted between the high resistance state and the low resistance state by the alternate application of the high resistance pulse and the low resistance pulse. Thereafter, by the application of the high resistance pulse only once, the variable resistance element shifted from the low resistance state to the high resistance state. Thereafter, neither of the low resistance pulse nor the high resistance pulse was applied to the variable resistance element. The read pulse was repeatedly applied to the variable resistance element so as to read resistance value information 1000 times. The read time interval was 5 μsec.

In FIG. 7, the horizontal axis indicates the number of read times, and the vertical axis indicates the standardized resistance value. FIG. 7 shows fluctuations in the resistance values of three variable resistance elements A, B, and C having the same configuration. The resistance value is obtained in a read circuit, which will be described later. As a result of repeatedly reading resistance values of the variable resistance elements A, B, and C which are each in one resistance state, as it is shown in FIG. 7, the resistance values randomly increase and decrease. FIG. 7 also shows that the amplitude and the period of a change in the resistance value greatly differ among the variable resistance elements A, B, and C.

The change or the fluctuation in the resistance value refers to a phenomenon in which the resistance value of a memory cell changes over time, even though an electric pulse that causes the resistance state to shift is not applied. In other words, the change or the fluctuation in the resistance value refers to a phenomenon in which the resistance value of a memory cell changes over time while the memory cell remains in one resistance state. Examples of an electric pulse that causes a resistance state to shift are a high resistance pulse and a low resistance pulse. An example of an electric pulse that does not cause a resistance state to shift is a read pulse.

Figure 8A:
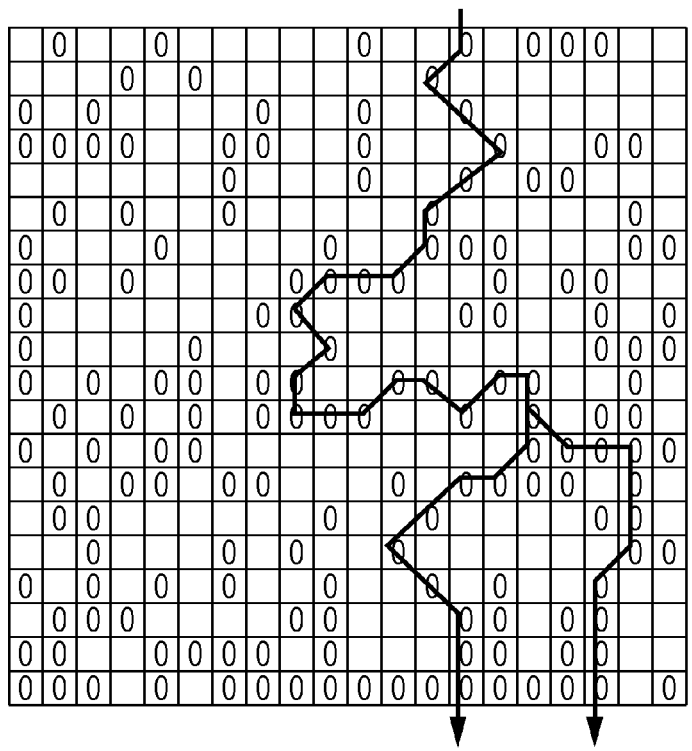
FIGS. 8A and 8B illustrate examples of simulation results, which are obtained by using a percolation model, of the formation of filaments within a variable resistance layer (for example, a local area) during forming.
Figure 8B:
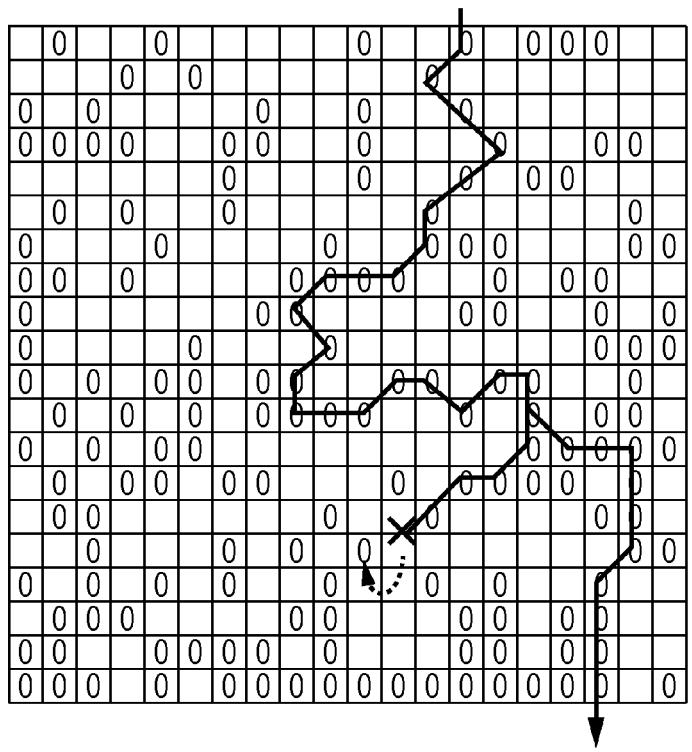

FIGS. 8A and 8B illustrate examples of the simulation results of the formation of filaments within a variable resistance layer (for example, a local area) during forming obtained by using a percolation model.

The percolation model is a model based on the theory that, as the density of defect sites randomly distributed within the variable resistance layer is increased, the defect sites are more likely to be linked with each other. "Defects" mean that, for example, oxygen is deficient within a metal oxide, and "the density of defect sites" correlates with, for example, the oxygen deficiency. That is, as the oxygen deficiency is increased, the density of the defect sites is increased.

In the simulation shown in FIGS. 8A and 8B, oxygen ion sites of the variable resistance layer are approximately assumed as lattice-like divided areas (sites). Based on this assumption, filaments formed by defect sites which were probabilistically generated were determined by simulations. In FIGS. 8A and 8B, sites containing "0" are defect sites formed within the variable resistance layer. On the other hand, vacant sites are sites occupied by oxygen ions. The sites occupied by oxygen ions are high-resistance areas without a conductive path. The arrow indicates a link of connected defect sites, each being connected to another defect site in one of the top, bottom, right, left, and oblique directions. The link of these defect sites corresponds to a filament formed within the variable resistance layer. That is, the arrow indicates a path through which a current flows when a voltage is applied in the vertical direction in FIGS. 8A and 8B.

As shown in FIG. 8A, a filament which causes a current to flow between the top and bottom surfaces of the variable resistance layer is constituted by clusters of defect sites which connect the top end and the bottom end, among the randomly distributed defect sites. Based on the percolation model, the number and configuration of filaments are probabilistically determined. The distribution of the number and configuration of filaments results in a variation in the resistance value of the variable resistance layer.

If oxygen ions are supplied to a filament by the application of a high resistance pulse, the oxygen ions are coupled with a defect site, thereby disconnecting a filament path. This causes the variable resistance layer to shift to the high resistance state. Conversely, by the application of a low resistance pulse, oxygen ions are detached from a site, and a defect site is generated, thereby increasing the probability that a filament path will be formed. This causes the variable resistance layer to shift to the low resistance state. If there is a sufficient difference in the number of filament paths between the different resistance states, the difference in the resistance value may be increased, thereby increasing the margin for determining the resistance value.

A description will now be given of the mechanism of the phenomenon of a fluctuation in the resistance value of a variable resistance element which is in one resistance state, such as that shown in FIG. 7.

The configuration, number, and thickness of filament paths, which determine the resistance value of each resistance state, are not exactly stable with respect to the time. A defect site may be generated by the detachment of oxygen ions from an oxygen site, or a defect site may disappear by the supply of oxygen ions to a defect site, thereby causing a subtle change in the configuration, number, and thickness of a filament path. This is observed as a fluctuation in the resistance value over time. FIG. 8B illustrates an example in which one of the filament paths shown in FIG. 8A is disconnected by the replacement of a mere defect site by an adjacent site. In this case, the resistance value is slightly increased. Conversely, a new filament path may be generated if a defect site is replaced by an adjacent site, though such an example is not shown. In this case, the resistance value is slightly decreased. The phenomenon of a fluctuation in the resistance value shown in FIG. 7 may occur by such a mechanism. In practice, there are many filament paths, such as those shown in FIGS. 8A and 8B, and the total number of filament paths may be not considerably changed although it is slightly increased or decreased. That is, in the phenomenon of a fluctuation in the resistance value, a significant change in the filament paths which would shift the resistance state of a memory cell to another resistance state is unlikely to occur.

The phenomenon of a fluctuation in the resistance value based on the above-described mechanism may apply to all variable resistance elements in which the resistance value is changed due to the migration of ions, such as oxygen ions, contained in an oxide. For example, a variable resistance element constituted by a first electrode, a metal oxide, and a second electrode stacked in this order exhibits such a characteristic. In particular, a variable resistance element constituted by a first electrode, a transition metal oxide, and a second electrode stacked in this order is more likely to exhibit such a characteristic.

[Mechanism of Random Completion of Forming]

A case in which a filament is formed by the connection of defect sites, such as oxygen defect sites, in a variable resistance layer by the application of a forming stress will now be considered.

Forming corresponds to an operation for forming a filament by changing the density of defect sites within a metal oxide in a partial area of a variable resistance layer. For example, by applying an electrical stress, the initial state of a partial area in which the defect sites are sparse is changed to a state in which the defect sites are dense. As a result, a filament formed by connected defect sites is generated. If the variable resistance layer is made of a metal oxide, multiple defect sites within the variable resistance layer are randomly located according to the memory cell. For example, the distance between defect sites, which may be a barrier to forming a filament, varies among the memory cells. Accordingly, even if a uniform electrical stress is applied to each memory cell, the amount of electrical stress required to form a filament may differ among the memory cells. As a result, when a given electrical stress is applied to a plurality of memory cells in the initial state, memory cells in which forming has been completed are randomly generated.

Transition from the initial state to the variable state due to forming may be explained by a similar mechanism as long as a material that can form a filament path by connected defect sites, such as oxygen defect sites, is used. Accordingly, even if a variable resistance layer includes multiple layers made of different metal oxides, transition from the initial state to the variable state may be explained by a similar mechanism. Thus, when a given electrical stress is applied to memory cells in the initial state, it is determined probabilistically, that is, randomly, as to whether or not a filament is formed in the memory cells due to forming.

[Method for Generating Random Number Data Using Fluctuation in Resistance Value]

Figure 9:
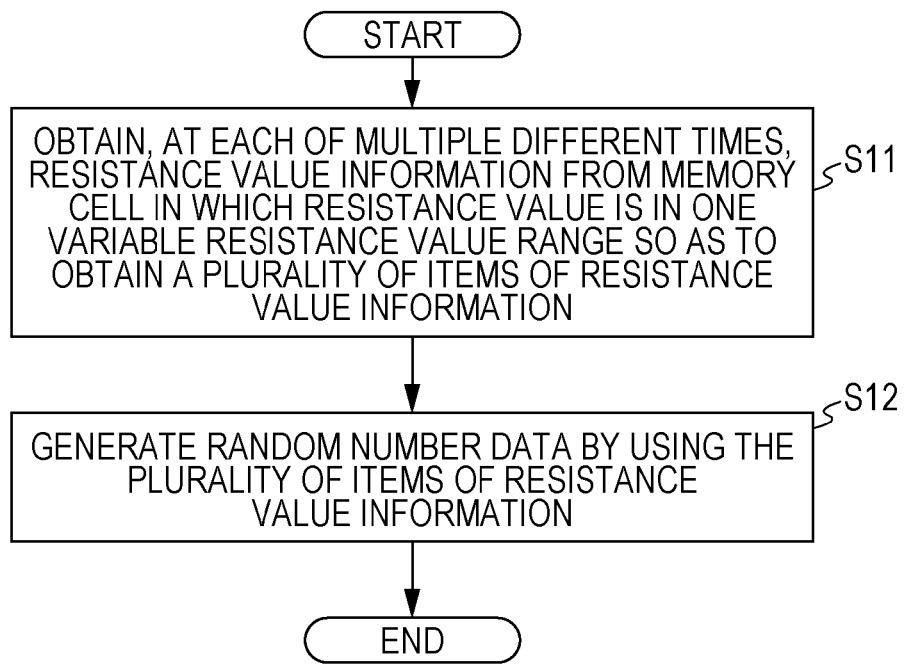
FIG. 9 is a flowchart illustrating an example of a random number processing method according to an embodiment.

FIG. 9 is a flowchart illustrating an example of a random number processing method according to an embodiment. The random number processing method of an embodiment will be described below with reference to FIG. 9.

As shown in FIG. 9, in step S11, at each of multiple different times, resistance value information is obtained from a memory cell 91 in which the resistance value is within one variable resistance value range so as to obtain a plurality of items of resistance value information.

Then, in step S12, random number data is generated by using the plurality of items of resistance value information obtained at multiple different times in step S11.

For example, as shown in FIG. 7, the resistance value of the memory cell 91 randomly changes at each of multiple different times. Accordingly, the plurality of items of resistance value information obtained in step S11 considerably differ from each other. Random number data is generated by using the plurality of items of resistance value information. For example, the binary values determined from the obtained items of resistance value information are arranged in order in which they have been read, thereby generating random number data.

A specific method for generating random number data is not particularly restricted. Any method may be employed as long as it is possible to generate random number data by utilizing the above-described variation in the resistance value. By generating random number data by utilizing such a physical phenomenon, it is possible to generate random number data of higher quality than pseudorandom numbers.

A difference between two items of resistance value information obtained from the memory cell 91 at two different times may be determined. In this case, by determining whether or not this difference is contained within a certain range (first range), random number data may be generated. For example, if the difference is greater than 0, "1" is output, and if the difference is equal to or smaller than 0, "0" is output.

Alternatively, the magnitude relation between two items of resistance value information obtained from the memory cell 91 at two different times may be determined. In this case, by using the determination result, random number data may be generated. For example, if an item of resistance value information at a certain time is smaller than that at the subsequent time, "1" is output, and if an item of resistance value information at a certain time is equal to or greater than that at the subsequent time, "0" is output. The magnitude relation may be determined by using the difference between two items of resistance value information or by using the ratio of two items of resistance value information.

[Operation Modes and Commands]

The random number processing apparatus 100 may have four or more operation modes. In this case, the random number processing apparatus 100 may receive one command selected from among four or more commands from an external source and may selectively execute one of the four or more operation modes on the basis of the received command.

The random number processing apparatus 100 may selectively execute one of a first write mode, a first read mode, a second write mode, and a second read mode. In the first write mode, the random number processing apparatus 100 writes data, for example, in accordance with whether each memory cell 91 is in the initial state or in the variable state. In the first read mode, the random number processing apparatus 100 reads data, for example, in accordance with whether each memory cell 91 is in the initial state or in the variable state. In the second write mode, the random number processing apparatus 100 writes data, for example, in accordance with whether or not the resistance value of each memory cell 91 is in at least one of variable resistance value states, instead of whether or not the resistance value of each memory cell 91 in the initial resistance value range. In the second read mode, the random number processing apparatus 100 reads data, for example, in accordance with whether or not the resistance value of each memory cell 91 is in at least one of variable resistance value states, instead of whether or not the resistance value of each memory cell 91 in the initial resistance value range. In the present disclosure of an embodiment, data which has been read or written in accordance with whether each memory cell 91 is in the initial state or the variable state may be referred to as "first type data", and data which has been read or written in accordance with whether or not the resistance value of each memory cell 91 is in at least one of variable resistance value states, instead of whether or not the resistance value of each memory cell 91 in the initial resistance value range may be referred to as "second type data".

Specific examples of the four modes will be described below by using the example shown in FIG. 3.

In a special write mode, the controller 93 causes a forming stress to be applied to a memory cell 91 which is selected in accordance with input value "1", and does not cause an electrical stress to be applied to a memory cell 91 which is selected in accordance with input value "0". The special write mode is an example of the first write mode. A command to execute the special write mode, which is input from the outside of the random number processing apparatus 100, is called a special write command. The special write command is an example of the first write command.

In a special read mode, the controller 93 causes data of a memory cell 91 to be read by making a determination using the first threshold. The special read mode is an example of the first read mode. A command to execute the special read mode, which is input from the outside of the random number processing apparatus 100, is called a special read command. The special read command is an example of the first read command.

In a normal write mode, the controller 93 causes a low resistance pulse to be applied to a memory cell 91 which is selected in accordance with input value "1" and causes a high resistance pulse to be applied to a memory cell 91 which is selected in accordance with input value "0". The normal write mode is an example of the second write mode. A command to execute the normal write mode, which is input from the outside of the random number processing apparatus 100, is called a normal write command. The normal write command is an example of the second write command.

In a normal read mode, the controller 93 causes data of a memory cell 91 to be read by making a determination using the second threshold. The normal read mode is an example of the second read mode. A command to execute the normal read mode, which is input from the outside of the random number processing apparatus 100, is called a normal read command. The normal read command is an example of the second read command.

[Example of Limitations of Data Access]

In the above-described configuration, the normal write command and the normal read command may be widely disclosed by, for example, a manual of the random number processing apparatus 100. In contrast, the special write command and the special read command may be possessed only by the manufacturer of the random number processing apparatus 100, that is, the special write command and the special read command may be confidential.

The manufacturer of the random number processing apparatus 100 may write a password in a specific region of the memory cell array 90 by using the special write command. When a specific user inputs a password from the outside of the random number processing apparatus 100, the controller 93 may collate the input password with the password read from the specific region of the memory cell array 90 in the special read mode. Only when the two passwords coincide with each other, may the controller 93 permit this specific user to read data in the normal read mode and to write data in the normal write mode.

With the above-described configuration, the random number processing apparatus 100 may record paid content data in a certain region in the memory cell array 90 in the normal write mode, and may record identification (ID) information concerning the random number processing apparatus 100 and serial number information for each item of content in another region of the memory cell array 90 in the special write mode. This enables only special users who know the ID information and serial information to access paid content recorded in the memory cell array 90. In this case, unauthorized users who do not know the special write command are unable to rewrite data written in the special write mode and to access data without inputting a password.

The random number processing apparatus 100 may be sealed with a resin. This makes it difficult to probe the internal wiring of the random number processing apparatus 100 and to conduct analysis by measuring the electrical resistance. That is, unless a user leaks ID information and a command corresponding to the special read command, the internal data is not illegally accessed.

If a known flash memory is used as a multi-valued memory, in accordance with smaller design rules in the manufacturing process, the reliability of data recording may be decreased. High reliability is demanded for recording parameter data used for cryptographic or authentication applications.

In contrast, the random number processing apparatus 100 including memory cells having variable resistance elements can maintain its high reliability even if design rules in the manufacturing process become smaller. In particular, when the variable resistance layer has a minute local area including a filament, it is less vulnerable to the influence of the smaller design rules in the manufacturing process, as described above. Accordingly, parameter data used for cryptographic or authentication applications can be recorded with higher reliability.

An encryption/authentication processor which performs at least one of encryption and authentication may be formed together with the random number processing apparatus 100 on the same chip. With this configuration, when sending and receiving data, such as encryption parameters, between the encryption/authentication processor and the random number processing apparatus 100, it is less likely that signal waveforms will be read on the interface, thereby decreasing the possibility that a leakage of encryption parameters occur. It is almost impossible to determine the resistance state of a variable resistance element by conducting physical analysis, and thus, the possibility that physical leakage of encryption parameters occur is substantially eliminated.

If mixed circuitry of a known flash memory and a controller thereof is used, it is difficult to manufacture the flash memory and the controller by the same process. Additionally, high-temperature heat treatment performed in manufacturing a flash memory may adversely influence a logic circuit within the controller.

In contrast, the random number processing apparatus 100 including memory cells having variable resistance elements does not have to be subjected to high-temperature heat treatment in a manufacturing process, and thus is less likely to adversely influence the semiconductor characteristics of the C-MOS process. Accordingly, it is possible to manufacture, as a random number processing apparatus 100, mixed circuitry of the memory cell array 90 and a logic circuit included in the controller 93 without impairing the characteristics thereof and without increasing the manufacturing cost.

In the above-described example, four operation modes and four commands to execute these four operation modes have been described. However, the number of operation modes and commands and combinations thereof are not restricted to those described above. For example, if seven resistance value ranges are set for the resistance value of a memory cell in the variable state as shown in FIG. 6, a total of eight resistance value ranges including the seven variable resistance value ranges and the initial resistance value range may be set. Accordingly, for example, three-valued data may be written in the special write mode, and four-valued data may be written in the normal write mode. A combination of resistance value ranges used for writing may be selected appropriately according to the system to be used.

[Randomness in Transition to Variable State]

An operation for shifting the resistance value of a variable resistance element in the initial state from the initial resistance value range to a certain variable resistance value range is referred to as "forming". For example, it is now assumed that the voltage and the pulse width of a high resistance pulse are indicated by $V_H$ and $TP_H$, respectively, the voltage and the pulse width of a low resistance pulse are indicated by $V_L$ and $TP_L$, respectively, and the voltage and the pulse width of a forming stress are indicated by $V_F$ and $TP_F$. In this case, $V_H$, $V_L$, $V_F$, $TP_H$, $TP_L$, and $TP_F$ may satisfy at least one of the following conditions 1 and 2.

$$|V_F|>|V_H| \text{ and } |V_F|>|V_L| \quad \text{Condition 1:}$$

$$TP_F>TP_H \text{ and } TP_F>TP_L \quad \text{Condition 2:}$$

In this case, forming is not performed under the write conditions in the normal write mode.

The forming stress may be a plurality of electrical stresses that satisfy condition 2. The plurality of electrical stresses may have the same voltage. Alternatively, in the process of repeatedly applying electrical stresses, the voltage and/or pulse width of the electrical stresses may be progressively increased.

It is assumed that, for shifting all memory cells within a memory cell array from the initial state to the variable state, the application of an electrical stress of 10000 units of a standardized cumulative application time is required for one memory cell. In this case, for example, if the application of an electrical stress is suspended when an electrical stress of 150 units has been applied, not all the memory cells have been shifted to the variable state. As a result of the experiment, it has been proved that memory cells that have been shifted from the initial state to the variable state may be randomly generated in the memory cell array.

That is, when an electrical stress that may shift the memory cells from the initial state to the variable state is applied to the memory cell array, memory cells which are shifted from the initial state to the variable state and memory cells which remain in the initial state may be generated randomly.

Figure 10:
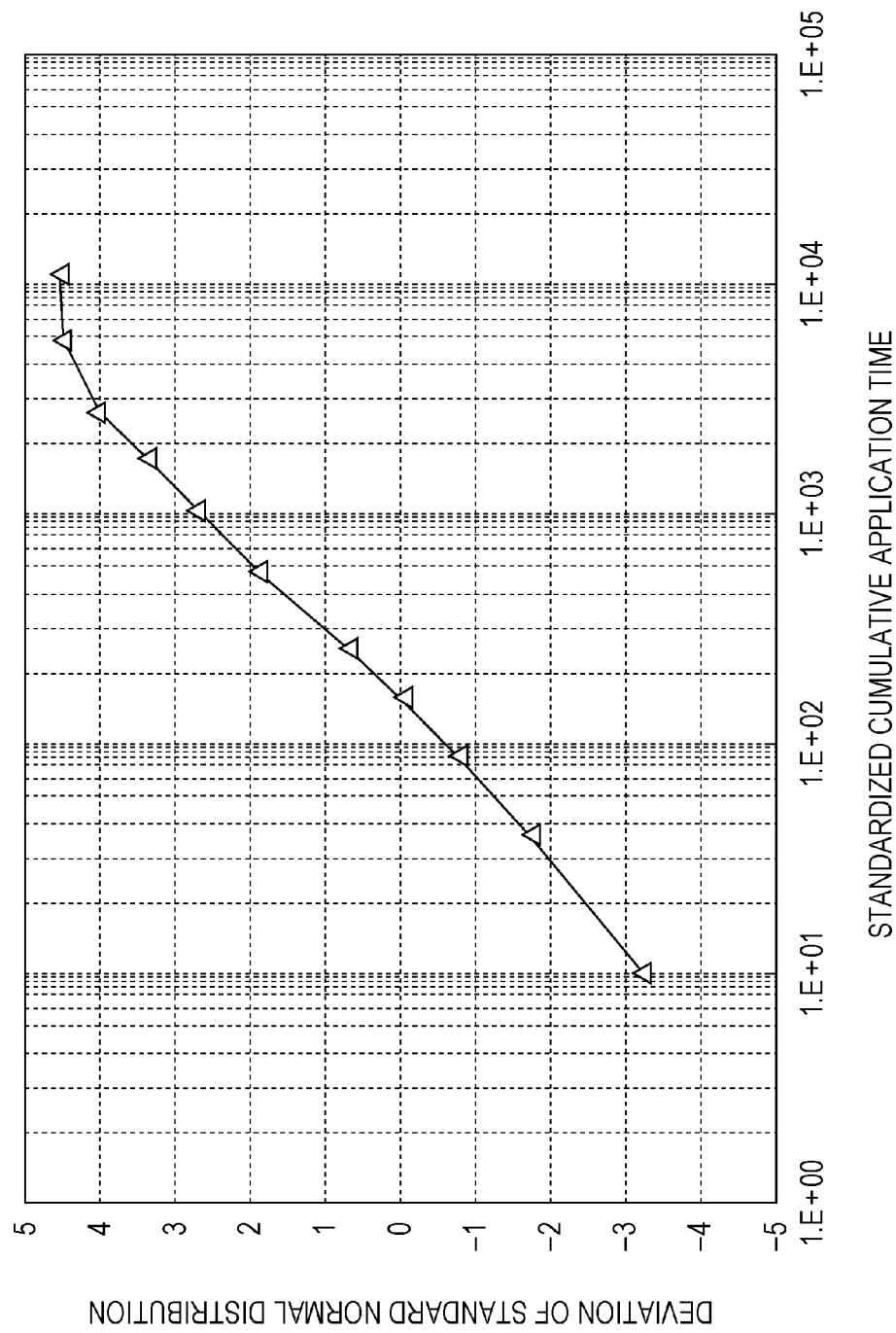
FIG. 10 is a graph illustrating an example of the relationship between the standardized cumulative application time and the deviation of the standard normal distribution concerning the number of memory cells that have shifted from an initial state to a variable state.

FIG. 10 is a graph illustrating an example of the relationship between the standardized cumulative application time and the deviation of the standard normal distribution concerning the number of memory cells that have shifted to the variable state. The configuration of the variable resistance elements used for the measurement shown in FIG. 10 is similar to that used in the example shown in FIG. 3. A forming stress includes a plurality of electrical stresses of a voltage of 3.5 V and a shortest pulse width of 10 μsec. The number of memory cells has 256 Kbits. The cumulative application time shown in FIG. 10 is a time standardized by a predetermined coefficient based on the shortest pulse width.

FIG. 10 shows that the normal distribution of the cumulative bit number of the number of memory cells in which forming has been completed increases substantially linearly with respect to the standardized cumulative application time. This has been validated that the transition from the initial state to the variable state occurs randomly. This randomness may be used for creating unique and/or random ID information for each random number processing apparatus 100.

In FIG. 10, if the application of an electrical stress has suspended when the standardized cumulative application time reaches about 150 ($1.5 \times 10^2$), the number of memory cells that have shifted to the variable state and the number of memory cells that have not shifted to the variable state are substantially the same. Memory cells that have shifted to the variable state are randomly located within the memory cell array. Accordingly, for example, if the special write mode under such condition is executed, some memory cells in the memory cell array are randomly selected, and the selected memory cells shift from the initial state to the variable state. In other words, in the special write mode, random data is generated and is recorded in the memory cell array. The random data is data unique to the random number processing apparatus 100.

The reason why the randomness and the uniqueness described above occur may be, not only the process variations and configuration variations in the variable resistance elements, but also the probabilistic formation of conductive paths. As described above, defect sites within a metal oxide are randomly located in each memory cell. These defect sites are linked with each other by forming so as to generate a filament. Accordingly, even if a uniform electrical stress is applied to a plurality of memory cells in the initial state, memory cells in which forming has been completed can be randomly generated statistically, for example, as in the standardized normal distribution shown in FIG. 10. Thus, even if a uniform stress is applied to a plurality of memory cells in the special write mode, memory cells in which filaments are formed and memory cells in which filaments are not formed are probabilistically generated. The probability may be adjusted appropriately by the electrical stress. It is inferred that random data may be generated by a similar mechanism as long as a material that can form a filament path by connected defect sites, such as oxygen defect sites, is used.

In the related art, pseudorandom numbers are generated by using a given function. However, if the function and the input initial value are fixed, it is possible that the same value be output depending on the number of calculations. Accordingly, random numbers generated in a device may be predicted.

The randomness in the transition from the initial state to the variable state in a memory cell array makes it possible to generate unpredictable random number data. Random number data generated in the special write mode may be used as the initial value to be input into the function for obtaining the random numbers. This can further enhance the randomness.

For example, in the special write mode, random number data may be written as ID information and serial information. This makes it possible to generate and record ID information and serial information in an unpredictable manner. The ID information and serial information written in the special write mode can be read in the special read mode. Accordingly, for example, only a user authorized to execute the special read mode is able to use content.

In this embodiment, a random number processing method using a fluctuation in the resistance value may be combined with a random number processing method using the application of a forming stress.

[NIST SP800-22 Statistical Test Suite for Random Numbers]

An example of tests for evaluating random numbers will be described below. SP800-22 ("A Statistical Test Suite for Random and Pseudorandom Number Generators for Cryptographic Applications" National Institute of Standard Technology (NIST), Special Publication 800-22 Revision 1, August 2008") drawn by NIST indicates statistical tests for random numbers for cryptographic applications, which evaluates the randomness of stream data having a certain bit number. SP800-22 is constituted by fifteen tests. Among these fifteen tests, the following nine tests are applied to stream data smaller than one Mbit.

(1) Frequency Test
(2) Frequency Test within a Block
(3) Runs Test
(4) Test for Longest Run of Ones in a Block
(5) Binary Matrix Rank Test
(6) Discrete Fourier Transform Test
(11) Serial Test
(12) Approximate Entropy Test
(13) Cumulative Sums (Cusums) Test Table 1 indicates a brief description of specific evaluations. When the value (p-value) calculated in each test is 0.01 or greater, random numbers is considered to be acceptable in a corresponding test. The randomness of random number data generated by the method of this embodiment may be evaluated in this test suite. High quality random number data passed this test suite may be used for, for example, cryptographic applications.

TABLE 1

| Test Type | Brief Description of Evaluations |
| --- | --- |
| 1. Frequency Test | Whether or not 1s and 0s in a random number sequence are substantially the same |
| 2. Frequency Test within a Block | Whether or not the number of 1s in a block is substantially half |
| 3. Runs Test | Whether or not the number of runs of 1s or 0s is uniform |

TABLE 1-continued

| Test Type | Brief Description of Evaluations |
|---|---|
| 4. Test for Longest Run of Ones in a Block | Whether or not the frequency distribution of the number of runs of 1s subjected to chi-square test is uniform |
| 5. Binary Matrix Rank Test | Whether or not a matrix rank generated from a random number sequence is uniform |
| 6. Discrete Fourier Transform Test | Whether or not frequency components obtained by discrete Fourier transform exceed threshold |
| 7. Serial Test | Whether or not all possible m-bit patterns uniformly appear |
| 8. Approximate Entropy Test | Whether or not all possible n-bit patterns form a statistically ideal distribution |
| 9. Cumulative Sums (Cusums) Test | Whether or not the maximum absolute value of the cumulative sum of −1 and 1 digits converted from 0 and 1 is uniform |

[Issues Concerning Generating of Random Number Data Using Fluctuation in Resistance Value]

Figure 11:
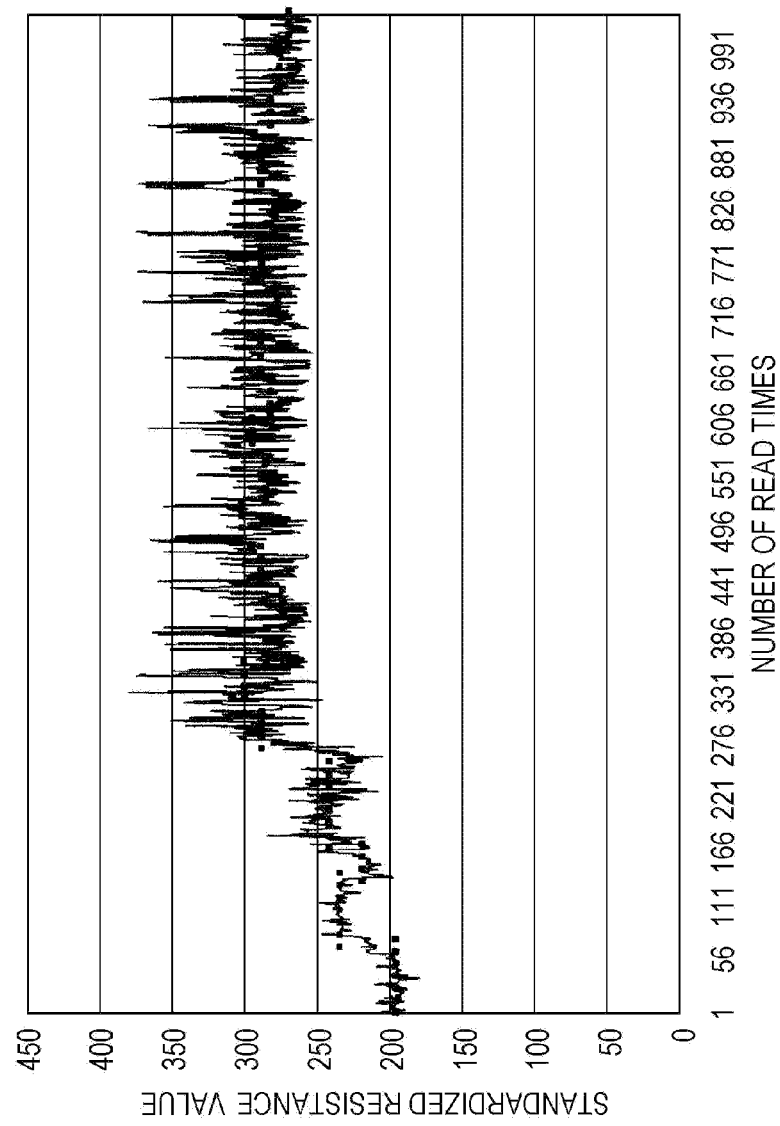
FIG. 11 is a graph illustrating an example in which resistance values are sequentially read from a memory cell which is in one variable resistance value range.

FIG. 11 is a graph illustrating an example in which resistance values are sequentially read from a memory cell which is in one variable resistance value range. A fluctuation in the resistance value shown in FIG. 11 corresponds to a fluctuation in the resistance value of the variable resistance element A shown in FIG. 7. Issues concerning the generating of random number data from a fluctuation in the resistance value of a variable resistance element will be described below with reference to FIG. 11.

One of the simplest methods for generating random numbers from a physical random variation is as follows. First, randomly changing values are obtained. Then, these values are compared with a predetermined threshold. Then, "0" or "1" is assigned to these values in accordance with the comparison results. As a result, a binary random number is generated. However, as shown in FIG. 11, if resistance value is considerably different according to the number of read times, a suitable random number may not be generated. For example, if "0" or "1" is assigned to the resistance values on the basis of one threshold, a region including only "0"s or a region including only "1"s may be generated. In contrast, a method for resetting a threshold (indicated by the broken lines in FIG. 11) that makes the number of "0"s and the number of "1"s be substantially the same for every group of a given number of read times may be considered.

Even with this method, however, if the resistance value considerably changes, such as that of the variable resistance element B in FIG. 7, the nonuniformity of the number of "0"s or the number of "1"s is generated before and after such a considerable variation in the resistance value. Table 2 indicates the evaluation results of random number data generated by this method on the basis of the above-described test suite.

TABLE 2

| Test Type | P-value | Pass or fail |
|---|---|---|
| 1. Frequency Test | 0.8390 | pass |
| 2. Frequency Test within a Block | 0.0000 | fail |
| 3. Runs Test | 0.0000 | fail |
| 4. Test for Longest Run of Ones in a Block | 0.0001 | fail |
| 5. Binary Matrix Rank Test | 0.7049 | pass |
| 6. Discrete Fourier Transform Test | 0.7076 | pass |
| 7. Serial Test (p-value 1, p-value 2) | 0.0007, 0.5486 | fail |
| 8. Approximate Entropy Test | 0.0001 | fail |
| 9. Cumulative Sums (Cusums) Test (forward, reverse) | 0.0433, 0.0726 | pass |

Table 2 shows that the evaluation results of the random numbers are "fail" in many tests. This shows that even if a threshold is set for every group of a given number of read times, it may not be possible to generate high-quality random numbers that can be used for cryptographic applications. In view of these results, the present inventors have studied a method for generating high-quality random number data from a fluctuation in the resistance value of a variable resistance element. Embodiments described below are examples of such a method.

First Embodiment

A random number generating method of a first embodiment includes a step of generating first digital data, which is fixed-length data having a length of m, by using a plurality of items of resistance value information, a step of generating a plurality of items of new digital data by inverting at least one of bits of the first digital data with different combinations, a step of selecting one item of data having a least frequency of appearance from among the first digital data and the plurality of items of new digital data and setting the selected item of data to be second digital data, a step of generating random number data by using the second digital data, and a step of adding 1 to the frequency of appearance of the second digital data.

(Memory Cell Array and Read Circuit)

Before describing an algorithm and a circuit system for generating random number data according to the first embodiment, a specific example of a memory cell array and a read circuit for reading resistance value information will be described first.

Figure 12:
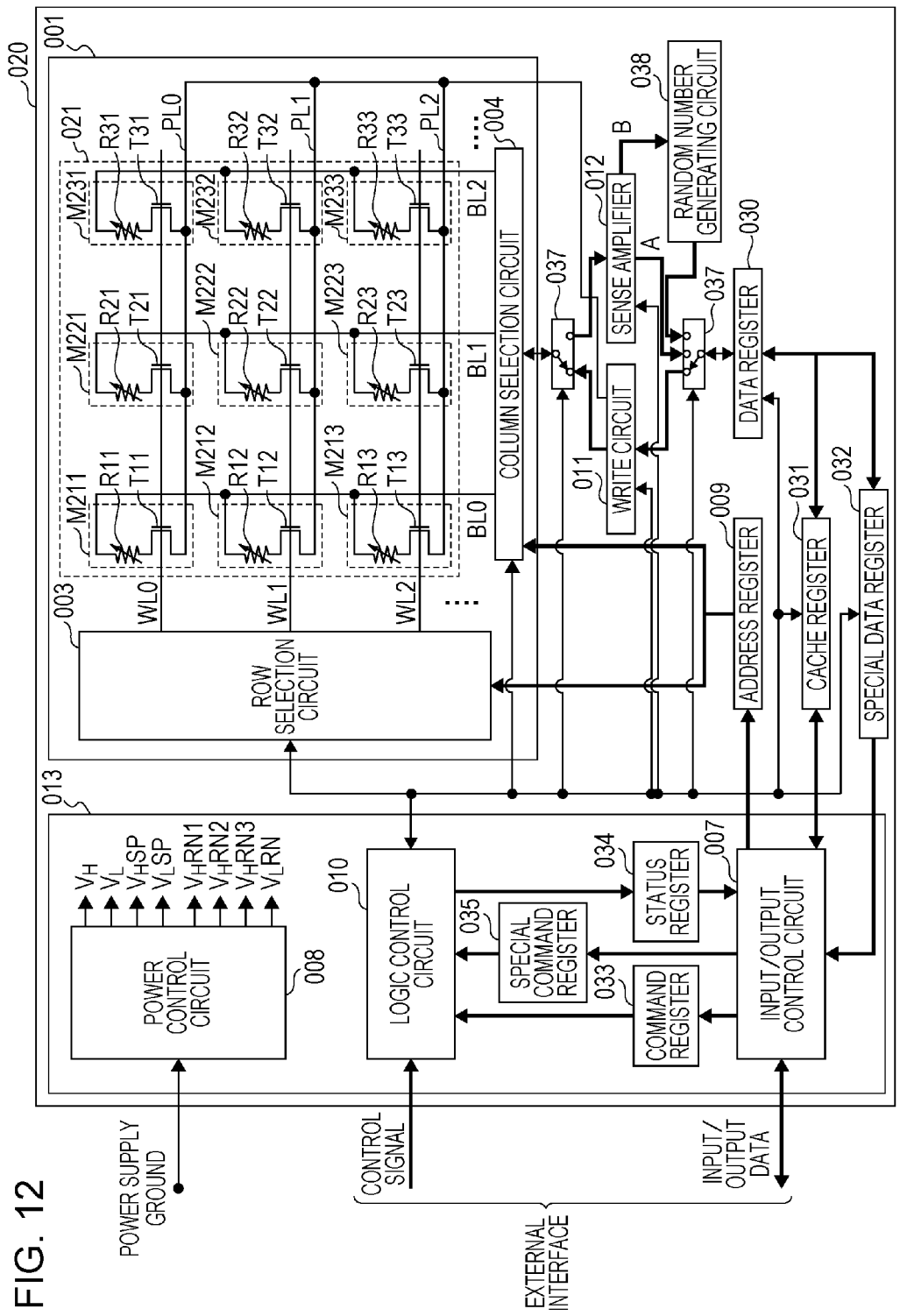
FIG. 12 is a block diagram illustrating an example of the schematic configuration of a random number processing apparatus according to a first embodiment.

FIG. 12 is a block diagram illustrating an example of the schematic configuration of a random number processing apparatus 020 according to the first embodiment. The configuration shown in FIG. 12 is only an example, and the configuration of the random number processing apparatus of an embodiment of the present disclosure is not restricted thereto.

As shown in FIG. 12, the random number processing apparatus 020 includes a memory 001 on a semiconductor substrate. The memory 001 includes a memory cell array 021, a row selection circuit 003, and a column selection circuit 004.

The memory cell array 021 includes a plurality of first lines WL0, WL1, WL2 . . . , a plurality of second lines BL0, BL1, BL2 . . . , and memory cells M211, M212, M213, M221, M222, M223, M231, M232, M233 . . . . The plurality of first lines WL0, WL1, WL2 . . . extend in a first direction in parallel with each other in a first plane on the semiconductor substrate. The plurality of second lines BL0, BL1, BL2 . . . extend in a second direction in parallel with each other in a second plane which is parallel with the first plane, and intersect with the first lines WL0, WL1, WL2 . . . . The memory cells M211, M212, M213, M221, M222, M223, M231, M232, M233 . . . are disposed at the intersecting points of the corresponding first lines and the corresponding second lines. For the sake of simple description, hereinafter, the first lines will be referred to as "word lines", and the second lines will be referred to as "bit lines". The memory cells M211, M212, M213, M221, M222, M223, M231, M232, M233 . . . may be simply called the memory cells M211, M212 . . . .

The memory cells M211, M212 . . . respectively include variable resistance elements R11, R12, R13, R21, R22, R23, R31, R32, R33 . . . . The variable resistance elements R11, R12, R13, R21, R22, R23, R31, R32, R33 . . . may be simply called the variable resistance elements R11, R12 .... Each of the variable resistance elements R11, R12 ... has, for example, the configuration shown in FIG. 2. The memory cells M211, M212 ... respectively include transistors T11, T12, T13, T21, T22, T23, T31, T32, T33 .... The transistors T11, T12, T13, T21, T22, T23, T31, T32, T33 ... may be simply called the transistors T11, T12 .... The word lines WL0, WL1, WL2 ... are respectively connected to control terminals (for example, gates) of the transistors T11, T12 .... The bit lines BL0, BL1, BL2 ... are each connected to one terminal of the corresponding one of the variable resistance elements R11, R12 .... The other terminals of the variable resistance elements R11, R12 ... are respectively connected to first main terminals of the transistors T11, T12 ....

The variable resistance elements R11, R12 ... respectively operate as non-volatile storage elements in the memory cells M211, M212 .... Each memory cell shown in FIG. 12 is constituted by one transistor and one variable resistance element. In other words, the random number processing apparatus 020 shown in FIG. 12 includes so-called 1T1R storage devices.

The memory cell array 021 includes a plurality of plate lines PL0, PL1, PL2 ... respectively arranged in parallel with the word lines WL0, WL1, WL2 .... The plate lines PL0, PL1, PL2 ... are respectively connected to second main terminals of the transistors T11, T12 .... In the transistors T11, T12 ..., which of the first and second main terminals will serve as the source or the drain is not particularly restricted, but is suitably determined in accordance with a specific factor, for example, by the direction of a current flowing through a transistor or the polarity of the electric charge of the majority carriers.

The configuration of the variable resistance elements R11, R12 ... may be similar to that of the above-described variable resistance elements. Thus, a detailed explanation of the variable resistance elements R11, R12 ... will be omitted.

In the example shown in FIG. 12, the transistors T11, T12, T13 ... are n-channel MOS transistors and serve as selection transistors. The first main terminals of the transistors T11, T12, T13 ... are connected to the bit line BL0 via the variable resistance elements R11, R12, R13 ..., respectively. The first main terminals of the transistors T21, T22, T23 ... are connected to the bit line BL1 via the variable resistance elements R21, R22, R23 ..., respectively. The first main terminals of the transistors T31, T32, T33 ... are connected to the bit line BL2 via the variable resistance elements R31, R32, R33 ..., respectively.

The gates of the transistors T11, T21, T31 ... are connected to the word line WL0. The gates of the transistors T12, T22, T32 ... are connected to the word line WL1. The gates of the transistors T13, T23, T33 ... are connected to the word line WL2.

The second main terminals of the transistors T11, T21, T31 ... are connected to the plate line PL0. The second main terminals of the transistors T12, T22, T32 ... are connected to the plate line PL1. The second main terminals of the transistors T13, T23, T33 ... are connected to the plate line PL2.

In FIG. 12, the plate lines PL1, PL2, PL3 ... are connected to each other between the rows. However, the plate lines PL1, PL2, PL3 ... may be separated into a plurality of blocks.

The random number processing apparatus 020 also includes a controller. The controller includes a write circuit 011, a sense amplifier 012, a random number generating circuit 038, a switching circuit 037, a power control circuit 008, a logic control circuit 010, a command register 033, a status register 034, a special command register 035, an input/output control circuit 007, an address register 009, a cache register 031, a special data register 032, and a data register 030.

The write circuit 011 writes information into one or more memory cells selected by the row selection circuit 003 and the column selection circuit 004. The row selection circuit 003 includes, for example, a gate driver. The write circuit 011 may selectively execute a normal write mode, a special write mode, and a fluctuation write mode. The write circuit 011 may include circuits that execute the individual modes.

The sense amplifier 012 detects the resistance value of a selected memory cell and outputs resistance value information indicating the detected resistance value, and/or performs determination processing by using two or more values (for example, "1" and "0"). The sense amplifier 012 may selectively execute a normal read mode, a special read mode, and a fluctuation read mode. The sense amplifier 012 may include circuits that execute the individual modes.

The random number generating circuit 038 generates random number data on the basis of the resistance value information output from the sense amplifier 012.

The switching circuit 037 switches the connection of the write circuit 011, the sense amplifier 012, and the random number generating circuit 038 in accordance with which one of a write operation, a read operation, a random number generating operation will be performed. If the write operation is performed, the switching circuit 037 connects a memory cell selected by the column selection circuit 004 to the write circuit 011. Then, the value output from the data register 030 is output to the write circuit 011. If the read operation is performed, the switching circuit 037 connects a memory cell selected by the column selection circuit 004 to the sense amplifier 012. Then, data output from the sense amplifier 012 is output to the data register 030. If the random number generating operation is performed, the switching circuit 037 outputs random number data output from the random number generating circuit 038 to the data register 030.

The power control circuit 008 generates a plurality of supply voltages for writing data into memory cells.

The logic control circuit 010 operates the input/output control circuit 007 in accordance with a control signal input from the outside of the random number processing apparatus 020. The logic control circuit 010 also controls the operation of the random number processing apparatus 020 on the basis of a control command stored in the special command register 035 or the command register 033.

The input/output control circuit 007 obtains input data via an input/output data bus in accordance with an instruction from the logic control circuit 010. The input/output control circuit 007 extracts a control command and address information from the input data. The input/output control circuit 007 stores the control command in the special command register 035 or the command register 033 and the address information in the address register 009. The input/output control circuit 007 may output data stored in the status register 034 or the cache register 031 to the outside of the random number processing apparatus 020 in the normal read mode or the special read mode.

The logic control circuit 010 determines the timing at which a command is input on the basis of a control signal input from the outside of the random number processing apparatus 020. The input/output control circuit 007 obtains input data on the basis of this timing. The input data also indicates a command pattern. The input/output control circuit 007 extracts the control command and address information from the command pattern. Examples of the control command are a normal write command, a special write command, a fluctuation write command, a normal read command, a special read command, and a fluctuation read command. The fluctuation write command is, for example, a command that causes a variable resistance element to shift to an intermediate resistance state between the high resistance state and the low resistance state. The normal write command, the special write command, and the fluctuation write command are different command patterns. The normal read command, the special read command, and the fluctuation read command are different command patterns. The special write command, the fluctuation write command, the special read command, and the fluctuation read command may be commands which may not be disclosed to general users.

The command register 033 temporarily stores a control command. The command register 033 stores, for example, the normal write command or the normal read command. The mode is selected in accordance with the command stored in the command register 033. The control command is generated on the basis of a control signal, which is input from the outside of the random number processing apparatus 020 into the logic control circuit 010, and input data, which is input from the outside of the random number processing apparatus 020 into the input/output control circuit 007.

The status register 034 temporarily stores status information indicating the internal status of the memory 001 to be disclosed to the outside of the random number processing apparatus 020.

The special command register 035 temporarily stores, for example, the special write command, the fluctuation write command, the special read command, or the fluctuation read command. The mode is selected in accordance with the command stored in the special command register 035. Each of these control commands is generated on the basis of a control signal, which is input from the outside of the random number processing apparatus 020 into the logic control circuit 010, and input data, which is input from the outside of the random number processing apparatus 020 into the input/output control circuit 007.

The address register 009 stores an address signal. The address signal is a signal indicating the address of a memory cell to be selected among the plurality of memory cells M211, M212 . . . . The address register 009 outputs a row address signal to the row selection circuit 003 and a column address signal to the column selection circuit 004 on the basis of the address signal.

The row address signal is a signal indicating the address of the row of a memory cell to be selected. The column address signal is a signal indicating the address of the column of a memory cell to be selected. In the example shown in FIG. 12, one of the bit lines corresponding to the column address is selected by the column selection circuit 004, and one of the word lines corresponding to the row address is selected by the row selection circuit 003. An example in which a single memory cell is selected from among the plurality of memory cells within the memory cell array 021 will be described below. However, the selection of an address is not restricted to this example. For example, when the word line WL0 is selected, bit lines BL0 and BL1 may be selected at the same time. In this case, two memory cells M211 and M221 are selected at the same time. The write circuit 011 may write data into a plurality of memory cells at the same time. The sense amplifier 012 may read data from a plurality of memory cells at the same time.

The cache register 031 temporarily stores, for example, data to be written into memory cells, in accordance with an instruction from the input/output control circuit 007. The data is stored, for example, when the normal write mode, the special write mode, or the fluctuation write mode is selected. If the data is fixed in the special write mode, it may be stored in a read only memory (ROM).

The special data register 032 temporarily stores data read by the sense amplifier 012, for example, in the special read mode or the fluctuation read mode. For example, if a read operation is repeatedly performed multiple times, data read in each reading cycle is sequentially supplied from the sense amplifier 012 to the special data register 032 via the data register 030.

The random number generating circuit 038 generates random number data on the basis of resistance value information read in the fluctuation read mode.

The data register 030 obtains data from the cache register 031 and temporarily stores the data, for example, in the normal write mode, the special write mode, or the fluctuation write mode. Obtaining and storing of data may be sequentially performed in each write cycle.

In FIG. 12, a set of circuits including the power control circuit 008, the logic control circuit 010, the input/output control circuit 007, the command register 033, the status register 034, and the special command register 035 is referred to as a "control circuit set" 013. The control circuit set 013 may be formed together with the memory 001 on the same chip. With this configuration, it is possible to reduce the possibility that a leakage of information sent and received between the control circuit set 013 and the memory 001 occur.

The logic control circuit 010 connects the switching circuit 037 to the write circuit 011 in the normal write mode, the special write mode, or the fluctuation write mode. The cache register 031 stores data to be written into memory cells. The input/output control circuit 007 extracts the data from the cache register 031 and sends it to the data register 030 in accordance with an instruction from the logic control circuit 010. In response to an instruction from the logic control circuit 010, the write circuit 011 writes the data stored in the data register 030 into selected memory cells under predetermined conditions. These operations are sequentially performed in each write cycle.

The logic control circuit 010 connects the switching circuit 037 to the sense amplifier 012 and/or the random number generating circuit 038 in the normal read mode, the special read mode, or the fluctuation read mode. In accordance with an instruction from the logic control circuit 010, the sense amplifier 012 reads resistance value information from a selected memory cell under predetermined conditions in each read cycle. In the normal read mode or the special read mode, the sense amplifier 012 generates digital data by performing determination processing for the resistance value information under predetermined conditions, and then sends the digital data to the data register 030. In the fluctuation read mode, the sense amplifier 012 sends the resistance value information to the random number generating circuit 038. In this case, the random number generating circuit 038 generates random number data on the basis of the resistance value information and sends the random number data to the data register 030. The data register 030 temporarily stores the digital data obtained from the sense amplifier 012 or the random number data obtained from the random number generating circuit 038. The cache register 031 obtains the data from the data register 030 and stores it in accordance with an instruction from the logic control circuit 010. These operations are sequentially performed in each read cycle. The input/output control circuit 007 outputs the data stored in the cache register 031 to the outside of the random number processing apparatus 020 in accordance with an instruction from the logic control circuit 010.

Upon obtaining a normal write command, the input/output control circuit 007 stores it in the command register 033. Upon obtaining a write address, the input/output control circuit 007 stores it in the address register 009. The write circuit 011 is driven in accordance with an instruction from the logic control circuit 010. The write circuit 011 applies an electric signal to each memory cell on the basis of the settings of the individual registers, thereby writing predetermined data into the memory cell array 021.

Upon obtaining a normal read command, the input/output control circuit 007 stores it in the command register 033. Upon obtaining a read address, the input/output control circuit 007 stores it in the address register 009. The sense amplifier 012 is driven in accordance with an instruction from the logic control circuit 010. The sense amplifier 012 reads predetermined data from the memory cell array 021 on the basis of the settings of the individual registers. The data is stored in the cache register 031 via the data register 030. Every time a certain amount of data is stored in the cache register 031, the input/output control circuit 007 obtains the data and outputs it to the outside of the random number processing apparatus 020. The provision of the cache register 031 may be omitted.

Upon receiving a command to check the internal status of the random number processing apparatus 020, the logic control circuit 010 checks the internal status and stores a code indicating the internal status (status code) in the status register 034. Then, the input/output control circuit 007 outputs the status code stored in the status register 034 to the outside of the random number processing apparatus 020.

The special write command, the fluctuation write command, the special read command, and the fluctuation read command may be commands to access specific address regions that are not possible to access by the normal commands. These commands may be commands to set write conditions or read conditions that are not possible to set by the normal commands.

Upon obtaining a special write command, the input/output control circuit 007 stores it in the special command register 035. Upon obtaining a write address, the input/output control circuit 007 stores it in the address register 009. The write address may be an address that is not possible to access in the normal write mode. The write circuit 011 is driven in accordance with an instruction from the logic control circuit 010. The write circuit 011 applies a forming stress to each memory cell on the basis of the settings of the individual registers, thereby writing predetermined data into the memory cell array 021.

Upon obtaining a special read command, the input/output control circuit 007 stores it in the special command register 035. Upon obtaining a read address, the input/output control circuit 007 stores it in the address register 009. The read address may be an address that is not possible to access in the normal read mode. The sense amplifier 012 is driven in accordance with an instruction from the logic control circuit 010. The sense amplifier 012 reads predetermine data from the memory cell array 021 on the basis of the settings of the individual registers. The data is stored in the cache register 031 via the data register 030. Every time a certain amount of data is stored in the cache register 031, the input/output control circuit 007 obtains the data and outputs it to the outside of the random number processing apparatus 020.

Upon obtaining a fluctuation write command, the input/output control circuit 007 stores it in the special command register 035. Upon obtaining a write address, the input/output control circuit 007 stores it in the address register 009. The write address may be an address that is not possible to access in the normal write mode. The write circuit 011 is driven in accordance with an instruction from the logic control circuit 010. The write circuit 011 applies an electrical stress to each memory cell on the basis of the settings of the individual registers, thereby setting each memory cell to, for example, an intermediate resistance state between the high resistance state and the low resistance state. Alternatively, for stably generating random numbers under high temperature environments, the memory cells may be set to be the low resistance state. The fluctuation write mode and the normal write mode may be executed under the same write conditions. In this case, the provision of the special command register 035 is omitted, and the command register 033 serves the function of the special command register 035.

Upon obtaining a fluctuation read command, the input/output control circuit 007 stores it in the special command register 035. Upon obtaining a read address, the input/output control circuit 007 stores it in the address register 009. The read address may be an address that is not possible to access in the normal read mode. The sense amplifier 012 is driven in accordance with an instruction from the logic control circuit 010. The sense amplifier 012 repeatedly reads resistance value information from the memory cell array 021 on the basis of the settings of the individual registers. The random number generating circuit 038 generates random number data by using the resistance value information. The random number data is stored in the cache register 031 via the data register 030. Every time a certain amount of data is stored in the cache register 031, the input/output control circuit 007 obtains the data and outputs it to the outside of the random number processing apparatus 020. The memory cell from which the resistance value information is read by using the fluctuation read command is a memory cell into which data is written by using the fluctuation write command.

Figure 13:
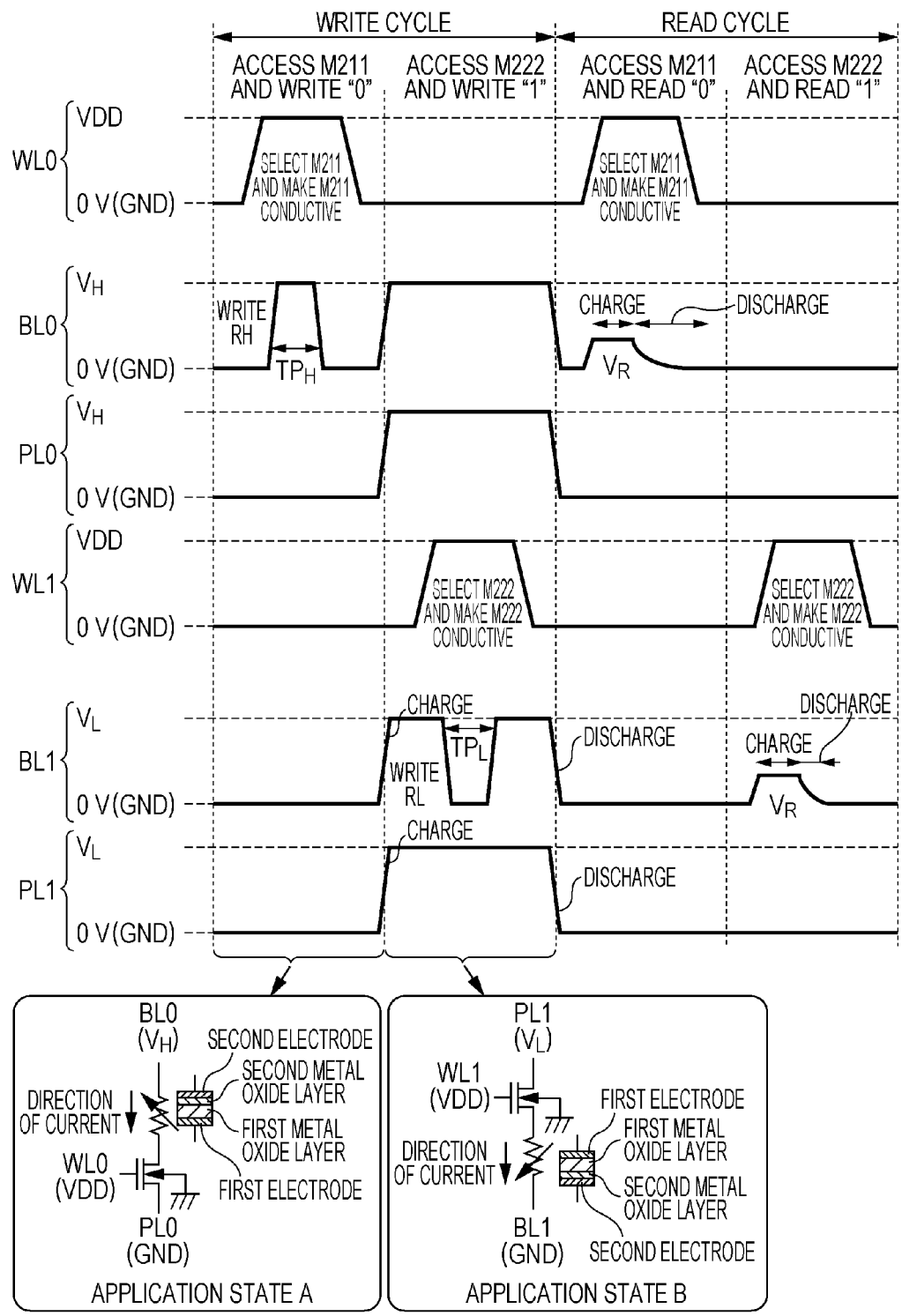
FIG. 13 is a timing chart illustrating an example of a write cycle and an example of a read cycle in the random number processing apparatus according to the first embodiment.

FIG. 13 is a timing chart illustrating an example of a write cycle and an example of a read cycle in the random number processing apparatus 020 according to the first embodiment. A description will now be given, with reference to FIG. 13, of an example of signal control for one memory cell in a normal write mode and a normal read mode.

An example of a bipolar variable resistance element that requires more complicated control for signal lines will be described below. Based on this example, it may be easy to design signal control for writing and reading of data into and from a unipolar variable resistance element. The control method of an embodiment of the present disclosure is not restricted to the following example.

In this example, it is assumed that "0" is assigned to a memory cell in which the variable resistance element is in the high resistance state and that "1" is assigned to a memory cell in which the variable resistance element is in the low resistance state. The variable resistance value range corresponding to the high resistance state may be referred to as a "first resistance value range". The variable resistance value range corresponding to the low resistance state may be referred to as a "second resistance value range". For the sake of description, writing and reading of data into and from the memory cells M211 and M222 will be described below.

In FIG. 13, a high resistance voltage, which changes the resistance value of a variable resistance element to the first resistance value range, is applied across a memory cell. The high resistance voltage is a pulse voltage having a voltage $V_H$. A low resistance voltage, which changes the resistance value of a variable resistance element to the second resistance value range, is applied across a memory cell. The low resistance voltage is a pulse voltage having a voltage $V_L$. The high resistance voltage and the low resistance voltage are generated in the power control circuit 008. Power is supplied to the power control circuit 008 from an external input power supply. In FIG. 13, $V_H$ and $V_L$ are both positive values. Writing and reading of data into and from the memory cells M211 and M222 will be described below, assuming that $V_H=V_L$.

When a read operation is performed, a read voltage is applied across a memory cell. The absolute value of the read voltage $V_R$ is smaller than the absolute values of $V_H$ and $V_L$. The write circuit 011 supplies one of the voltages $V_H$, $V_L$, and GND to a plate line in accordance with the applying direction of the voltage. In accordance with the mode, the voltage $V_H$, $V_L$, or $V_R$ is charged to each bit line and each plate line, or each bit line and each plate line are discharged to GND.

In a write cycle for the memory cell M211, the write circuit 011 first sets the voltage of the bit line BL0 and the plate line PL0 to a GND level. Then, the row selection circuit 003 applies a voltage VDD to the word line WL0 so as to cause the transistor T11 of the memory cell M211 to be in a conductive state. In this state, an electric pulse having a voltage $V_H$ and a pulse width $TP_H$ is applied to the bit line BL0. This electric pulse is a high resistance pulse for writing "0" into the memory cell M211. As a result, the variable resistance element of the memory cell M211 shifts to the high resistance state. In other words, "0" is written into the memory cell M211. A schematic diagram of the bottom left portion of FIG. 13 shows an application state A in which the memory cell M211 shifts to the high resistance state. In the application state A, a current flows from the second electrode 128 to the first electrode 124.

In a write cycle for the memory cell M222, the write circuit 011 first sets the voltage of all the word lines to 0 V, and sets the voltage of all the bit lines and all the plate lines to $V_L=V_H$. Then, the row selection circuit 003 applies a voltage VDD to the word line WL1 so as to cause the transistor T22 of the memory cell M222 to be in a conductive state. In this state, an electric pulse having a pulse width $TP_L$ and a voltage which changes as in $V_L \to 0V \to V_L$ is applied to the bit line BL1. This electric pulse is a low resistance pulse for writing "1" into the memory cell M222. As a result, the variable resistance element of the memory cell M222 shifts to the low resistance state. In other words, "1" is written into the memory cell M222. Then, the row selection circuit 003 changes the voltage VDD applied to the word line WL1 to 0 V so as to cause the transistor T22 to be in a non-conductive state. At the end of the write cycle, the write circuit 011 changes the voltage $V_L=V_H$ applied to all the bit lines and all the plate lines to 0 V. A schematic diagram of the bottom right portion of FIG. 13 shows an application state B in which the memory cell M222 shifts to the low resistance state. In the application state B, a current flows from the first electrode 124 to the second electrode 128.

In a read cycle for the memory cell M211, the row selection circuit 003 applies the voltage VDD to the word line WL0 so as to cause the transistor T11 of the memory cell M211 to be in a conductive state. The column selection circuit 004 connects the memory cell M211 and the sense amplifier 012. In this state, the read voltage $V_R$, the absolute value of which is smaller than the absolute values of the high resistance pulse and the low resistance pulse, is applied to the bit line BL0. The read voltage does not change the resistance state of a memory cell. The read voltage is output, for example, from a driver 131 (see FIG. 14) within the sense amplifier 021 for a predetermined period. Then, the bit line BL0 is discharged so as to attenuate the voltage $V_R$ of the bit line BL0 in a predetermined time. The time necessary to discharge the bit line BL0 is determined by, for example, the resistance value of a memory cell and the load capacitance. The load capacitance is determined by, for example, the total capacitance of the wiring capacitance and the diffusion capacitance of a transistor. If the resistance value of the memory cell M211 is set within the first resistance value range, a relatively long time is required to discharge the bit line BL0. If the discharge time is found to be greater than a predetermined threshold, the sense amplifier 012 outputs "0" which indicates the high resistance state. The "0" is output to the outside of the random number processing apparatus 020 from the input/output control circuit 007.

In a read cycle for the memory cell M222, the row selection circuit 003 applies the voltage VDD to the word line WL1 so as to cause the transistor T22 of the memory cell M222 to be in a conductive state. The column selection circuit 004 connects the memory cell M222 and the sense amplifier 012. In this state, the read voltage $V_R$ is applied to the bit line BL1. Then, the bit line BL1 is discharged so as to attenuate the voltage $V_R$ of the bit line BL1 in a predetermined time. If the resistance value of the memory cell M222 is set within the second resistance value range, a relatively short time is required to discharge the bit line BL1. If the discharge time is found to be smaller than a predetermined threshold, the sense amplifier 012 outputs "1" which indicates the low resistance state. The "1" is output to the outside of the random number processing apparatus 020 from the input/output control circuit 007.

In the read cycle, the write circuit 011 supplies 0 V to bits lines which are not selected and all the plate lines.

In the case of the special write mode or the fluctuation write mode, for example, at least one of the voltage, pulse width, and cumulative application time of an electric signal output from the write circuit 011 is different from those of the normal write mode.

The special write mode may be explained in relation to the normal write mode by replacing the high resistance pulse by a first electrical stress and the low resistance pulse by a second electrical stress. For example, the voltage $V_H$ of the high resistance pulse is replaced by a voltage $V_HSP$ of the first electrical stress, and the voltage $V_L$ of the low resistance pulse is replaced by a voltage $V_LSP$ of the second electrical stress. The pulse width $TP_H$ of the high resistance pulse is replaced by a pulse width $TP_HSP$ of the first electrical stress, and the pulse width $TP_L$ of the low resistance pulse is replaced by a pulse width $TP_LSP$ of the second electrical stress. The second electrical stress is one example of a forming stress. When assigning the value (for example, "0") to a memory cell in the initial state to which an electrical stress is not applied, the first electrical stress may not be applied. In other words, the voltage $VH_SP$ and the pulse width $TP_HSP$ of the first electrical stress may be 0 V and 0 nsec, respectively. Each of the first electrical stress and the second electrical stress may have a single voltage pulse width or may include a plurality of voltage pulses.

At least one of $V_HSP$, $TP_HSP$, $V_LSP$, and $TP_LSP$ in the special write mode is different from the corresponding one of $V_H$, $TP_H$, $V_L$, and $TP_L$ in the normal write mode.

The fluctuation write mode may be explained in relation to the normal write mode by replacing the high resistance pulse by a first fluctuation write pulse and the low resistance pulse by a second fluctuation write pulse. For example, the voltage $V_H$ of the high resistance pulse is replaced by a voltage $V_HRN$ of the first fluctuation write pulse. The voltage $V_HRN$ of the first fluctuation write pulse has a value in a range of, for example, $V_HRN1$ to $V_HRN3$. The voltage $V_L$ of the low resistance pulse is replaced by a voltage $V_LRN$ of the second fluctuation write pulse. In this case, $V_HRN1$, $V_HRN2$, and $V_HRN3$ satisfy the relationship expressed by $V_HRN1<V_HRN2<V_HRN3$. The pulse width $TP_H$ of the high resistance pulse is replaced by a pulse width $TP_HRN$ of the first fluctuation write pulse, and the pulse width $TP_L$ of the low resistance pulse is replaced by a pulse width $TP_LRN$ of the second fluctuation write pulse. The first and second fluctuation write pulses may not be voltage pulses for writing "0" or "1". The first and second fluctuation write pulses are voltage pulses for setting the resistance value of a memory cell to be within a resistance value range suitable for generating random numbers.

If the sense amplifier 012 includes a counter 134 (see FIG. 14) for obtaining resistance value information, the number that can be counted by the counter 134 is limited. Accordingly, in the fluctuation write mode, the count value corresponding to the resistance value of a memory cell is set to be equal to or lower than the upper limit value of the counter 134. The resistance value of a memory cell may also be set to be equal to or higher than a predetermined lower limit value. This makes it possible to obtain high-quality random number data. The reason for this is that a variable resistance element having a greater absolute resistance value exhibits a greater variation in the resistance value than a variable resistance element having a smaller absolute resistance value (for example, see FIG. 7). If the resistance value of a memory cell increases as the applied voltage increases, as shown in FIG. 6, the first fluctuation write pulse may be constituted by a plurality of electric pulses in which the voltage progressively increases. For example, the write circuit 011 may gradually increase the voltages of the electric pulses as in $V_HRN1 \rightarrow V_HRN2 \rightarrow V_HRN3$ until the resistance value information read from a memory cell enters a predetermined range. The write circuit 011 may also interrupt the application of the electric pulses to a memory cell which has entered the predetermined range.

An example of the specific configuration and operation of the sense amplifier 012 in the fluctuation read mode, the special read mode, and the normal read mode will be described below.

Figure 14:
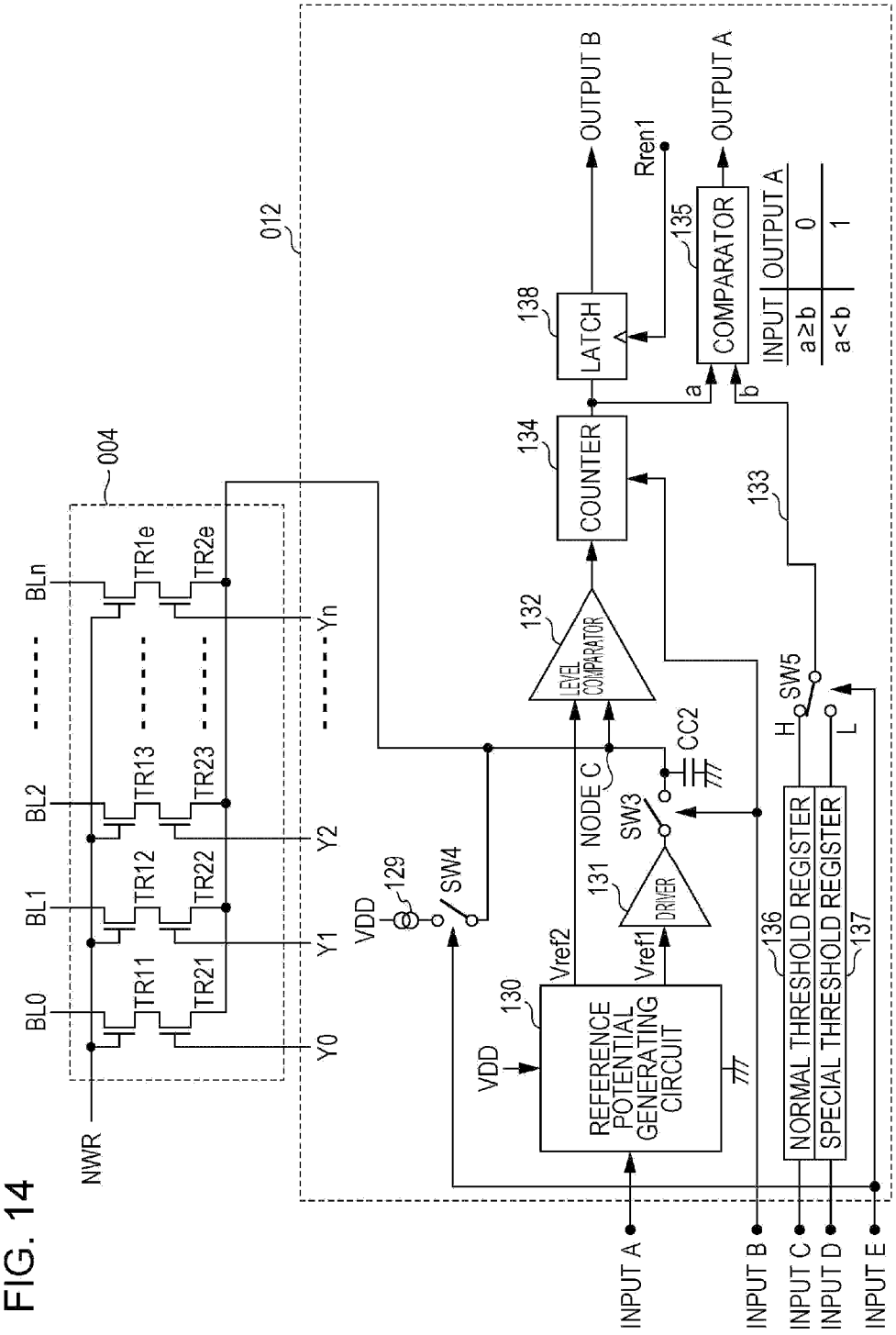
FIG. 14 is a block diagram illustrating an example of the schematic configuration of a sense amplifier of the random number processing apparatus according to the first embodiment.
Figure 15:
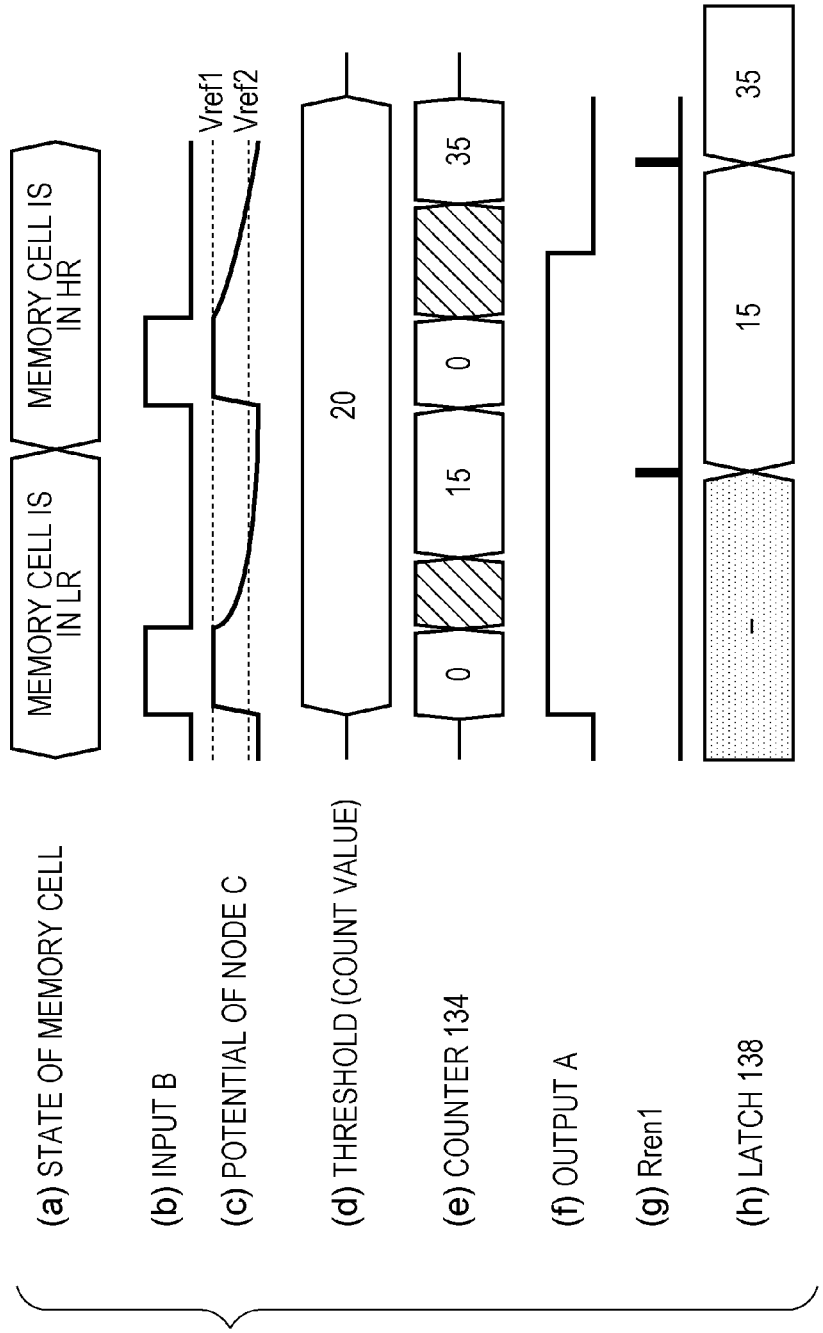
FIG. 15 is a timing chart illustrating an example of an operation of the major portion of the sense amplifier of the random number processing apparatus according to the first embodiment.

FIG. 14 is a block diagram illustrating an example of the schematic configuration of the sense amplifier 012 according to the first embodiment. FIG. 15 is a timing chart illustrating an example of the operation of the major portion of the sense amplifier 012 according to the first embodiment. The column selection circuit 004 indicated by the broken lines in the upper portion of FIG. 14 has been described above, and an explanation thereof will thus be omitted. In FIG. 14, the switching circuit 037 is not shown. The switching circuit 037 connects the column selection circuit 004 and the write circuit 011 when the potential of a line NWR shown in FIG. 14 is a low level. The switching circuit 037 connects the column selection circuit 004 and the sense amplifier 012 when the potential of the line NWR is a high level.

In FIG. 14, a reference potential generating circuit 130 outputs a predetermined reference potential on the basis of input A from the logic control circuit 010. The reference potential generating circuit 130 includes, for example, a resistor ladder and a semiconductor switch. In the reference potential generating circuit 130, a power supply voltage VDD is divided by the resistor ladder, thereby generating a plurality of predetermined potentials based on a ground potential GND. Then, the semiconductor switch of the reference potential generating circuit 130 selects at least one of the plurality of potentials, and outputs the selected potential as a reference potential. The reference potential generating circuit 130 outputs, for example, a first reference potential Vref1 and a second reference potential Vref2. The first and second reference potentials Vref1 and Vref2 satisfy the relationship expressed by Vref1>Vref2. The circuit for generating a reference potential may be formed in another configuration. The second reference potential Vref2 may be different among the special read mode, the normal read mode, and the fluctuation read mode.

A switch SW3 is turned ON or OFF in accordance with input B from the logic control circuit 010. In other words, the input B is a switch control signal. When a low level signal is input, the switch SW3 is turned OFF, and when a high level signal is input, the switch SW3 is turned ON. When the switch SW3 is turned OFF, the input state from the reference potential generating circuit 130 to a node C is changed to a high impedance (HiZ) state. When the switch SW3 is turned ON, the first reference potential Vref1 is output to the node C via the driver 131.

In practice, the input/output voltage values may slightly differ depending on voltage drop caused by, for example, the driver 131 or the transistor and wiring within other circuits. For the sake of simple description, however, a description will be given below, assuming that the influence of voltage drop is ignored.

The node C is connected to a selected memory cell within the memory cell array 021. For example, it is now assumed that the resistance value information of the memory cell M211 will be read. First, all the bit lines and word lines are set to be 0 V. In FIG. 14, the logic control circuit 010 sets the line NWR to be a high level and also sets a line Y0 to be a high level and lines Y1 through Yn to be a low level, thereby selecting the bit line BL0. The row selection circuit 003 sets the selected word line WL0 to be a high level and the other word lines which are not selected to be a low level. The first reference potential Vref1 is applied to the node C connected to the selected bit line BL0. A potential difference between the first reference potential Vref1 and the ground potential GND corresponds to a read voltage $V_R$.

A capacitor CC2 is connected between the node C and a ground. The capacitor CC2 is connected in parallel with the selected memory cell. The capacitor CC2 may be a wiring capacitance and/or a diffusion capacitance of a transistor, or may be an independent capacitor element.

For increasing the reading speed, the capacitance of the capacitor CC2 may be small. The switch control signal (input B) input into the switch SW3 is changed to a high level so as to cause the potential of the node C to be the first reference potential Vref1. Then, the switch control signal is changed to a low level so as to cause the input state from the reference potential generating circuit 130 to the node C to be the high impedance (HiZ) state. Then, the capacitor CC2 starts discharging. Due to the discharging of the capacitor CC2, the potential of the node C gradually decreases from the first reference potential Vref1. The time constant of a decrease in the potential of the node C is determined by the capacitance of the capacitor CC2 and the resistance value of the memory cell connected in parallel with the capacitor CC2.

That is, if the resistance value of the selected memory cell is smaller, the volume of a current flowing through the node C increases, and thus, a decrease in the potential of the node C becomes faster. In contrast, if the resistance value of the selected memory cell is greater, the volume of a current flowing through the node C decreases, and thus, a decrease in the potential of the node C becomes slower.

FIG. 15 is a timing chart illustrating an example of the operation of the major portion of the sense amplifier 012. As indicated by part (a) of FIG. 15, in the first part, a selected memory cell is in a low resistance state LR, and in the second part, the selected memory cell is in a high resistance state HR. The input B is changed to a high level at a timing indicated by part (b). While the input B is at the high level, the first reference potential Vref1 is applied to the node C, as indicated by part (c).

When the input B is changed from the high level to the low level, the switch circuit SW3 is turned OFF, and the input state from the reference potential generating circuit 130 to the node C is changed to a high impedance (HiZ) state. Thus, the potential of the node C gradually decreases. The time to be taken before the potential of the node C becomes smaller than the second reference potential Vref2 is short if the selected memory cell is in the low resistance state LR, and is long if the selected memory cell is in the high resistance state HR. In the first embodiment, the count value indicating the time to be taken before the potential of the node C becomes smaller than the second reference potential Vref2 is used as resistance value information.

A level comparator 132 compares the potential of the node C with the second reference potential Vref2 output from the reference potential generating circuit 130. If the potential of the node C is greater than the second reference potential Vref2, the level comparator 132 outputs a low level signal. If the potential of the node C is smaller than the second reference potential Vref2, the level comparator 132 outputs a high level signal. That is, if a selected memory cell is in the low resistance state LR, the time from when the switch control signal is switched from the high level to the low level until when the output signal of the level comparator 132 is changed from the low level to the high level is short, and if the selected memory cell is in the high resistance state HR, the above-described time is long.

The count value of the counter 134 is "0" while the input B is at the high level. When the input B is changed to the low level and when the output from the level comparator 132 is the low level, the counter 134 increments in the count value in accordance with the period of an input clock (not shown). In the counter 134, the upper limit may be set for the count value so that the count value will not overflow.

The operation of the counter 134 is shown in part (e) of FIG. 15. As indicated by part (e), the counter 134 starts incrementing in the count value immediately after the input B is changed to the low level, and stops incrementing in the count value at a timing at which the potential of the node C becomes lower than the second reference potential Vref2. When a selected memory cell is in the low resistance state LR, the count value of the counter 134 is, for example, "15" when the counter 134 has stopped counting. When a selected memory cell is in the high resistance state HR, the count value of the counter 134 is, for example, "35" when the counter 134 has stopped counting. As indicated by part (g), a signal Rren1 is made to have a high level during one clock.

At this time, the count value of the counter 134 is input into a latch 138. As indicated by part (h), the latch 138 holds the input count value.

Input C shown in FIG. 14 is, for example, a threshold corresponding to the normal read mode. The input C is set in a normal threshold register 136. Input D is, for example, a threshold corresponding to a special read mode. The input D is set in a special threshold register 137.

Input E is, for example, a switching signal for switching between the special read mode and the normal read mode. The input E switches the connection state of a switch SW5. When the switching signal is a high level, a switch SW5 is connected to a terminal H shown in FIG. 14. When the switching signal is a low level, the switch SW5 is connected to a terminal L shown in FIG. 14.

According to whether the switch SW5 is connected to the terminal H or L, the threshold held in the normal threshold register 136 or the special threshold register 137 is input into a comparator 135 as input b. The threshold corresponding to the normal read mode is a value for determining whether the count value of the counter 134 corresponds to the high resistance state HR or the low resistance state LR. In the example indicated by part (d) of FIG. 15, the threshold is "20".

The count value output from the counter 134 is input into the comparator 135 as input a. The comparator 135 compares the input count value (input a) with the input threshold (input b). If the input a is equal to or greater than the input b, the comparator 135 determines that the selected memory cell is in the high resistance state HR and outputs "0" as output A. If the input a is smaller than the input b, the comparator 135 determines that the selected memory cell is in the low resistance state LR and outputs "1" as output A.

The output A is output to the data register 030 at a timing at which the data register 030 captures data. The output A is latched in the data register 030.

As described above, the sense amplifier 012 reads resistance value information of a selected memory cell by utilizing the fact that the attenuation time of the potential of the node C is different according to the resistance value of the selected memory cell. As a result, the sense amplifier 012 outputs a binary value corresponding to the resistance state of the selected memory cell as the output A.

The sense amplifier 012 may output a count value indicating more detailed resistance value information of a selected memory cell as output B. The output B is output, for example, according to the resolution of a clock period. The output B is a value correlated with the resistance value of a memory cell. Although, in terms of a physical quantity, the output B is a numeric value indicating the discharge time of a voltage across a memory cell, it is information indicating the resistance value of the memory cell. The output B is input into the write circuit 011 and the logic control circuit 010. The output B may be used in, for example, a verify operation (see STEP6 of first and second operation examples).

The value of the input C, the count value of the counter 134, and the hold value of the latch 138 are not restricted to the values shown in FIG. 15. These values may vary depending on, for example, the count clock frequency of the counter 134, the capacitance of the capacitor CC2, the first and second reference potentials Vref1 and Vref2, a current volume of a constant current source 129, the state of a switch SW4, and a variation in the resistance value of a memory cell.

A description will now be given of an example of a method for changing a measurement range of resistance values to be read. With this method, the measurement range of resistance values to be read is switched, for example, between the normal read mode and the special read mode.

In the sense amplifier 012 shown in FIG. 14, the constant current source 129 is connected to the node C via the switch SW4. The constant current source 129 may include a p-channel MOSFET or a current mirror circuit.

The switch SW4 is ON when the input E from the logic control circuit 010 is a high level, and is OFF when the input E is a low level. When the switch SW4 is turned ON, a constant current is supplied to the node C. In this case, the discharge time from the capacitor CC2 becomes longer.

Figure 16:
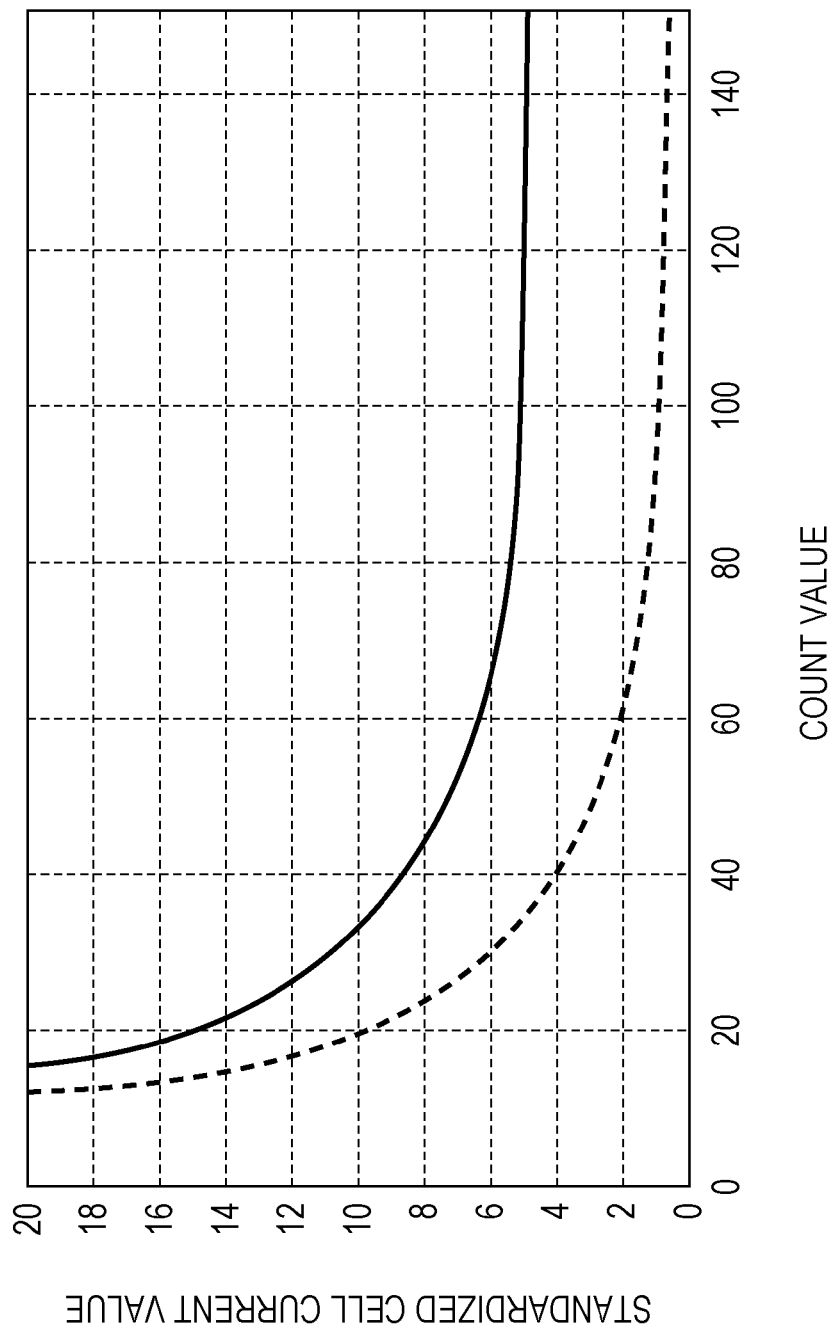
FIG. 16 is a graph illustrating a difference in the discharge time in the random number processing apparatus according to the first embodiment.

FIG. 16 illustrates a change in the value of a current flowing through the node C in the sense amplifier 012 when the switch SW4 is ON and that when the switch SW4 is OFF. In FIG. 16, the horizontal axis indicates the count value of the counter 134, and the vertical axis indicates the standardized current value of a memory cell. The standardized current value of a memory cell is a value obtained by standardizing a direct current flowing through a selected memory cell when a predetermined voltage is applied to the memory cell. The standardized current value corresponds to the reciprocal of the resistance value of a memory cell. That is, FIG. 16 illustrates a correlation between the resistance value information of a memory cell read by the sense amplifier 012 and the volume of a current flowing through the memory cell. The standardized current value of a memory cell may also be simply referred to as a "cell current value".

The count value and the cell current value substantially satisfy the relationships: cell current value=$C1 \times T^{C2}$ and T=count value×clock period (C1 and C2 are constants). In FIG. 16, the broken line indicates a temporal change in the cell current value when the switch SW4 is OFF, and the solid line indicates a temporal change in the cell current value when the switch SW4 is ON.

FIG. 16 shows that, in a case in which the switch SW4 is OFF, when the count value changes from 20 to 100, the cell current value changes from about 10 to 1. FIG. 16 also shows that, in a case in which the switch SW4 is ON, when the count value changes from 20 to 100, the cell current value changes from about 15 to 5.

That is, the measurement range of the count values can be switched by the switch SW4 shown in FIG. 14. More specifically, when the switch SW4 is ON, the measurement range of the sense amplifier 012 may be set to a range suitable for measuring resistance value information corresponding to relatively low resistance values. This enables the sense amplifier 012 to determine with high precision whether the resistance value of a selected memory cell is within the first resistance value range or the second resistance value range. This determination corresponds to the normal read mode.

On the other hand, when the switch SW4 is OFF, the measurement range of the sense amplifier 012 may be set to a range suitable for measuring resistance value information corresponding to relatively high resistance values. This enables the sense amplifier 012 to determine with high precision whether the resistance value of a selected memory cell is within the initial resistance value range or the first resistance value range. This determination corresponds to the special read mode.

The resolution of reading may be adjusted, not only by ON/OFF switching of the switch SW4, but also by the current volume of the constant current source 129, the frequency of a clock input into the counter 134, the magnitudes of the first and second reference potentials Vref1 and Vref2, and the capacitance of the capacitor CC2. For example, if the frequency of the clock increases, the resolution of reading improves.

The measurement range of resistance values to be read may be set so that relatively high resistance values are read in a short period of time. Such a setting is implemented by increasing the first and second reference potentials Vref1 and Vref2, decreasing the current of the constant current source 129, or decreasing the capacitance of the capacitor CC2. Conversely, the measurement range of resistance values to be read may be set so that relatively low resistance values are read in a short period of time. Such a setting is implemented by decreasing the first and second reference potentials Vref1 and Vref2, increasing the current of the constant current source 129, or increasing the capacitance of the capacitor CC2.

If the first reference potential Vref1 is too large, the resistance state of a memory cell selected by the first reference potential Vref1 may change. Accordingly, the first reference potential Vref1 is set to be equal to or lower than a predetermined value so that the resistance state of a memory cell will not change.

(Random Number Generating Circuit)

An example of the configuration of the random number generating circuit 038 according to the first embodiment will now be described below. The random number generating circuit 038 of the first embodiment reads one-byte data from the memory cell array 021 and selects an item of data having the least frequency of appearance from among the read one-byte data and items of bit inverted data. An item of bit inverted data is data constituted by eight bits, one of which is obtained by inverting one of the eight bits of the read one-byte data.

Figure 17:
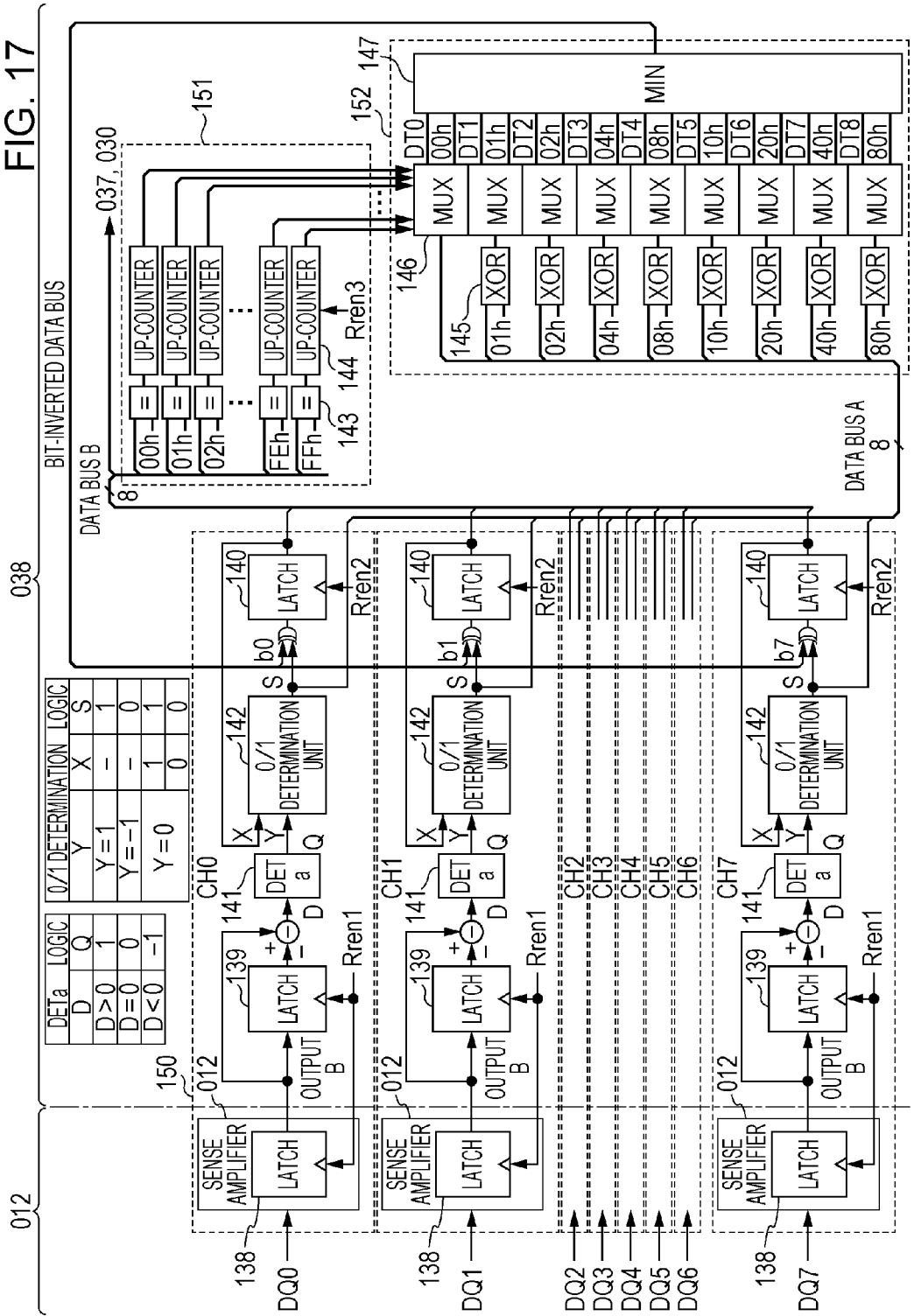
FIG. 17 is a circuit diagram illustrating an example of the schematic configuration of a random number generating circuit of the first embodiment.

FIG. 17 is a circuit diagram illustrating an example of the schematic configuration of the random number generating circuit 038 of the first embodiment. The random number generating circuit 038 will be described below with reference to FIG. 17.

The sense amplifier 012 has been described with reference to FIG. 14, and an explanation thereof will thus be omitted. The random number generating circuit 038 shown in FIG. 17 receives eight items of resistance value information from the sense amplifier 012 and executes parallel processing on the eight items of resistance value information in eight channels CH0 through CH7, thereby generating random numbers.

In the fluctuation read mode, the sense amplifier 012 obtains resistance value information from selected memory cells via the column selection circuit 004. For example, the sense amplifier 012 obtains eight items of resistance value information from eight memory cells.

The signal Rren1 is a pulse which indicates a latch timing in one clock at which the latch 138 holds resistance value information, as described above. A signal Rren2 is a pulse which indicates a latch timing which is one clock later than the signal Rren1. A signal Rren3 is a pulse which indicates a latch timing which is two clocks later than the signal Rren1.

The sense amplifier 021 and the random number generating circuit 038 include determination blocks 150 of eight channels CH0 through CH7. The determination blocks 150 are each indicated by the broken lines in the left portion of FIG. 17. The circuits of the determination blocks 150 are substantially the same. Accordingly, the determination block 150 of only one channel CH0 will be described below.

The latch 138 disposed within the sense amplifier 012 holds resistance value information at a timing indicated by the signal Rren1. The sense amplifier 012 reads resistance value information from one memory cell a plurality of times, thereby obtaining a plurality of items of resistance value information which reflect a temporal change in the resistance value of the memory cell. Every time the sense amplifier 012 reads resistance value information, the latch 138 outputs the resistance value information as output B at a latch timing instructed by the signal Rren1.

A latch 139 latches resistance value information output from the latch 138 at a timing indicated by the signal Rren1. That is, the latch 139 holds resistance value information which is an item of information previously read earlier than the resistance value information held by the latch 138. The resistance value information from the latch 138 and the resistance value information from the latch 139 are input into a subtractor at a timing indicated by the signal Rren1. The subtractor subtracts the value indicated by the resistance value information output from the latch 139 from the value indicated by the resistance value information output from the latch 138, and outputs the difference to a detector (DETa) 141. In other words, the subtractor determines the difference between the two items of temporally continuous resistance value information.

A logic table of the detector 141 is shown in FIG. 17. The logic table indicates that, if the input is greater than 0, "1" is output, if the input is smaller than 0, "−1" is output, and if the input is equal to 0, "0" is output. The output from the detector 141 is input into a 0/1 determination unit 142 as input Y.

Output from a latch 140, which will be described later, is also input into the 0/1 determination unit 142 as input X. A logic table of the 0/1 determination unit 142 is shown in FIG. 17. The logic table indicates that, if the input Y is "1", "1" is output and if the input Y is "−1", "0" is output. If the input Y is "0", the input X may be output as it is. The input X is, for example, a value which is obtained as a result of an exclusive or (XOR) circuit performing XOR on the previous output of the 0/1 determination unit 142.

The output S from the 0/1 determination unit 142 is input into the XOR circuit. Values from the least significant bit to the most significant bit output from a bit-inverted data bus are also input into the associated XOR circuits as input b0 through input b7. Each of the XOR circuits executes XOR between the output S from the 0/1 determination unit 142 and the corresponding bit value from the bit-inverted data bus, and outputs the resulting value to the latch 140.

The latch 140 latches the value input from the associated XOR circuit at a timing indicated by the signal Rren2. The output values of the eight latch circuits 140 of the eight channels CH0 through CH7 are integrated to a data bus B as eight-bit data. In this case, the output from the latch 140 of the channel CH0 is used as the least significant bit of the eight-bit data, and the output from the latch 140 of the channel CH7 is used as the most significant bit of the eight-bit data. The outputs S from the eight 0/1 determination units 142 of the eight channels CH0 through CH7 are integrated to a data bus A as eight-bit data.

A block indicated by the broken lines in the top right portion of FIG. 17 is a data pattern counter 151. Every time one-byte data is input from the data bus B, each up-counter 144 (which will be described later) of the data pattern counter 151 increments in the count value when the associated value is input.

The data from the data bus B is input into 256 equality operation units 143. The 256 equality operation units 143 determine to which one of 00h, 01h, 02h . . . FDh, FEh, and FFh (hexadecimal notation) the value of the eight bits of the input data is equal. In other words, each of the equality operation units 143 determines whether or not the value of one-byte data input from the data bus B is equal to the associated one value of the equality operation unit 143. If the value of the one-byte data is equal to the value of the equality operation unit 143, the equality operation unit 143 outputs "1", and if the two values are not equal to each other, the equality operation unit 143 outputs "0". The outputs from the 256 equality operation units 143 are input into 256 up-counters 144. When the input "1" is received, the up-counter 144 increments in the count value at the timing indicated by the signal Rren3.

A block indicated by the broken lines in the bottom right portion of FIG. 17 is a one-bit inverted data generator 152. Eight XOR circuits 145 each execute XOR between one-byte data input via the data bus A and fixed one-byte data. Items of fixed one-byte data input into the eight XOR circuits 145 are indicated by 01h, 02h, 04h, 08h, 10h, 20h, 40h, and 80h (hexadecimal notation). As a result of the XOR operation, eight different items of one-bit inverted data in which one of the eight bits (from the least significant bit to the most significant bit) is inverted.

The one-bit inverted data generator 152 includes nine selection circuits (indicated by "MUX" in FIG. 17) 146. Each selection circuit 146 includes a channel selection port and 256 input channel ports. Count values of the 256 up-counters 144 within the data pattern counter 151 are input into each selection circuit 146 via the 256 input channel ports. The eight items of one-bit inverted data are input from the eight XOR circuits 145 into eight associated selection circuits 146 out of the nine selection circuits via the associated channel selection ports. The one-byte data from the data bus A is directly input into the remaining selection circuit 146 via the channel selection port. The nine selection circuits 146 output, from channels DT0 through DT8, the count values of the up-counters 144 corresponding to the items of data which are input via the channel selection ports.

That is, the numbers of frequencies of appearance of the data pattern of the one-byte data input from the data bus A and the data patterns of the eight items of one-bit inverted data generated from the one-byte data are output from the selection circuits 146.

The one-bit inverted data generator 152 includes a bit inverting mask generating circuit (indicated by "MIN" in FIG. 17) 147. The bit inverting mask generating circuit 147 extracts the minimum count value among the count values input from the channels DT0 through DT8 and outputs a bit inverting mask signal corresponding to the minimum count value. The bit inverting mask signal indicates an instruction concerning which position of the bit of the one-byte data output from the eight determination blocks 150 will be inverted or any of the bits of the one-byte data will not be inverted. For example, when the bit inverting mask generating circuit 147 selects the channels DT0, DT1, DT2, DT3, DT4, DT5, DT6, DT7, and DT8, it outputs 00h, 01h, 02h, 04h, 08h, 10h, 20h, 40h, and 80h, respectively, as the bit inverting mask signal.

If there are a plurality of minimum count values among the count values input from the channels DT0 through DT8, the bit inverting mask generating circuit 147 may output a bit inverting mask signal corresponding to one of the minimum count values. If there are a plurality of minimum count values among the count values input from the channels DT0 through DT8 and if the count value input from the channel DT0 is one of the minimum count values, the bit inverting mask generating circuit 147 may preferentially select the channel DT0. If there are a plurality of minimum count values among the count values input from the channels DT0 through DT8, the bit inverting mask generating circuit 147 may select a channel different from the previously selected channel. Then, the channels are substantially uniformly selected. In this manner, the one-bit inverted data generator 152 determines whether or not the frequency of appearance of one-byte data input from the data bus A is smaller than that of each of the eight items of one-bit inverted data. If the frequency of appearance of any of the eight items of one-bit inverted data is smaller than that of the one-byte data input from the data bus A, the output from the 0/1 determination unit 142 is corrected.

More specifically, the result of executing XOR between the output from the 0/1 determination unit 142 and the output from the bit inverting mask generating circuit 147 is input into the latch 140. For example, if the first bit of the one-byte data generated in the channels CH0 through CH8 will be inverted, the bit inverting mask generating circuit 147 outputs "01h" as the bit inverting mask signal. Then, "1" is input from the bit-inverted data bus into the XOR circuit within the determination block 150 of the channel CH0 as the input b0. As a result, the output S from the 0/1 determination unit 142 is inverted in the XOR circuit and is latched in the latch 140. On the other hand, if the first bit of the one-byte data will not be inverted, "0" is input into the XOR circuit as the input b0, and the output S from the 0/1 determination unit 142 is latched in the latch 140 as it is.

In this manner, the data pattern counter 151 and the one-bit inverted data generator 152 form a random number evaluation circuit. The random number evaluation circuit corrects a determination result of the 0/1 determination unit 142 so that the appearance patterns of one-byte data will be substantially uniform. As a result of correcting the determination result of the 0/1 determination unit 142, data having the least frequency of appearance from among the read one-byte data and eight items of one-bit inverted data is output.

Resistance value information of each of eight memory cells was read 2000 times. These items of resistance value information were input into the random number generating circuit 038 shown in FIG. 17 and random number data was generated. This random number data is a 16-Kbit stream data. Table 3 indicates the evaluation results of random numbers generated by this method on based on the above-described test suite NIST SP800-22.

TABLE 3

| Test Type | P-value | Pass or fail |
|---|---|---|
| 1. Frequency Test | 0.6505 | pass |
| 2. Frequency Test within a Block | 0.6744 | pass |
| 3. Runs Test | 0.5433 | pass |
| 4. Test for Longest Run of Ones in a Block | 0.1483 | pass |
| 5. Binary Matrix Rank Test | 0.1636 | pass |
| 6. Discrete Fourier Transform Test | 0.0406 | pass |
| 7. Serial Test (p-value 1, p-value 2) | 0.0330, 0.0561 | pass |
| 8. Approximate Entropy Test | 0.1061 | pass |
| 9. Cumulative Sums (Cusums) Test (forward, reverse) | 0.8448, 0.4454 | pass |

Table 3 shows that the evaluation results of the random numbers are "pass" in all the tests. Thus, the random number processing apparatus 020 of the first embodiment is sufficiently capable of generating random numbers used for cryptographic applications.

The random number processing apparatus 020 of the first embodiment is capable of generating high-quality device-unique physical random numbers by utilizing a fluctuation in the resistance values of a variable resistance element.

In the related art, such as that disclosed in Japanese Unexamined Patent Application Publication No. 2008-299595, for generating physical random numbers, a fluctuation in a source-drain current is amplified by a multivibrator circuit. In such a random number generating device, it is difficult to reduce the circuit scale and to increase the generating speed of random numbers at the same time. For example, if random numbers are generated in parallel processing, a plurality of multivibrator circuits are required, which increases the circuit scale. As another example of the related art, such as that disclosed in Japanese Unexamined Patent Application Publication No. 2011-113136, if random numbers are generated in only one channel, the generating speed of random numbers is decreased. For example, if the generating speed of random numbers is 250 Kbits per second, it requires a time as long as about 8 msec, to generate a 256-byte cryptographic key.

In contrast, as in the first embodiment, if a random number processing apparatus is able to execute both of the normal write mode and the normal read mode, that is, if a random number processing apparatus also serves as a non-volatile storage device, the sense amplifier of the non-volatile storage device may also serve as the sense amplifier of the random number processing apparatus. For example, a controller large scale integrated circuit (LSI) that enables communication and storage of encrypted data typically has a built-in non-volatile storage device. The non-volatile storage device includes a sense amplifier, which is capable of amplifying a fluctuation in a resistance value. Accordingly, the random number processing apparatus can utilize the sense amplifier. In other words, the random number processing apparatus does not require a sense amplifier for performing random number processing, other than the sense amplifier for reading data from a non-volatile storage device. Additionally, a random number generating circuit is, for example, a logic circuit, which is smaller than an analog sense amplifier. With this configuration, it is possible to reduce the size of the random number processing apparatus.

Typically, the sense amplifier of a non-volatile storage device is capable of reading resistance values of a plurality of memory cells in parallel processing. In the first embodiment, plurality of items of resistance value information read from a plurality of memory cells are input into a plurality of channels of a random number generating circuit, thereby making it possible to generate multiple-bit random number data at high speed. The random number processing apparatus of the first embodiment can generate random numbers by reading resistance value information at 2 μsec at one time and by executing eight-bit parallel processing. It is thus possible to generate random number data more speedily than the related art. The characteristic of fluctuations in resistance values may be suitably adjusted according to the write conditions in the fluctuation write mode, and thus the time interval for reading the resistance value may be suitably adjusted according to it.

(Other Random Number Generating Circuits)

The random number evaluation circuit described with reference to FIG. 17 is only an example. Another system may be used as a random number evaluation circuit. For example, the random number evaluation circuit may adjust the output S from the 0/1 determination unit 142 so that the number of "1"s and the number of "0"s included in a predetermined number of items of data will be substantially the same. The random number evaluation circuit may adjust the output S from the 0/1 determination unit 142 so that the frequencies of appearance of the numbers of runs of "1"s included in a predetermined number of items of data will satisfy a predetermined distribution. Alternatively, the random number evaluation circuit shown in FIG. 17 may adjust the output S from the 0/1 determination unit 142 only when the detector 141 outputs "0". This makes it possible to generate random number data which more accurately reflects a fluctuation in the resistance value of a variable resistance element.

(First Example of Operation in Special Write Mode)

An example of the operation in the special write mode will be described below. A description will be given below, assuming that a random number processing apparatus is configured as described in the first embodiment. However, the operation in the special write mode may be performed similarly even if the random number processing apparatus is configured in a different manner.

The special write mode is executed by, for example, the row selection circuit 003, the column selection circuit 004, the address register 009, the write circuit 011, the sense amplifier 012, the control circuit set 013, the data register 030, the cache register 031, the special data register 032, and the switching circuit 037. Other modes may be executed in a similar configuration.

The variable resistance element 120 has, for example, the characteristics shown in FIG. 3. This will be described more specifically. When an electric signal of a voltage of +2.4 V and a pulse width of 50 nsec is applied to the second electrode 128 based on the first electrode 124, the resistance value of the variable resistance element 120 is shifted from the second resistance value range to the first resistance value range. When an electric signal of a voltage of −2.4 V and a pulse width of 50 nsec is applied to the second electrode 128 based on the first electrode 124, the resistance value of the variable resistance element 120 is shifted from the first resistance value range to the second resistance value range. In other words, the variable resistance element 120 has bipolar characteristics in which it reversibly shifts between the first resistance value range and the second resistance value range by the application of electric signals of ±2.4 V. In the special write mode, an electrical stress of an absolute voltage of 3 V and a pulse width of 1 μsec is applied to the variable resistance element 120 in the initial state.

If the variable resistance element 120 is not changed to the variable state by the application of the electrical stress, another electrical stress is applied again. The absolute voltage value of the electrical stress is greater than that of the previous electrical stress by, for example, 0.1 V and the pulse width is, for example, five times as long as that of the previous electrical stress. By repeating the application of electrical stresses, electrical stresses are cumulatively applied to each variable resistance element 120. Then, when the variable resistance element 120 is changed to the variable state, forming processing has been completed.

Figure 18:
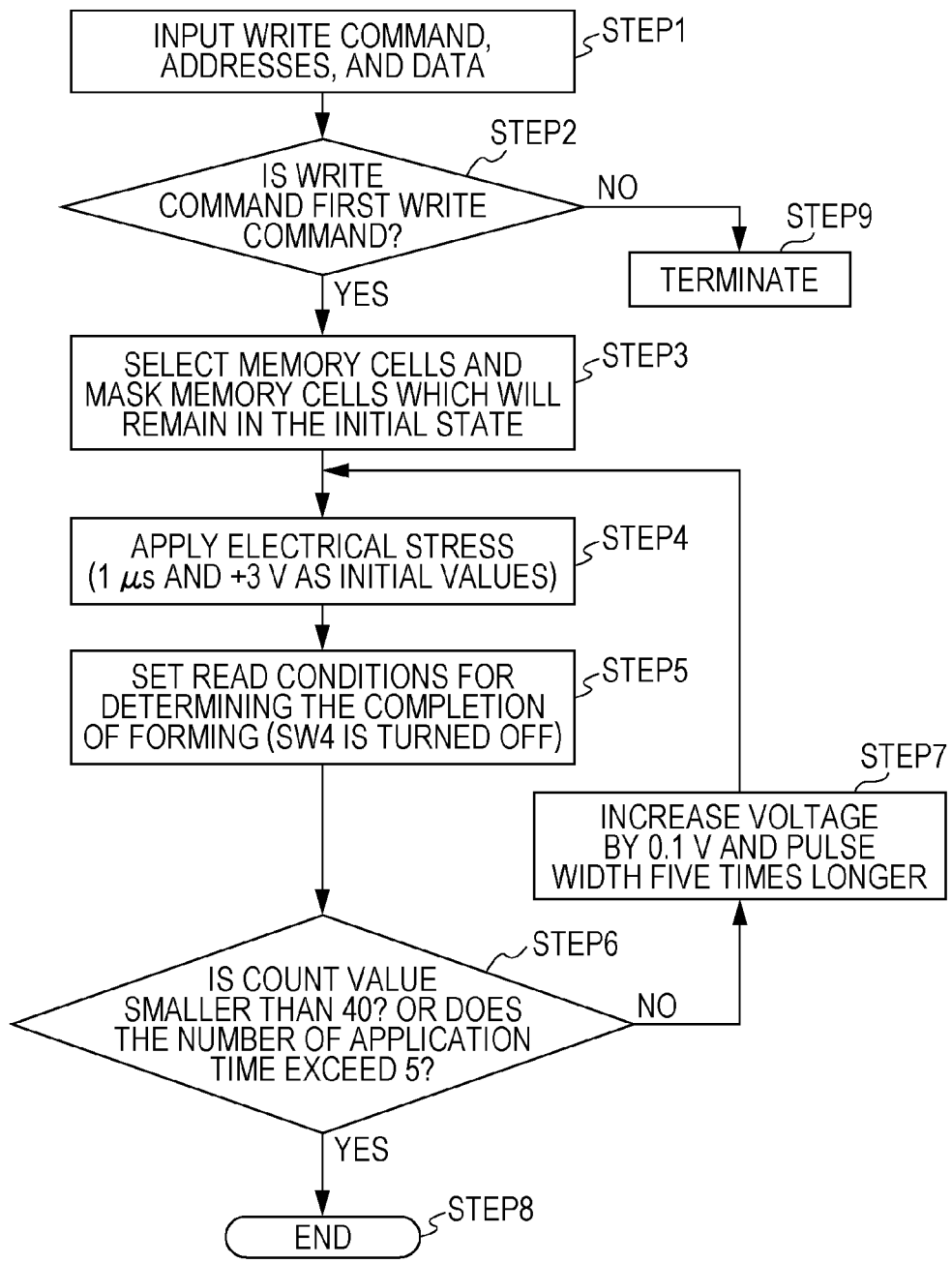
FIG. 18 is a flowchart illustrating a first example of the operation in a special write mode.

FIG. 18 is a flowchart illustrating a first example of the operation in the special write mode. In FIG. 18, a case in which input data is written into memory cells 91 will be described. A case in which random number data is generated and written by utilizing the random transition of memory cells from the initial state to the variable state may also be described in a similar manner, except that data to be written is not determined in advance.

In STEP1, a write command, addresses at which data will be written, and data to be written are input from the outside of the random number processing apparatus 100. If random number data is generated and written by utilizing the random transition of memory cells from the initial state to the variable state, data to be written is not input, and instead of addresses at which data will be written, addresses indicating regions in which random number data is generated are input.

In STEP2, it is determined whether or not the write command input in STEP1 is a first write command. If the determination result of STEP2 is NO, the process proceeds to STEP9. In STEP9, the processing is terminated.

If the determination result of STEP2 is YES, the process proceeds to STEP3. In STEP3, the memory cells 91 located at the addresses input in STEP1 are selected, and, in accordance with the input data, memory cells that will remain in the initial state are masked so that an electrical stress will not be applied to such memory cells. The memory cells that will remain in the initial state correspond to, for example, "0" in the data to be written.

In STEP4, an electrical stress is applied to memory cells that are not masked, that is, memory cells that will be shifted from the initial state to the variable state. The initial values of a voltage and a pulse width of the electrical stress are 3 V and 1 μsec, respectively. The electrical stress may be a forming stress or one of multiple electrical stresses constituting the forming stress. The memory cells that will be shifted from the initial state to the variable state correspond to, for example, "1" in the data to be written.

In STEP5, the sense amplifier 012 is set to be a read mode for determining whether or not forming has been completed. For example, the switch SW4 is turned OFF, and the measurement range is set to be a high resistance range.

In STEP6, it is determined whether or not the count value held by the counter 134 of the sense amplifier 012 is smaller than 40 and whether or not the number of application times of an electrical stress exceeds five. If one of the determination results of STEP6 is YES, the processing has been completed (END).

If both of the determination results of STEP6 are NO, the process proceeds to STEP7. In STEP7, another electrical stress is set by increasing the voltage of the previous electrical stress by 0.1 V and by increasing the pulse width five times as long as that of the previous electrical stress. Then, the process returns to STEP4, and the electrical stress set in STEP7 is applied to the memory cells. In this manner, STEP4 through STEP7 are repeated until the memory cells that will be shifted from the initial state to the variable state are changed to the variable state. In the example shown in FIG. 18, the upper limit is set for the number of application times of an electrical stress so as to avoid the occurrence of an infinite loop.

If a memory cell is not shifted to the variable state even if the application time of an electrical stress exceeds the upper limit, the memory cell is determined to be a defective cell, and an error log may be output. If the process in the flowchart shown in FIG. 18 is executed in parallel for a plurality of bits, the number of times of an electrical stress to be applied before one of the determination results in STEP6 is YES is different among the bits. Accordingly, a memory cell for which one of the determination results of STEP6 is found to be YES may be masked so that a subsequent electrical stress will not be applied any more to such a cell. In this case, when the determination result of STEP6 is found to be YES for all the memory cells subjected to parallel processing, the process has been completed.

FIG. 19 illustrates an example of a result of reading the data written in the special write mode by the process shown in FIG. 18 in the special read mode. FIG. 20 illustrates an example of a result of reading the data written in the special write mode by the process shown in FIG. 18 in the normal read mode. FIGS. 19 and 20 show the results of reading, in the special read mode and in the normal read mode, respectively, from a memory cell set in which values of "0" to "F" (hexadecimal notation) are written in the special write mode.

In the examples shown in FIGS. 19 and 20, the clock frequency, read voltage, second reference potential Vref2, and determination time are the same, and the ON/OFF state of the switch SW4 only is different between the special read mode and the normal read mode.

If the ON/OFF state of the switch SW4 is different, the volume of a current supplied from the constant current source 129 to the node C is different, and the count value before the potential of the node C attenuates is different. Accordingly, if the ON/OFF state of the switch SW4 is different, the coefficients (for example, the above-described constants C1 and C2) which associate the resistance value with the count value are different. Thus, even if the count values are determined in the special read mode and the normal write mode on the basis of the same determination value, they are determined on the basis of different determination values in a practical sense. In other words, the reading in the special read mode is reading using a first threshold, while the reading in the normal read mode is reading using a second threshold, which is different from the first threshold.

In FIGS. 19 and 20, the count values indicated in the four columns in the left side are values held by the counter 134 shown in FIG. 14. Each count value is compared with "40", which is the determination value, and "0" is assigned to bits greater than the determination value, while "1" is assigned to bits smaller than the determination value. The resulting four-bit values are indicated in the rightmost column in FIGS. 19 and 20 in hexadecimal notation. The upper limit value of the counter 134 is "255", and a value greater than 255 is not allowed.

FIG. 19 shows that, when the memory cell set is read in the special read mode, all memory cells in which forming has not been completed indicate the maximum value "255" and memory cells in which forming has been completed indicate the value "9" or "10". The resulting four-bit values are indicated by one of predetermined values of "0" to "F" in hexadecimal notation.

FIG. 20 shows that, when the memory cell set is read in the normal read mode, most of the count values are the maximum value "255" and the most of the resulting four-bit values are "0". This shows that data written in the special write mode can be read correctly only in the special read mode. The reason why there is a considerable variation in the count value even for the memory cells in which forming has been completed is that the resistance values of such memory cells are possible to be set either in the first resistance value range or the second resistance value range.

In the above-described operation example, the resistance value of memory cells in the initial state is higher than that in the variable state. However, even if the resistance value of memory cells in the initial state is lower than that in the variable state, the operation may be performed similarly by suitably changing the determination method and the polarity and the voltage of a pulse to be applied.

(Second Example of Operation in Special Write Mode)

Figure 21:
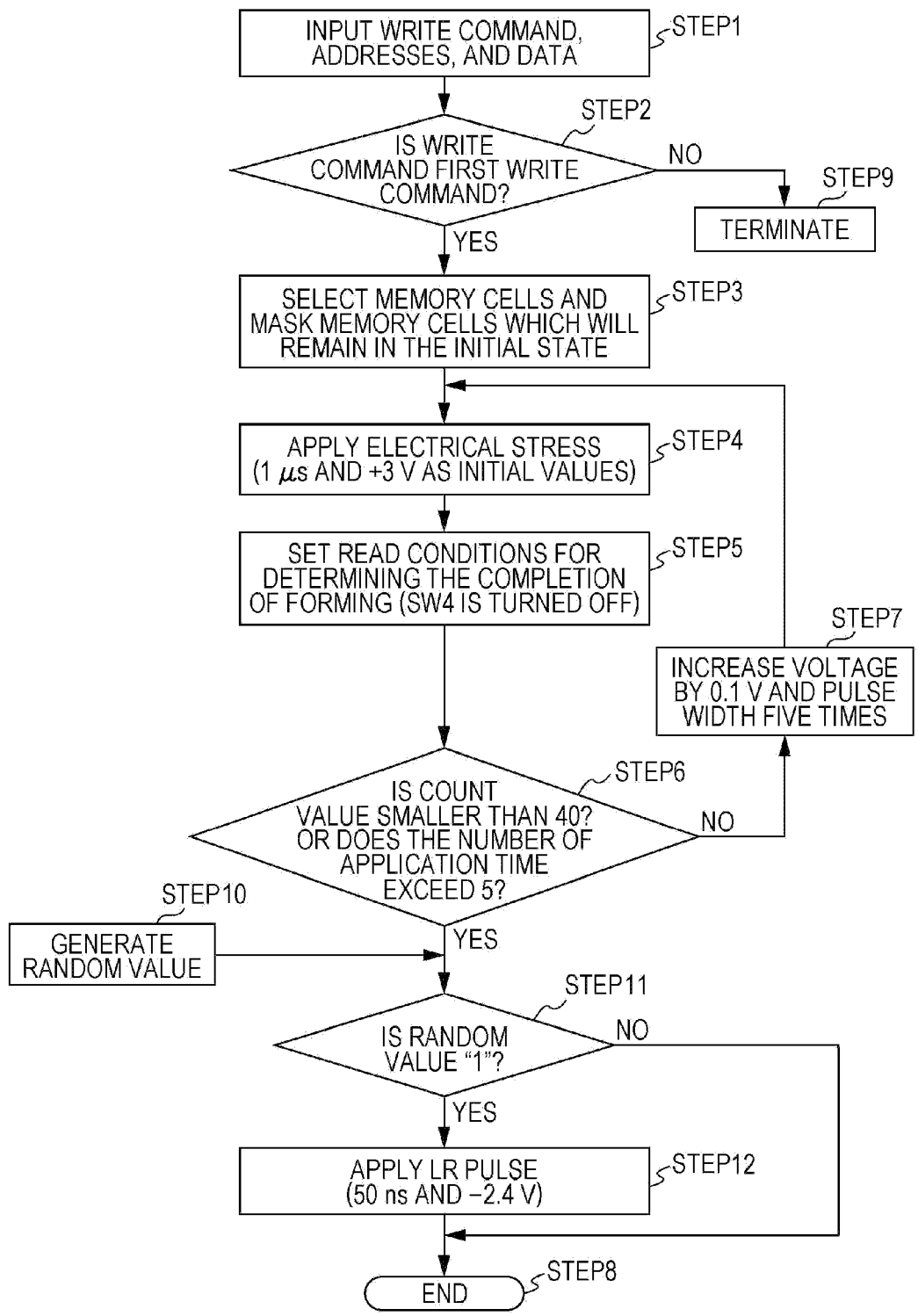
FIG. 21 is a flowchart illustrating a second example of the operation in the special write mode.

FIG. 21 is a flowchart illustrating a second example of the operation in the special write mode. In the second example, among memory cells which have shifted from the initial state to the variable state in the special write mode, the resistance values of some memory cells are set within the second resistance value range, and the resistance values of the other memory cells are set within the first resistance value range. Allocation of the memory cells to the first and second resistance value ranges is performed randomly. In this method, when memory cells into which data is written in the special write mode are read in the normal read mode, it appears as if some data is stored in the memory cells.

In FIG. 21, operations similar to those in the first example are designated by like step numbers in FIG. 18, and an explanation thereof will thus be omitted.

If one of the determination results of STEP6 is YES, it means that the resistance value of a memory cell is within the first resistance value range. In this case, in STEP10, a random value is generated. In STEP11, it is determined whether or not the random value is "0" or "1". If the random value is "0", the process proceeds to STEP8 and the processing has been completed. If the random value is "1", the process proceeds to STEP12. In STEP12, a low resistance pulse is applied to the memory cell so that the resistance value of the memory cell may be decreased to the second resistance value range. The process then proceeds to STEP8, and the processing has been completed.

According to this operation, the resistance values of the memory cells which have shifted to the variable state randomly enter the second resistance value range. Accordingly, when this data is read in the normal read mode, a fixed data pattern in which all bits are zero is not output. Thus, it is not possible to specify regions in which data is written in the special write mode, thereby further enhancing the confidentiality of data.

Depending on the type of data to be written, the proportion of "1" may be very small. In this case, if STEP12 is executed, the possibility of confidential data leaking is increased. Accordingly, the execution of STEP12 may be limited depending on the type of data to be written.

In the above-described operation example, the resistance value of memory cells in the initial state is higher than that in the variable state. However, even if the resistance value of memory cells in the initial state is lower than that in the variable state, the operation may be performed similarly by suitably changing the determination method and the polarity and the voltage of a pulse to be applied.

Second Embodiment

A random number generating method of a second embodiment includes a step of outputting, as new resistance value information, a value obtained by multiplying a cumulative value by a coefficient which is greater than 0 and smaller than 1, a step of storing, as a new cumulative value, a value obtained by adding the cumulative value to a value obtained by subtracting the new resistance value information from resistance value information, and a step of generating random number data by using a plurality of items of the new resistance value information obtained by repeating these steps.

The random number processing apparatus of the first embodiment is capable of generating high-quality 16 Kbit random numbers, as indicated by Table 3. However, in the first embodiment, if the number of bits is one Mbit, the evaluation result of random numbers after being subjected to a discrete Fourier transform test may be "fail". These evaluation results of random numbers are indicated in Table 4.

TABLE 4

| Test Type | P-value | Pass or fail |
| --- | --- | --- |
| 1. Frequency Test | 0.9390 | pass |
| 2. Frequency Test within a Block | 0.9993 | pass |
| 3. Runs Test | 0.4527 | pass |

TABLE 4-continued

| Test Type | P-value | Pass or fail |
| --- | --- | --- |
| 4. Test for Longest Run of Ones in a Block | 0.0138 | pass |
| 5. Binary Matrix Rank Test | 0.2791 | pass |
| 6. Discrete Fourier Transform Test | 0.0000 | fail |
| 7. Serial Test (p-value 1, p-value 2) | 0.1867, 0.1457 | pass |
| 8. Approximate Entropy Test | 0.0453 | pass |
| 9. Cumulative Sums (Cusums) Test (forward, reverse) | 0.9999, 0.9992 | pass |

That is, although the random number processing apparatus of the first embodiment may be able to generate high-quality random numbers having a small number of bits, it may not be able to generate high-quality random numbers having a large number of bits.

Figure 22:
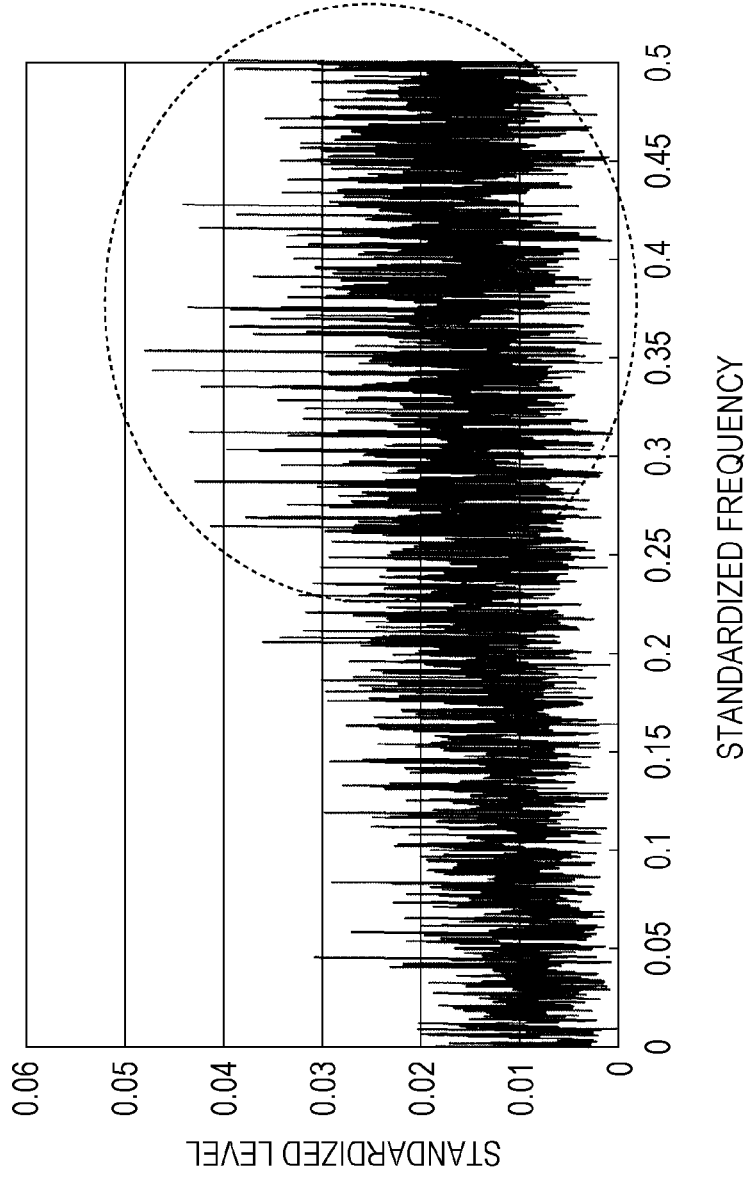
FIG. 22 illustrates a result of performing discrete Fourier transform on random number data obtained in the first embodiment.

FIG. 22 illustrates the result of performing discrete Fourier transform on random number data having a large number of bits obtained in the first embodiment. As indicated in a region surrounded by the dotted-line circle in FIG. 22, the level of the high frequency components is higher than that of the low frequency components. That is, in the first embodiment, in a bit stream, a change from "0" to "1" and/or from "1" to "0" is likely to occur in a short cycle. The reason for this may be because the random number processing apparatus of the first embodiment includes a differentiating circuit for extracting the difference between a current item of resistance value information and a previous item of resistance value information. The second embodiment will be carried out for solving this problem.

Figure 23:
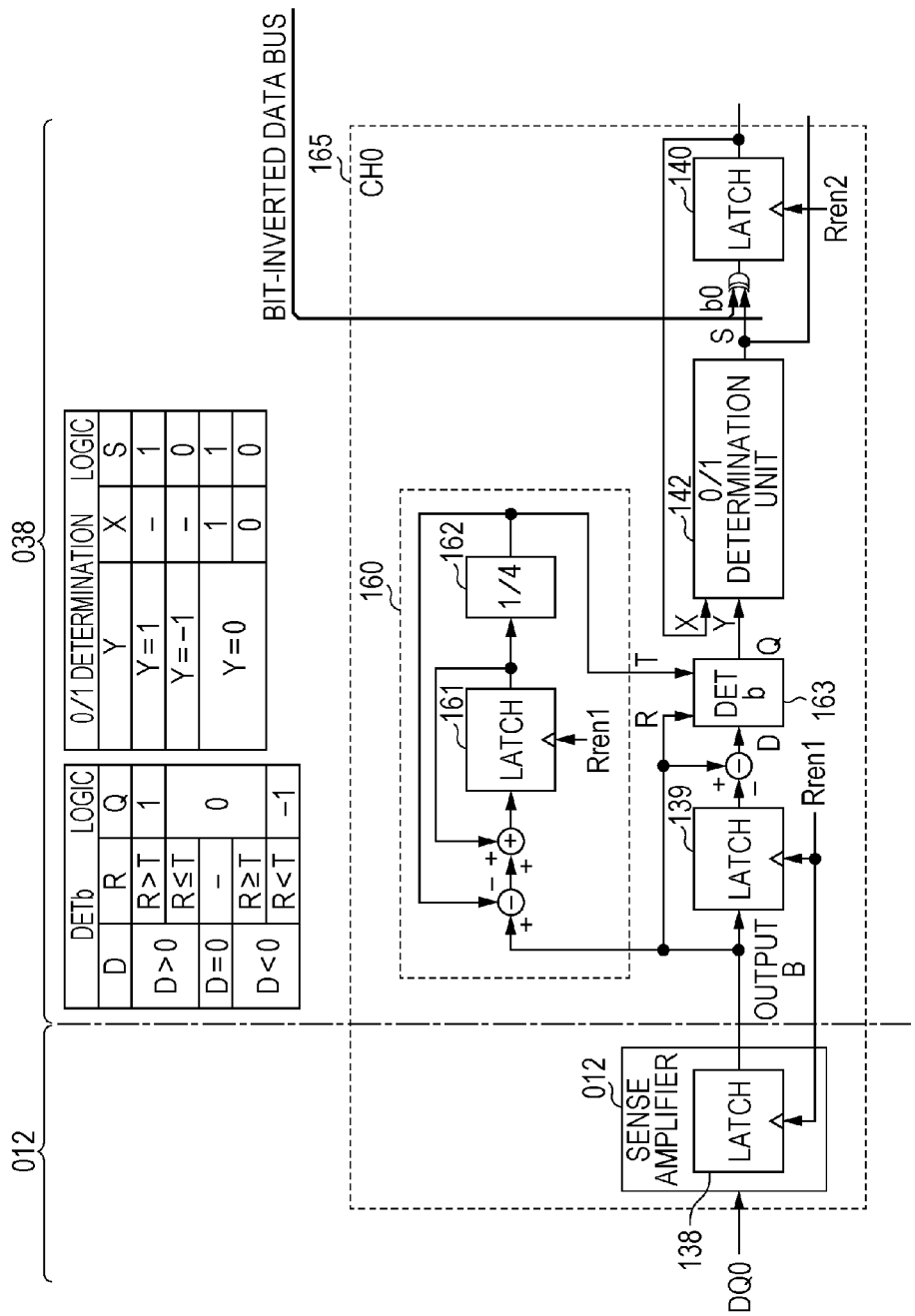
FIG. 23 is a circuit diagram of an example of the schematic configuration of a random number generating circuit of a second embodiment.

FIG. 23 is a circuit diagram of an example of the schematic configuration of a determination block 165 of the second embodiment. The circuit configuration of the second embodiment will be described below with reference to FIG. 23.

In the random number processing apparatus 038 of the second embodiment, the determination block 150 of the first embodiment shown in FIG. 17 is replaced by the determination block 165 shown in FIG. 23. The configurations of the other elements of the random number processing apparatus of the second embodiment are the same as those of the first embodiment, except for the configuration of the determination block. Thus, the same elements as those of the first embodiment are designated by like reference numerals and like names, and a detailed explanation thereof will be omitted.

As shown in FIG. 23, the determination block 165 includes an integrating circuit 160 for extracting a change in the low frequency components of resistance value information. The integrating circuit 160 is also called a low-pass filter. The determination block 165 includes a detector (DETb) 163 into which output from the integrating circuit 160 is input, instead of the detector 141 of the first embodiment shown in FIG. 17. The operation of the determination block 165 will be described below.

The sense amplifier 012 and the random number generating circuit 038 include determination blocks 165 of eight channels CH0 through CH7. The circuits of the determination blocks 165 are substantially the same. Accordingly, the determination block 165 of only one channel CH0 shown in FIG. 23 will be described below.

The latches 138 and 139 each output resistance value information held therein as output B at a timing indicated by the signal Rren1 and hold new resistance value information, as in the first embodiment.

The subtractor subtracts the value indicated by the resistance value information from the latch 139 from the value indicated by the resistance value information from the latch 138, and outputs the difference to the detector 163, as in the first embodiment.

In the integrating circuit 160, the following calculations are conducted at a timing indicated by the signal Rren1 so as to update the value held in a latch 161. First, the output from the latch 161 is multiplied by a predetermined coefficient specified by a coefficient multiplier 162. Then, the resulting multiplication value is subtracted from the output B from the latch 138. Then, the resulting subtraction value is added to the output from the latch 161. Finally, the resulting addition value is latched in the latch 161. In the example shown in FIG. 23, the predetermined coefficient specified by the coefficient multiplier 162 is ¼.

In the detector 163, the output from the subtractor is input as input D, the output from the integrating circuit 160 is input as input T, and the output B from the latch 138 is input as input R.

A logic table of the detector 163 is shown in FIG. 23. In the detector 163, if the input D is greater than 0 and if the input R is greater than input T, "1" is output. If the input D is smaller than 0 and if the input R is smaller than input T, "−1" is output. In other cases, "0" is output.

The output from the detector 163 is input into the 0/1 determination unit 142 as input Y. The operations of the 0/1 determination unit 142 and the subsequent elements are similar to those described with reference to FIG. 17. With this configuration, it is possible to reduce the possibility that the frequency distribution be nonuniform and be biased toward high frequency components in a fluctuation in resistance value information.

Figure 24:
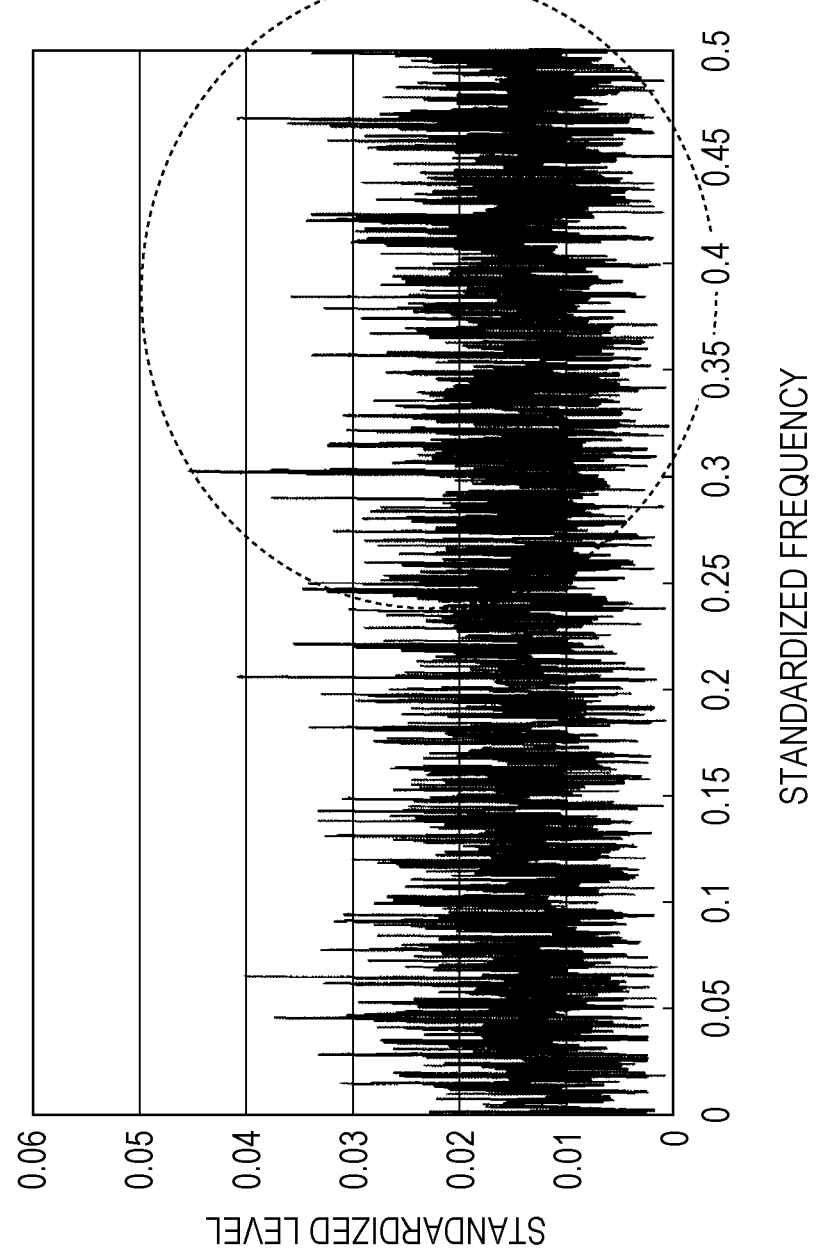
FIG. 24 illustrates a result of performing discrete Fourier transform on random number data obtained in the second embodiment.

FIG. 24 illustrates the result of performing discrete Fourier transform on random number data generated in the second embodiment. As shown in FIG. 24, the frequency distribution is not biased toward high frequency components, and substantially uniform frequency characteristics are obtained in the entire band. Table 5 indicates the evaluation results of one-Mbit random number data obtained in the second embodiment. The evaluation result of the random number data in the discrete Fourier transform test is "pass". Accordingly, the random number processing apparatus of the second embodiment is capable of generating high-quality random numbers having a large number of bits.

TABLE 5

| Test Type | P-value | Pass or fail |
| --- | --- | --- |
| 1. Frequency Test | 0.9392 | pass |
| 2. Frequency Test within a Block | 1.0000 | pass |
| 3. Runs Test | 0.4803 | pass |
| 4. Test for Longest Run of Ones in a Block | 0.4879 | pass |
| 5. Binary Matrix Rank Test | 0.0612 | pass |
| 6. Discrete Fourier Transform Test | 0.0303 | pass |
| 7. Serial Test (p-value 1, p-value 2) | 0.1443, 0.2662 | pass |
| 8. Approximate Entropy Test | 0.0246 | pass |
| 9. Cumulative Sums (Cusums) Test (forward, reverse) | 1.0000, 1.0000 | pass |

The second embodiment may be carried out in combination with the first embodiment.

[Adjustment of Sense Amplifier]

The resistance value information that can be obtained by a sense amplifier has an upper limit value and a lower limit value. For example, the count value of the counter 134 shown in FIG. 14 has an upper limit value and a lower limit value. This means that there is a predetermined range of resistance values of a memory cell within which the sense amplifier is capable of detecting the difference between resistance values. Accordingly, if the resistance value indicated by resistance value information of a memory cell is greater than the upper limit value or is smaller than the lower limit value, the sense amplifier is not able to detect a change in the resistance value information.

Thus, before generating random number data, the range of resistance values that can be read by the sense amplifier may be adjusted. This adjustment may be implemented by the volume of a current from the constant current source 129, the first and second reference potentials Vref1 and Vref2, and the capacitance of the capacitor CC2.

[Resistance State of Memory Cell and Obtained Random Number Data]

The present inventors have tested various items of random number data generated by the random number processing method of the second embodiment and have found the following characteristics of these items of random number data. These characteristics are not restricted to the random number data generated by random number processing method of the second embodiment, and may be observed in random number data generated by any random number processing method of an embodiment of the present disclosure.

Random numbers generated based on resistance value information read from a memory cell in the high resistance state has higher randomness characteristics than those from a memory cell in the low resistance state. The reason for this may be as follows. The number and the diameter of filaments in a memory cell in the high resistance state are smaller and thinner than those in a memory cell in the low resistance state. Accordingly, upon the occurrence of even a slight connection or disconnection in a filament locally, it may significantly influence a change in the resistance value of the memory cell. That is, in a memory cell in the high resistance state, the magnitude of a fluctuation in the resistance value is large. Accordingly, resistance value information obtained from a memory cell in the high resistance state is more likely to reflect random fluctuations. Due to the above-described reason, random numbers generated by using resistance value information from a memory cell in the high resistance state has higher randomness characteristics.

If the magnitude of a fluctuation in the resistance value is large, the sampling resolution used for obtaining resistance value information may be set to be low as long as random numbers satisfy a desired level of randomness. This makes it possible to reduce the circuit scale and to decrease the power consumption.

After it is verified in the normal read mode that a memory cell is in the high resistance state, random number data may be generated by using the memory cell. Alternatively, after a memory cell is set to be the high resistance state in the normal write mode, random number data may be generated by using the memory cell.

A margin of error in resistance value information obtained from a memory cell in the low resistance state is smaller than that obtained from a memory cell in the high resistance state. For example, if the sense amplifier 012 shown in FIG. 14 is used, the volume of a read current flowing through a memory cell having a smaller resistance value is greater than that flowing through a memory cell having a greater resistance value. Accordingly, a fluctuation in the resistance value of a memory cell in the low resistance state appears as a great change in the current volume, which may reduce the possibility that reading errors occur. Thus, even if a leak current occurs in the sense amplifier under high temperature environments, resistance value information can be obtained without being influenced by the leak current. As a result, random number data generated by using a memory cell in the low resistance state has sufficiently high randomness characteristics even under high temperature environments around the random number processing apparatus.

After it is verified in the normal read mode that a memory cell is in the low resistance state, random number data may be generated by using the memory cell. Alternatively, after a memory cell is set to be the low resistance state in the normal write mode, random number data may be generated by using the memory cell.

Memory cells for generating random number data may not be dedicated memory cells for this purpose. For example, random numbers may be generated by using memory cells for storing data. If a region for generating random numbers and a region for storing data are the same region, the memory space can be saved and the circuit scale can be reduced. In this case, for example, before generating random numbers, data stored in a memory cell may be stored in a temporary storing memory, and after generating random numbers, the data may be written back to the memory cell. After saving data stored in a memory cell in a temporary storing memory, the memory cell may be rewritten to a predetermined resistance state suitable for generating random numbers.

[Adjustment of Write Conditions]

Write conditions for a memory cell may be adjusted so that the resistance values of the memory cell will be within a predetermined range within which the sense amplifier is able to detect the difference in the resistance value. Examples of the write conditions are a pulse voltage and a pulse width.

Figure 25:
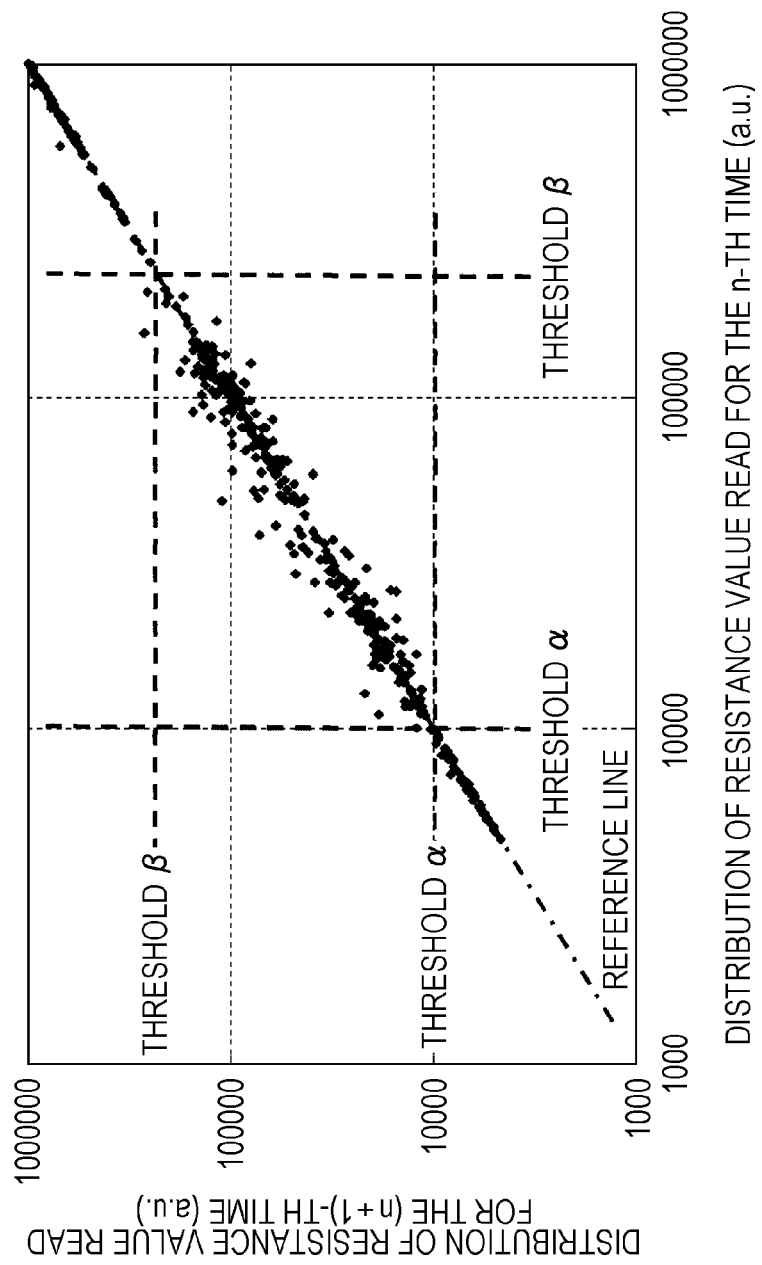
FIG. 25 illustrates the relationship between resistance values of a memory cell and a variation in the resistance value.

FIG. 25 illustrates the relationship between the resistance value of a memory cell and a variation in the resistance value. In FIG. 25, the horizontal axis indicates the resistance value which is read for the n-th time, and the vertical axis indicates the resistance value which is read for the (n+1)-th time. More specifically, FIG. 25 shows how the resistance value which is read from a memory cell for the n-th time and the resistance value which is read from the memory cell for the (n+1)-th time are changed. The long dashed dotted line in FIG. 25 is a reference line indicating a case in which there is no difference between the resistance value read for the n-th time and the resistance value read for the (n+1)-th time. As a data point deviates farther from the reference line, the difference between the resistance value read for the n-th time and the resistance value read for the (n+1)-th time is greater. The configuration of the variable resistance element of the memory cell is the same as that described with reference to FIG. 3.

FIG. 25 shows that a change in the resistance value in a region between a threshold $\alpha$ and a threshold $\beta$ is greater than that in the other regions. A great change in the resistance value is disadvantageous to the storage of information in a memory cell, but on the other hand, it is advantageous to the generation of random number data.

Accordingly, if data is recorded by assigning "1" to the low resistance state and "0" to the high resistance state, the resistance value of a memory cell in the low resistance state is set to be smaller than the threshold $\alpha$ and the resistance value of a memory cell in the high resistance state is set to be equal to or greater than the threshold $\beta$. The threshold $\alpha$ is an example of a second reference value of an embodiment of the present disclosure, and the threshold $\beta$ is an example of a first reference value of an embodiment of the present disclosure. For example, after a low resistance voltage is applied to a memory cell which will be set to be the low resistance state, it may be verified that the resistance value is smaller than the threshold α. After a high resistance voltage is applied to a memory cell which will be set to be the high resistance state, it may be verified that the resistance value is equal to or greater than the threshold β. With such settings of the write conditions, a sufficient margin is secured between the resistance values belonging to the low resistance state and the resistance values belonging to the high resistance state.

The second threshold for determining whether or not the resistance value of a memory cell is in the low resistance state or in the high resistance state in the normal read mode may be set as the center value between the threshold α and the threshold β. That is, in the normal read mode, if the resistance value read from a memory cell is equal to or greater than the second threshold, the memory cell is found to be in the high resistance state, and if the resistance value read from a memory cell is smaller than the second threshold, the memory cell is found to be in the low resistance state.

The resistance value of a memory cell for generating random numbers may be set between the threshold α and the threshold β. A range of the threshold α to a value smaller than the threshold β is an example of a third resistance value range in an embodiment of the present disclosure. For example, in the fluctuation write mode, the resistance value of a memory cell may be set within the third resistance value range. Then, random number data can be generated more easily from a fluctuation in the resistance value.

The write conditions under which a memory cell for generating random numbers is set may be adjusted so that the count value of the counter 134 will be, when the memory cell is read, a value greater than α' and smaller than β', where the α' is a count value of the counter 134 when the resistance value is equal to the threshold α, and the β' is a count value of the counter 134 when the resistance value is equal to the threshold β.

After the application of the low resistance pulse to a selected memory cell, an electric pulse of lower energy than the high resistance pulse may be further applied to the memory cell. Additionally, a plurality of electric pulses for gradually increasing energy may be applied to the memory cell. If resistance value information enters a desired range, the application of an electric pulse may be terminated. After the application of the high resistance pulse to a selected memory cell, an electric pulse of lower energy than the low resistance pulse may be further applied to the memory cell. Additionally, a plurality of electric pulses for gradually increasing energy may be applied to the memory cell.

An electric pulse of lower energy refers to an electric pulse of a smaller absolute voltage value and/or a narrower pulse width. An electric pulse of higher energy refers to an electric pulse of a greater absolute voltage value and/or a wider pulse width.

For example, it is assumed that the voltage of the low resistance pulse is −2.4 V and the voltage of the high resistance pulse is +1.8 V. In this case, the low resistance pulse of a voltage of −2.4 V and a pulse width of 50 nsec is first applied to a selected memory cell. Then, an electric pulse of, for example, a voltage of +1.3 V and a pulse width of 50 nsec, is further applied to the memory cell.

Then, resistance value information may be read from the memory cell, and it may be determined whether or not the resistance value exceeds α'. If the resistance value is found to exceed the threshold α, the application of an electric pulse is terminated for the memory cell. If the resistance value is not found to exceed the threshold α, an electric pulse of a voltage of, for example, α1.4 V and a pulse width of 50 nsec, is further applied to the memory cell.

In this manner, the application of an electric pulse and the reading of resistance value information may be repeated by gradually increasing the energy of the electric pulse so that the resistance value may exceed the threshold α. If there is a memory cell that exceeds the threshold β, the low resistance pulse of a voltage of −2.4 V may be applied again. As a result, the resistance value converges into a range of the threshold α to the threshold β.

[Temporal Change in Variation Amount of Resistance Value]

Figure 26:
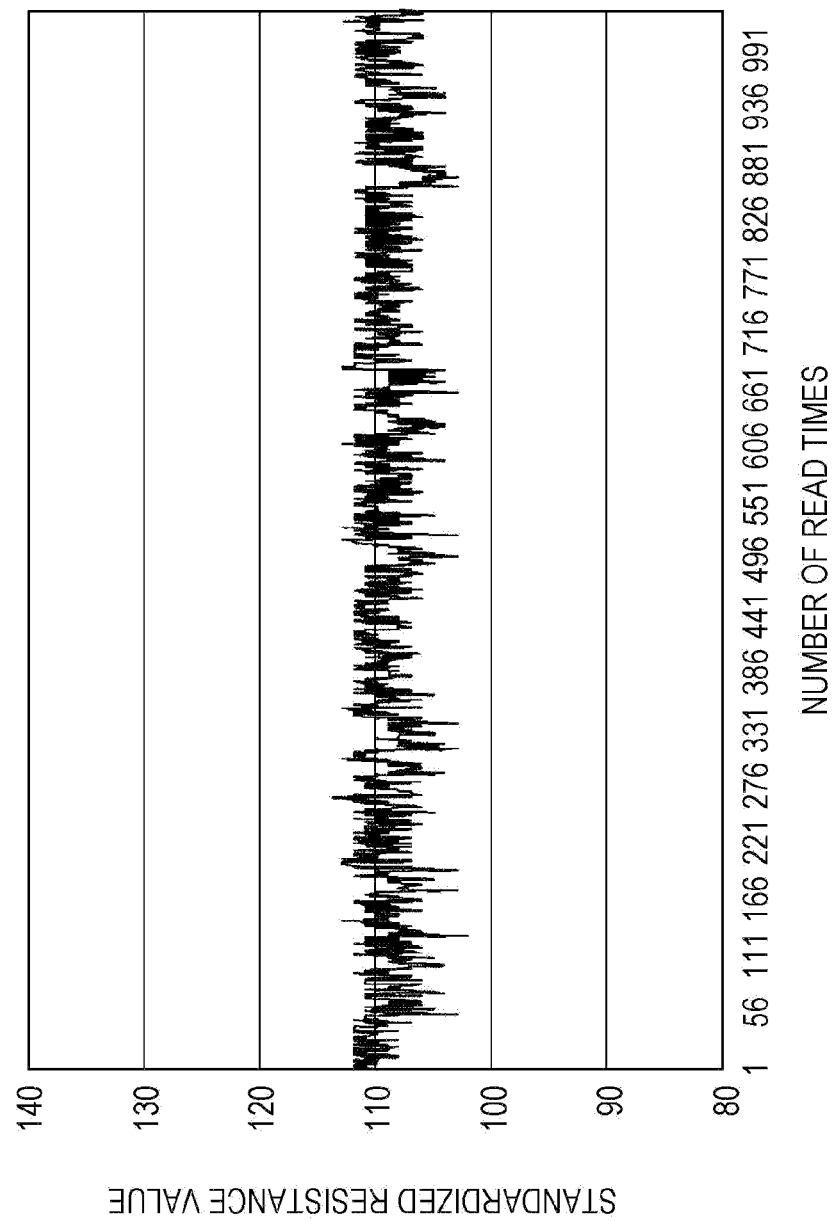
FIG. 26 illustrates a fluctuation in the resistance value of a variable resistance element immediately after writing.
Figure 27:
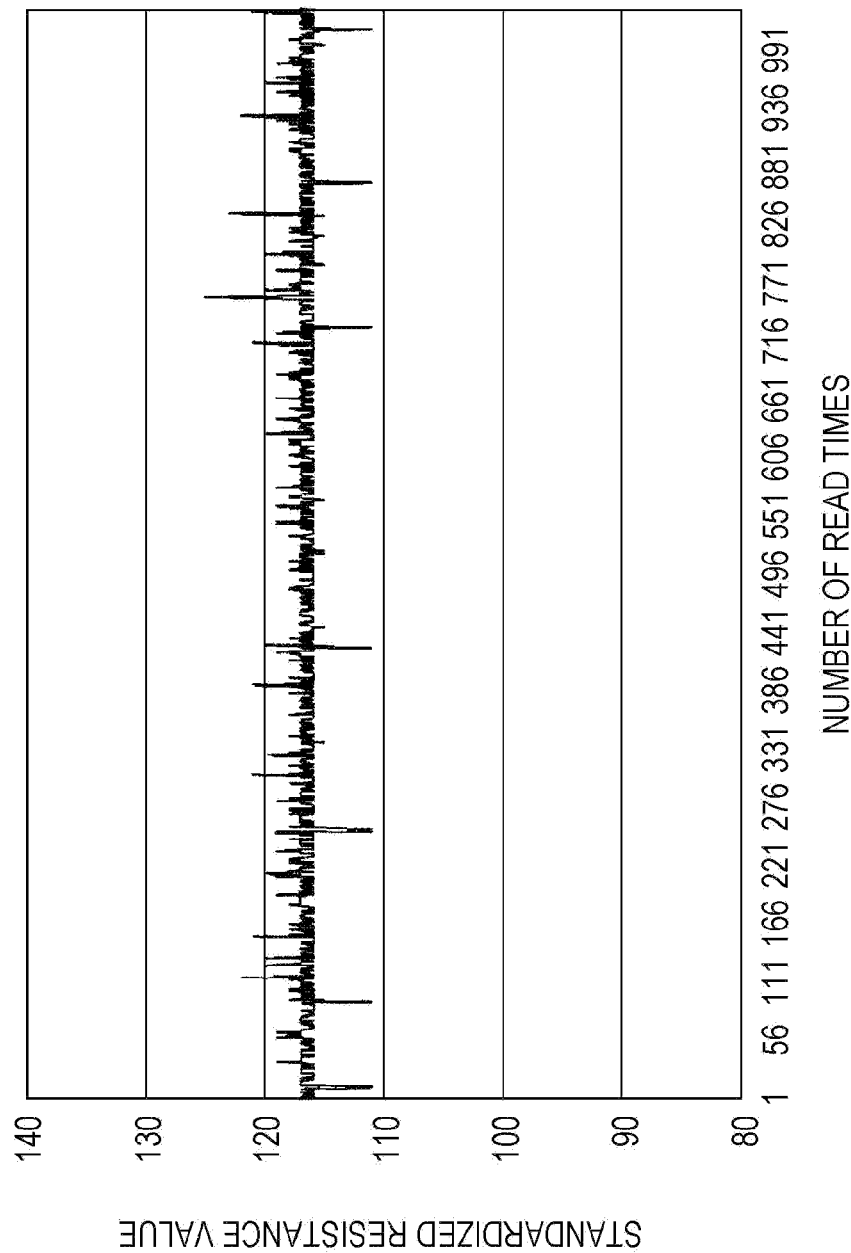
FIG. 27 illustrates a fluctuation in the resistance value of the same variable resistance element after the lapse of twenty-four hours after writing.

A change in the variation amount of the resistance value as the time elapses after writing will be described below. FIG. 26 illustrates a fluctuation in the resistance value of a variable resistance element immediately after writing. FIG. 27 illustrates a fluctuation in the resistance value of the same variable resistance element after the lapse of twenty-four hours after writing.

The variable resistance element subjected to the measurements of a fluctuation in the resistance value in FIGS. 26 and 27 was in the high resistance state. The high resistance state was set by applying a high resistance pulse to the variable resistance element in the low resistance state. The configuration of the variable resistance element and the voltage and the pulse width of the applied pulse are similar to those described with reference to FIG. 3.

FIGS. 26 and 27 show that, as the time elapses after writing, the amplitude and the frequency of occurrence of a fluctuation in the resistance value are smaller. Accordingly, a fluctuation in the resistance value is more likely to be detected if resistance value information is read from a memory cell in which writing was performed only a short time ago. The present inventors have verified that higher-quality random number data is generated as the time elapsed after writing and before reading is shorter.

Accordingly, resistance value information may be read from a memory cell in which writing was performed only a short time ago. For example, the time at which a write operation was performed may be stored in part of a memory cell array as time stamp information. If the time elapsed after the time indicated by the time stamp information exceeds a predetermined threshold, a write operation may be performed again. In this case, a low resistance pulse may be applied to a variable resistance element in the high resistance state, and then, a high resistance pulse may be applied to the variable resistance element.

[Writing of Random Number Data into Memory Cells in Variable State]

A description will be given of an example of an operation for temporarily storing random number data generated by the random number generating circuit in a memory cell in the variable state. In the example shown in FIG. 28, a memory cell array 90 is divided into a random-number generating memory cell set 95, a first-type data storing memory cell set 96, and second-type data storing memory cell set 97.

The random-number generating memory cell set 95 is a memory cell set from which resistance value information for generating random number data is read. In the fluctuation write mode, for example, the random-number generating memory cell set 95 may be set to a predetermined resistance state. The resistance values of the random-number generating memory cell set 95 may be set such that they are included, for example, within a range of the threshold α to the threshold β.

The first-type data storing memory cell set 96 is a memory cell set in which data is recorded in accordance with whether each memory cell within the first-type data storing memory cell set 96 is in the initial state or in the variable state. The second-type data storing memory cell set 97 is a memory cell set in which data is recorded by using a memory cell in the variable state and in accordance with whether or not the resistance value of the memory cell is in at least one of variable resistance value ranges, instead of whether or not the resistance value of the memory cell is in the initial resistance value range.

The flow of processing executed when random number data is written into memory cells in the variable state will be described below with reference to the block diagram of FIG. 12.

The logic control circuit 010 operates the input/output control circuit 007 on the basis of a control signal input from the outside of the random number processing apparatus 020. The input/output control circuit 007 extracts a fluctuation read command from input data at a timing instructed by the logic control circuit 010, and stores the extracted fluctuation read command in the command register 033. The input/output control circuit 007 sets an address signal indicating the addresses of memory cells of the random-number generating memory cell set 95 in the address register 009. In the fluctuation read mode, resistance value information is read from each memory cell within the random-number generating memory cell set 95 and is sent to the random number generating circuit 038 via the sense amplifier 012. This cycle is repeated every time a read operation is performed. The random number generating circuit 038 generates random number data on the basis of the resistance value information and stores the random number data in the data register 030.

If an external host computer requires random number data immediately, the random number data may be output to the host computer via the input/output control circuit 007. If, for example, the load of the host computer is heavy, the random number data may be stored in the random number processing apparatus 020, and when the load of the host computer is decreased, the random number data may be output to the host computer. In this case, the random number data may be temporarily stored in the memory cell array 021. With this operation, the random number data may be output when encryption or decryption of communication data is necessary.

Figure 28:
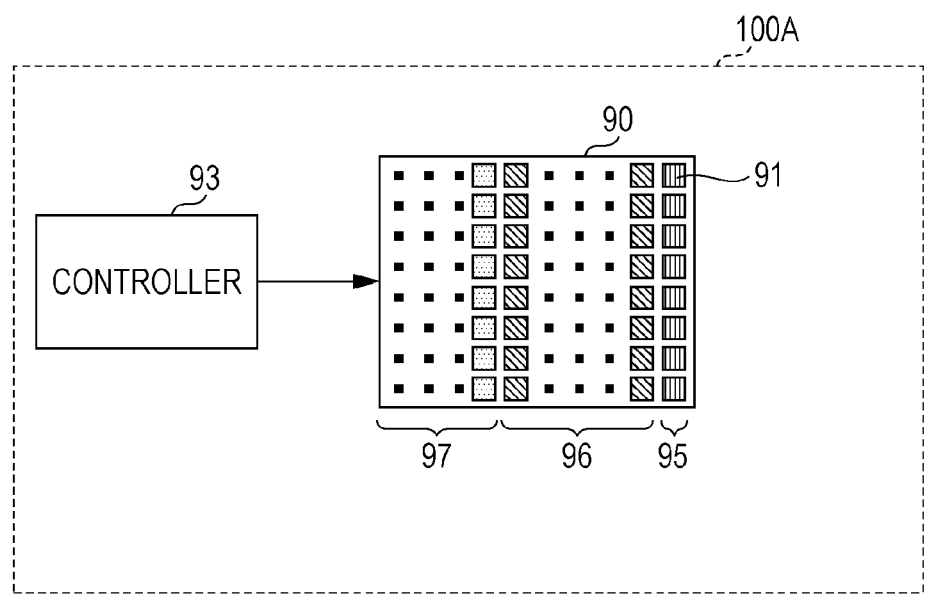
FIG. 28 illustrates an example of a memory cell array which is divided into a random-number generating memory cell set, a first-type data storing memory cell set, and second-type data storing memory cell set.

In the configuration shown in FIG. 28, the random number data generated by the random number generating circuit 038 may be stored in a region of the memory cell array 90 different from the random-number generating memory cell set 95. In this case, the random number processing apparatus 020 is operated as follows.

When the random number data is stored in the data register 030, an address signal indicating the addresses of some of the memory cells of the second-type data storing memory cell set 97 is stored in the address register 009. The switching circuit 037 connects the write circuit 011 to the column selection circuit 004. The row selection circuit 003 and the column selection circuit 004 select a plurality of predetermined memory cells of the second-type data storing memory cell set 97 on the basis of the address signal. Then, the random number data stored in the data register 030 is written into the plurality of selected memory cells. The write conditions may be similar to those in the normal write mode described above.

The random number data may be written into the second-type data storing memory cell set 97 in each unit equivalent to one word. In this case, the above-described operation may be repeated until the length of the random number data to be recorded in the second-type data storing memory cell set 97 satisfies required conditions.

After recording the random number data in the second-type data storing memory cell set 97, status information indicating the completion of recording of the random number data is set in the status register 034. The host computer obtains the status information from the random number processing apparatus 020 according to the necessity. Upon receiving the status information indicating the completion of recording of the random number data, the host computer may send an instruction to output the random number data to the random number processing apparatus 020. In response to the instruction, the random number data is read from the second-type data storing memory cell set 97 and is output via the input/output control circuit 007.

The upper limit value may be set for the number of times random number data may be read from the second-type data storing memory cell set 97. With this setting, random number data may be used only a predetermined number of times, thereby making it possible to increase the security. The status register 034 may store how many times random number data which is currently stored in the second-type data storing memory cell set 97 has been read. When the number of times the random number data has been read exceeds a predetermined value, the random number data may be erased.

Random number data temporarily stored in the second-type data storing memory cell set 97 may be used as, for example, cryptographic key data. Since the memory cell array 021 includes the random-number generating memory cell set 95 and the second-type data storing memory cell set 97, it may not be necessary that the random number processing apparatus 020 include a temporary storing memory (for example, a static random access memory (SRAM)), thereby further decreasing the circuit scale.

In the related art, a temporary storing memory is typically a volatile memory. Data stored in a volatile memory is erased when power supply is interrupted. In contrast, the second-type data storing memory cell set 97 is a non-volatile memory. Data stored in a non-volatile memory is held even if power supply is interrupted. Accordingly, the random number processing apparatus 020 may be applicable to an intermittent operation, for example, power is turned ON and OFF only when it is necessary. Thus, power consumption can be reduced. The random number processing apparatus 020 may be applicable to use in which power supply is likely to be unstable, such as in a mobile product including an energy harvesting element. In this case, even if power supply is interrupted instantaneously, random number data is not lost. Thus, it may not be necessary to generate random number data again, thereby avoiding the loss of time.

Random number data may be written into memory cells in the variable state in plain text or in encrypted form.

[Writing of Random Number Data into Memory Cells in Initial State]

A description will be given of an example of an operation for semi-permanently storing random number data generated by the random number generating circuit in a memory cell in the initial state. The configuration of a memory cell array is similar to that shown in FIG. 28. Accordingly, elements corresponding to those shown in FIG. 28 are designated by like reference numerals, and a detailed explanation thereof will be omitted.

The flow of processing executed when random number data is written into memory cells in the initial state will be described below with reference to the block diagram of FIG. 12.

As in the writing of random number data into memory cells in the variable state, random number data generated by the random number generating circuit 038 is stored in the data register 030.

The random number data may be used as, for example, a cryptographic key unique to the random number processing apparatus 020 or to a system in which the random number processing apparatus 020 and a host computer are integrated. In this case, the random number data may be stored in the memory cell array semi-permanently.

When the random number data is stored in the data register 030, an address signal indicating the addresses of some of the memory cells of the first-type data storing memory cell set 96 is stored in the address register 009. The switching circuit 037 connects the write circuit 011 to the column selection circuit 004. The row selection circuit 003 and the column selection circuit 004 select a plurality of predetermined memory cells of the first-type data storing memory cell set 96 on the basis of the address signal. Then, the random number data stored in the data register 030 is written into the plurality of selected memory cells.

The write conditions may be similar to those in the special write mode described above. For example, a forming stress is applied to some of the plurality of selected memory cells.

The random number data may be written into the first-type data storing memory cell set 96 in each unit equivalent to one word. In this case, the above-described operation may be repeated until the length of the random number data to be recorded in the first-type data storing memory cell set 96 satisfies required conditions.

Random number data recorded in the first-type data storing memory cell set 96 semi-permanently may be used as, for example, a device-unique cryptographic key. Since the memory cell array 021 includes the random-number generating memory cell set 95 and the first-type data storing memory cell set 96, it may not be necessary that the random number processing apparatus 020 include a write once memory for semi-permanently recording random number data, thereby further decreasing the circuit scale. Among a plurality of memory cells in which random number data will be recorded, a forming stress may be applied only to memory cells which will be set to be in the variable state, and not to memory cells that will remain in the initial state. Since a strong stress is not applied to memory cells that will remain in the initial state, data retention characteristics may be enhanced.

For example, a designer may design the random number processing apparatus 020 such that random number data recorded in the first-type data storing memory cell set 96 can be read only when reliable users execute a special procedure. This enhances the confidentiality of random number data.

Random number data may be written into memory cells in the initial state in plain text or in encrypted form.

In a modified example, part of random number data may be written into memory cells in the initial state, and the remaining part of the random number data may be written into memory cells in the variable state. In this case, the random number data is stored such that it is distributed over different regions and in different resistance value ranges, thereby enhancing the confidentiality of the random number data.

Third Embodiment

In a third embodiment, digital data is generated from a plurality of items of resistance value information, and then, a predetermined algorithm is executed by using the digital data, thereby generating random number data.

In the third embodiment, even if, for example, a variation amount of the resistance value is decreased, sufficiently high-quality random number data may be generated.

Figure 29:
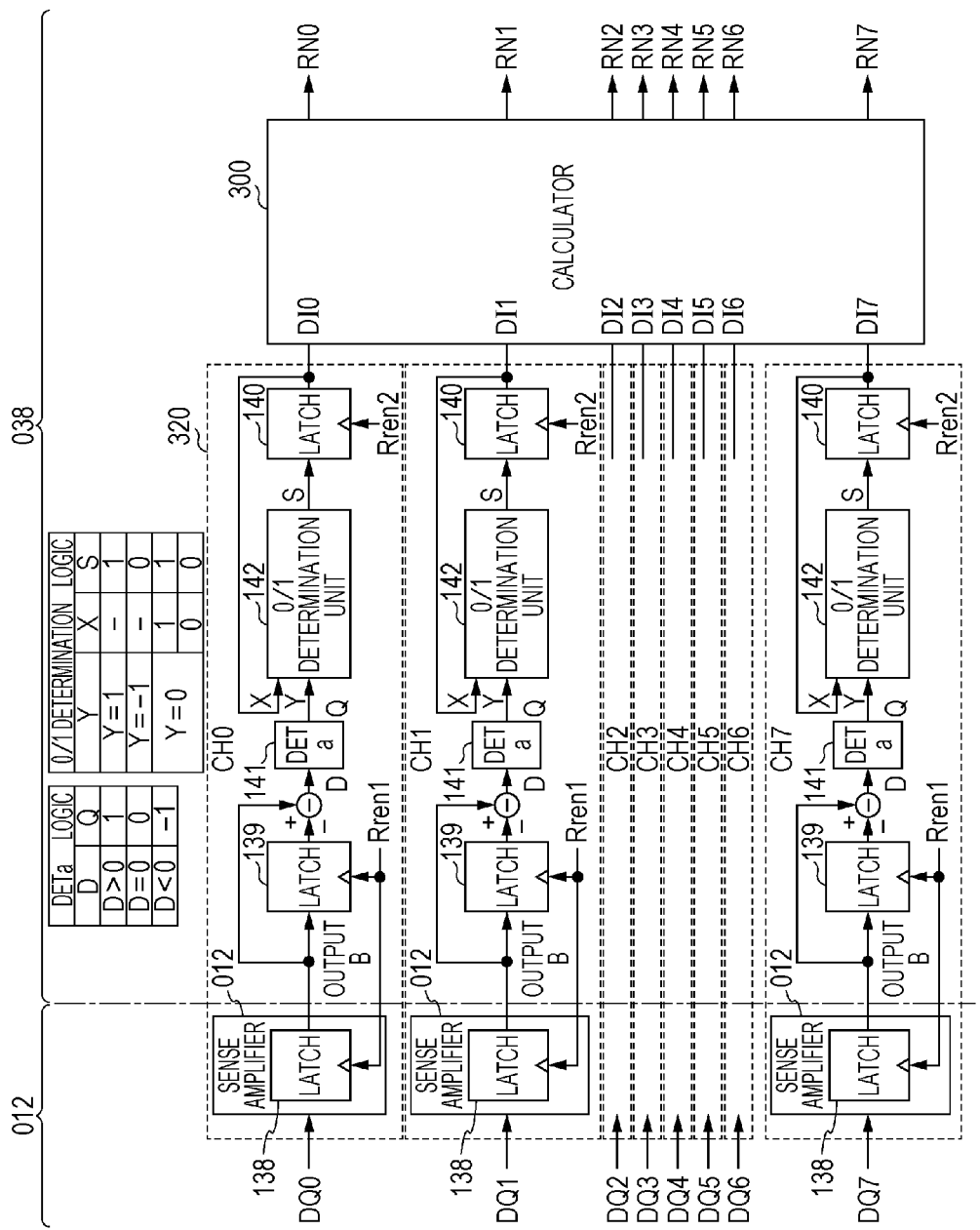
FIG. 29 is a circuit diagram illustrating an example of the schematic configuration of a random number generating circuit according to a third embodiment.

FIG. 29 is a circuit diagram illustrating an example of the schematic configuration of a random number generating circuit 038 according to the third embodiment. The random number generating circuit 038 will be described below with reference to FIG. 29.

As shown in FIGS. 26 and 27, a variation amount of the resistance value of a memory cell immediately after writing is great, while a variation amount of the resistance value of a memory cell after the lapse of twenty-four hours after writing is small. However, even after the lapse of twenty-four hours after writing, a small fluctuation in the resistance value continues over a long time. Accordingly, if sufficiently high-quality random numbers are generated from resistance values having a small variation, a write operation for increasing a fluctuation in the resistance value may not have to be performed.

A determination block 320 in FIG. 29 is similar to the determination block 150 in FIG. 17, except that the XOR circuit between the 0/1 determination unit 142 and the latch 140 is omitted. Elements in FIG. 29 designated by like reference numerals of FIG. 17 are operated in a similar manner, and a detailed explanation thereof will thus be omitted.

The random number generating circuit 038 shown in FIG. 29 includes a calculator 300. In the example in FIG. 29, outputs from the determination blocks 320 of eight channels CH0 through CH7 are input into the calculator 300 as inputs DI0 through DI7, respectively. The inputs DI0 through DI7 each indicate the value "0" or "1". One-byte data constituted by the inputs DI0 through DI7 is an example of "digital data" of an embodiment of the present disclosure. The calculator 300 conducts calculations by using the digital data constituted by the inputs DI0 through DI7 and outputs outputs RN0 through RN7. One-byte data constituted by the outputs RN0 through RN7 is new digital data. The new digital data is random number data. Every time the random number generating circuit 038 obtains resistance value information, it generates random number data constituted by outputs RN0 through RN7.

Various calculation systems may be used in the calculator 300. Any type of calculation system may be used as long as the calculator 300 is able to conduct calculations by using input digital data and to extract random numbers. Examples of the calculation systems are a generator polynomial, a hush function, and a parity generator used for error correction. In the calculator 300, a plurality of calculation circuits executing corresponding calculation systems may be selectively switched, thereby reducing the possibility that the random number generating circuit 038 be hacked.

A description will now be given of an example in which the calculator 300 executes generator polynomial calculations, and digital data output from the determination blocks 320 of the eight channels CH0 through CH7 is used as at least one of the initial value and the input value for calculations in the calculator 300.

Digital data input into the calculator 300 is, for example, fixed-length data having a length of n. The calculator 300 includes an n-stage shift register. When the digital data is input into the shift register, the shift register performs shift operations a predetermined number of times in accordance with the following rules (A), (B), and (C):

(A) the output from the (x−1)-th stage or XOR between the output from the (x−1)-th stage and the output from the n-th stage is input into the x-th stage, where x is an integer of two to n;

(B) the output from the n-th stage or XOR between one of the bits of the digital data and the output from the n-th stage is input into the first stage of the shift register; and (C) if the output from the n-th stage is input into the first stage, XOR between the output from the (x−1)-th stage and the output from the n-th stage is input into at least one of the second through n-th stages, where x is an integer of two to n.

Figure 30:
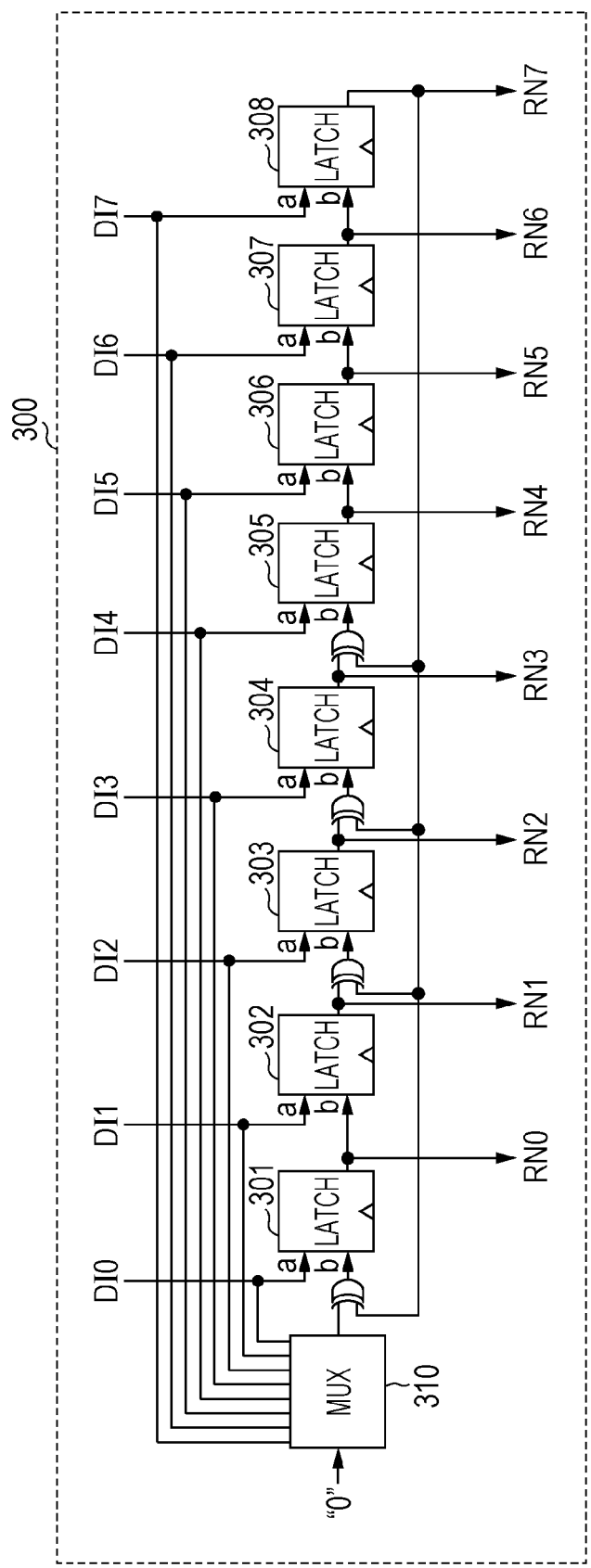
FIG. 30 illustrates an example of a calculator including an eight-stage shift register for calculating an eight-degree primitive polynomial (X8+X4+X3+X2+1)

FIG. 30 illustrates an example of the calculator 300 including an eight-stage shift register. The calculator 300 shown in FIG. 30 is a circuit which implements calculations using an eight-degree primitive polynomial (X8+X4+X3+X2+1). The degree and the type of primitive polynomial and a circuit implementing the primitive polynomial are not restricted to these described above, and they may be suitably designed in terms of the quality of random number data and the circuit scale. For example, the circuit of the calculator 300 may be suitably designed in accordance with the number of channels of the determination blocks 320.

The primitive polynomial is one type of generator polynomial. In a generator polynomial, when input is constant, a pattern having a periodicity is output. The period of a pattern is dependent on the degree of a generator polynomial. For example, the output from an eight-degree primitive polynomial has a 255-bit period, and the output from a sixteen-degree primitive polynomial has a 65535-bit period. That is, as the degree of a generator polynomial is higher, the period of an output pattern is longer and the probability that the same pattern appear is decreased. Accordingly, if the degree of a generator polynomial is, for example, sixteen or more, high-quality random numbers can be generated.

As the number of memory cells used for generating random numbers are greater, there are more physical information sources, thereby increasing the quality of random numbers. For example, if the number of memory cells from which resistance value information for generating random numbers is obtained is sixteen or more, it is possible to generate high-quality random numbers. The number of memory cells from which resistance value information is obtained may be greater than the number of channels that allow the random number generating circuit 038 to perform parallel processing. In this case, resistance value information may be obtained a plurality of times. For example, if the number of channels that allow the random number generating circuit 038 to perform parallel processing is eight and if resistance value information is obtained from sixteen memory cells, resistance value information may be first obtained from eight memory cells, and then, resistance value information may be obtained from the remaining eight memory cells.

In FIG. 30, the calculator 300 includes latches 301 through 308. The calculator 300 may include a controller (not shown) that instructs the latches 301 through 308 to latch data. Each of the latches 301 through 308 latches input a or b for each predetermined clock in accordance with an instruction from the controller. A selection circuit (MUX) 310 outputs "0" or the corresponding one of inputs DI0 through DI7 input into the calculator 300 to each of the latches 301 through 308, on the basis of an instruction (not shown) from the controller. The data to be output to each of the latches 301 through 308 is switched by the selection circuit 310 for each clock period. The output data serves as input data into the shift register.

The inputs DI0 through DI7 are input into the latches 301 through 308, respectively, as input a. XOR between the output from the selection circuit 310 and the output RN7 from the latch 308 is input into the latch 301 as input b.

The outputs from the latches 301, 305, 306, and 307 are respectively input into the subsequent latches 302, 306, 307, and 308 as input b. XOR between the outputs from the latches 302, 303, and 304 and the output RN7 from the latch 308 are respectively input into the subsequent latches 303, 304, and 305 as input b.

That is, in the calculator 300, the latches 301 through 308 form a shift register. In the shift register shown in FIG. 30, "1" and "0" are inverted between some of the stages of the shift register in accordance with the output RN7.

If the input DI0 through DI7 are initial values in calculation processing, they may be latched in the latches 301 through 308, respectively, in accordance with an instruction from the controller. At the start of calculation processing, all of the inputs DI0 through DI7 are "0", and thus, all of the latches 301 through 308 may latch "0". In other words, the values latched in the latches 301 through 308 may be initialized to "0". Then, every time a clock is input into each of the latches 301 through 308, calculations are conducted. After calculations are conducted a predetermined number of times, the outputs RN0 through RN7 from the latches 301 through 308 are output as the output of the calculator 300. Data constituted by the outputs RN0 through RN7 is used as random number data.

If the inputs DI0 through DI7 are input data in calculation processing, the selection circuit 310 selects one of the inputs DI0 through DI7 and outputs the selected input to an XOR circuit between the selection circuit 310 and the latch 301. The selection circuit 310 switches the data to be selected from among the inputs DI0 through DI7 for each clock.

The calculator 300 may determine whether the inputs DI0 through DI7 will be used as initial values or input data. For example, the inputs DI0 through DI7 input into the calculator 300 for the first time may be used as initial values. The inputs DI0 through DI7 input into the calculator 300 for the second or subsequent time may be used as input data. The number of times calculation processing is executed, that is, the number of clocks input into the latches 301 through 308 is set to be equal to or greater than the number of channels of the determination blocks 320.

With the above-described configuration, digital data generated from resistance value information is shuffled by the calculator 300, thereby enhancing the randomness of random number data. Accordingly, even if a fluctuation in the resistance value is small, high-quality random number data may be generated. Additionally, it may not be necessary to perform a write operation again for increasing a fluctuation in the resistance value.

The third embodiment may be carried out in combination with the first embodiment. The third embodiment may be carried out in combination with the second embodiment. The third embodiment may be carried out in combination with the first and second embodiments.

Fourth Embodiment

In a fourth embodiment, an authentication method in which random number generation utilizing forming and random number generation utilizing a fluctuation in the resistance value are both performed will be described below.

Figure 31:
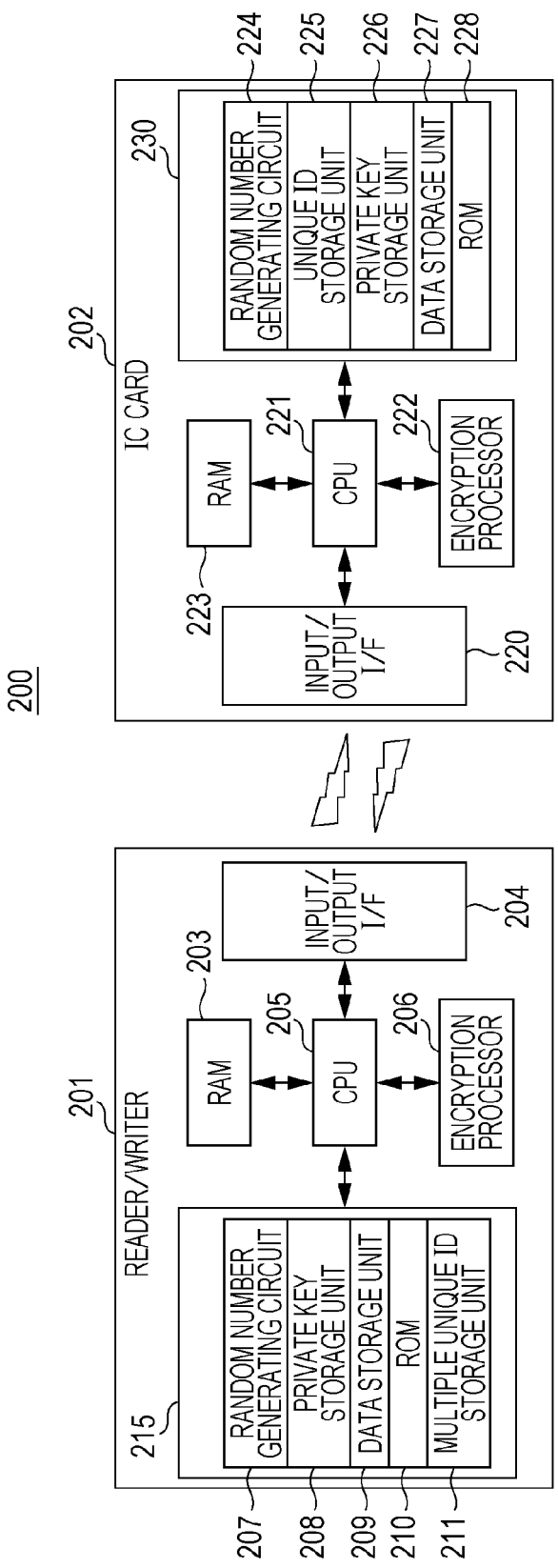
FIG. 31 is a block diagram illustrating an example of the configuration of a communication system according to a fourth embodiment.

FIG. 31 is a block diagram illustrating an example of the configuration of a communication system 200 according to the fourth embodiment. In FIG. 31, the communication system 200 includes a reader/writer 201 and an IC card 202. The reader/writer 201 and the IC card 202 perform wireless communication via their antennas.

An input/output interface (I/F) 204 of the reader/writer 201 has a radio frequency (RF) antenna. The input/output I/F 204 radiates electromagnetic waves. The input/output I/F 204 also detects electromagnetic waves transmitted from the IC card 202 by using a load change. That is, the input/output I/F 204 detects whether or not the IC card 202 is located close to the reader/writer 201. The input/output I/F 204 modulates carrier waves of a predetermined frequency supplied from an oscillation circuit (not shown), on the basis of data supplied from a central processing unit (CPU) 205. The input/output I/F 204 outputs the modulated waves from the antenna (not shown) so as to send various items of data to the IC card 202 located close to the reader/writer 201. The input/output I/F 204 also receives modulated waves from the IC card 202 via the antenna. The input/output I/F 204 then demodulates the modulated waves so as to obtain data, and supplies the data to the CPU 205.

The reader/writer 201 includes a random number processing apparatus 215. The random number processing apparatus 215 is a random number processing apparatus of an embodiment of the present disclosure. For example, the random number processing apparatus 215 may be the random number processing apparatus of one of the first and second embodiments. In the following description, the same elements as those of the first and second embodiments are designated by like reference numerals and like names, and an explanation thereof will thus be omitted. In the fourth embodiment, the random number processing apparatus 215 also serves as a non-volatile storage device.

A ROM 210 corresponds to a predetermined address region of the second-type data storing memory cell set 97 of the random number processing apparatus 215. The CPU 205 of the reader/writer 201 loads a program stored in the ROM 210 into a RAM 203 and executes various operations by using this program. In the RAM 203, data necessary for the CPU 205 to execute various operations is temporarily stored. The RAM 203 may be a volatile storage device, such as an SRAM or a dynamic random access memory (DRAM). Alternatively, the RAM 203 may be part of the second-type data storing memory cell set 97 constituted by a resistive random access memory (ReRAM).

The CPU 205 controls an encryption processor 206. The encryption processor 206 encrypts and decrypts data on the basis of a predetermined encryption algorithm. Examples of encryption algorithms are the Triple Data Encryption Standard (DES) and the Advanced Encryption Standard (AES). These algorithms are encryption algorithms of a common key cryptosystem in which encryption and decryption are performed by using a single private key. The encryption algorithm may be an algorithm of a public key cryptosystem in which encryption and decryption are performed by using different keys. An example of an encryption algorithm of the public key cryptosystem is Rivest, Shamir, Adleman (RSA) algorithm. If the public key cryptosystem is employed, in a private key storage unit 208, both of the public key of a communication partner and the private key of a communication entity (that is, the reader/writer 201) may be stored.

When the reader/writer 201 performs encryption or decryption of data, the CPU 205 first supplies the private key and data to be encrypted or decrypted to the encryption processor 206. The private key is stored in the private key storage unit 208, which is a predetermined address region within the random number processing apparatus 215. The encryption processor 206 encrypts or decrypts the data by using the supplied private key.

A random number generating circuit 207 generates random numbers by utilizing a fluctuation in the resistance value described above.

A data storage unit 209 stores therein predetermined data necessary for the CPU 205 to execute a program. In the data storage unit 209, the predetermined data may be stored in plaintext or in encrypted form encrypted by using the private key. The predetermined data may be data other than random number data. The predetermined data may be stored by using memory cells in the initial state or by using memory cells in the variable state.

The private key storage unit 208 may be at least part of the first-type data storing memory cell set 96 or at least part of the second-type data storing memory cell set 97. If the private key storage unit 208 is part of the first-type data storing memory cell set 96, the private key is stored in accordance with whether each of the variable resistance elements is in the initial state or in the variable state. Thus, the private key is not read by the normal read command, and key information is secured.

In the private key storage unit 208, the private key may be stored in plaintext or in encrypted form. In the private key storage unit 208, predetermined data encrypted with the private key may be stored together with the private key. The predetermined data may be encrypted data other than random number data.

When digital data constituted by "0" and "1" is read from memory cells in the variable state, a determination whether "0" or "1" is assigned to items of resistance value information read from the memory cells is made by using the second threshold, as described above. If items of resistance value information are read from the first-type data storing memory cell set 96 by using the second threshold, items of resistance value information of most of the memory cells are determined to be "0", and thus correct data is not read from the memory cells.

The first-type data storing memory cell set 96 and the second-type data storing memory cell set 97 can be disposed at any address within the memory cell array. Accordingly, even if a third person attempts to physically read resistance values by directly probing the memory cells, the person is unable to specify to which one of the first-type data storing memory cell set 96 and the second-type data storing memory cell set 97 the memory cells belong.

As described above, the communication system 200 shown in FIG. 31 is highly tamper resistant to a leakage of the private key. Additionally, the first-type data storing memory cell set 96 has high data retention characteristics ever under high temperature environments. Thus, when the private key is stored in the first-type data storing memory cell set 96, the occurrence of data errors is reduced.

The private key stored in the private key storage unit 208 may be the same private key as that stored in a private key storage unit 226 of the IC card 202. The private key may be stored in advance in the reader/writer 201 if it is allowed to read a unique ID of the IC card 202.

The unique ID is stored in a unique ID storage unit 225 of the IC card 202. The unique ID storage unit 225 may be at least part of the first-type data storing memory cell set 96 or at least part of the second-type data storing memory cell set 97. If the unique ID storage unit 225 is part of the first-type data storing memory cell set 96, advantages similar to those when the private key is stored in the first-type data storing memory cell set 96 may be obtained.

The unique ID is, for example, a random number unique to each IC card. The unique ID may be generated by randomly changing the states of memory cells to the variable state by forming. In this case, the unique ID is stored in the first-type data storing memory cell set 96 in accordance with the generation of random numbers. Alternatively, the unique ID may be random number data generated by utilizing a fluctuation in the resistance value. The unique ID may be written into the first-type data storing memory cell set 96.

In the unique ID storage unit 225, the unique ID may be stored in plaintext or in encrypted form. In the unique ID storage unit 225, predetermined data encrypted with the unique ID may be stored together with the unique ID. The predetermined data may be encrypted data other than random number data.

An input/output I/F 220 of the IC card 202 may include a coil antenna and an LC circuit including a capacitor. In this case, when the antenna of the IC card 202 is positioned close to the reader/writer 201, the LC circuit resonates in accordance with electromagnetic waves radiated from the reader/writer 201. The input/output I/F 220 may rectify and stabilize a resonant current and supply the resonant current to the individual elements of the IC card 202 as a DC power supply.

The input/output I/F 220 detects modulated waves received via the antenna and demodulates the modulated waves so as to obtain data. The input/output I/F 220 decodes the data into digital data and supplies it to a CPU 221. The digital data is input into, for example, a phase synchronization circuit (not shown), and the synchronization circuit generates a clock signal having a fixed frequency and a fixed phase equivalent to the sampling frequency of the digital data. The clock signal may be used for latching digital data.

The input/output I/F 220 is able to send predetermined data to the reader/writer 201. This will be described more specifically. The input/output I/F 220 encodes data input from the CPU 221. Then, the input/output I/F 220 changes a load of the antenna in accordance with the encoded data so as to modulate carrier waves of a predetermined frequency. The modulated waves are sent to the reader/writer 201 via the antenna.

The IC card 202 includes a random number processing apparatus 230. The random number processing apparatus 230 is a random number processing apparatus of an embodiment of the present disclosure. For example, the random number processing apparatus 230 may be the random number processing apparatus of one of the first and second embodiments. In the following description, the same elements as those of the first and second embodiments are designated by like reference numerals and like names, and an explanation thereof will thus be omitted. In the fourth embodiment, the random number processing apparatus 230 also serves as a non-volatile storage device.

The random number processing apparatus 230 includes a random number generating circuit 224, a unique ID storage unit 225, a private key storage unit 226, a data storage unit 227, and a ROM 228. The random number generating circuit 224 generates random numbers by utilizing a fluctuation in the resistance value. The unique ID storage unit 225 stores a unique ID unique to the IC card 202. The private key storage unit 226 stores a private key. In the data storage unit 227, data necessary for the CPU 221 to execute a program is stored. In the ROM 228, a program executed by the CPU 221 is stored. The unique ID storage unit 225, the private key storage unit 226, the data storage unit 227, and the ROM 228 may be included in one memory cell array. The CPU 221 loads the program stored in the ROM 228 to a RAM 223 and executes various operations.

The CPU 221 controls an encryption processor 222. The encryption processor 222 encrypts and decrypts data on the basis of a predetermined encryption algorithm.

In the public key cryptosystem, for example, the IC card 202 obtains a public key from the reader/writer 201, encrypts predetermined data with the public key, and sends the encrypted data to the reader/writer 201. The IC card 202 also receives encrypted data from the reader/writer 201 and decrypts the encrypted data by using the private key stored in the private key storage unit 226. Except for this point, the public key cryptosystem is the same as that of the private key cryptosystem. A description will be given below, assuming that the encryption algorithm is an algorithm of the common key cryptosystem.

In the IC card 202, the private key storage unit 226 and the unique ID storage unit 225 are, for example, at least part of the first-type data storing memory cell set 96. The CPU 221 sends a special read command to the random number processing apparatus 230, and the random number processing apparatus 230 obtains the private key from the private key storage unit 226 and sends it to the CPU 221. The CPU 221 supplies the private key and data to be encrypted or decrypted to the encryption processor 222. The encryption processor 222 encrypts or decrypts the data by using the private key.

In the data storage unit 227, predetermined data necessary for the CPU 221 to execute a program is stored. In the data storage unit 227, the predetermined data may be stored in plaintext or in encrypted form encrypted by using the private key. The predetermined data may be stored by using memory cells in the initial state or by using memory cells in the variable state.

In the private key storage unit 226, the private key may be stored in plaintext or in encrypted form. In the private key storage unit 226, predetermined data encrypted with the private key may be stored together with the private key. The predetermined data may be encrypted data other than random number data.

In the communication system 200 described above, authentication using a unique ID is conducted. Then, communication of encrypted data using a session ID and a session key is performed. The unique ID is, for example, random number data generated by forming. The session ID and the session key are, for example, random number data generated by utilizing a fluctuation in the resistance value.

First, a step of conducting authentication using the unique ID between the IC card 202 and the reader/writer 201 will be described below.

The CPU 221 sends a special read command to the random number processing apparatus 230. The random number processing apparatus 230 obtains the unique ID from the unique ID storage unit 225 and the private key from the private key storage unit 226, and sends the unique ID and the private key to the CPU 221. The CPU 221 supplies the private key and the unique ID to the encryption processor 222. The encryption processor 222 encrypts the unique ID by using the private key. The encrypted unique ID is sent to the input/output I/F 204 of the reader /writer 201 via the input/output I/F 220 of the IC card 202, and is supplied to the CPU 205 of the reader/writer 201.

The CPU 205 sends a special read command to the random number processing apparatus 215 and obtains the private key from the private key storage unit 208. The CPU 205 supplies the private key and the encrypted unique ID to the encryption processor 206. The encryption processor 206 decrypts the encrypted unique ID by using the private key. The decrypted unique ID is collated with each of a plurality of unique IDs stored in a multiple unique ID storage unit 211 in which a plurality of unique IDs are stored. If the decrypted unique ID matches one of the unique IDs stored in the multiple unique ID storage unit 211, the IC card 202 is authenticated as being qualified to perform data communication. Then, the reader/writer 201 continues data communication with the IC card 202.

In the multiple unique ID storage unit 211, each unique ID may be stored in plaintext or in encrypted form. In the multiple unique ID storage unit 211, predetermined data encrypted with a unique ID may be stored together with the unique ID. The predetermined data may be encrypted data other than random number data.

Second, a step of performing data communication between the IC card 202 and the reader/writer 201 by using a session ID and a session key will be described below.

The random number generating circuit 224 of the IC card 202 generates random number data of a required number of bits. The generated random number data is used as the session ID and the session key in communication between the IC card 202 and the reader/writer 201. The session ID is an ID to be used during only one session with a communication partner. The session key is a cryptographic key used for encryption or decryption of data to be sent and received during the session. If the session key is changed for every session, even upon the occurrence of a leakage of a session key during one session due to hacking, key data is changed for the next session. This makes it possible to protect encrypted data, thereby achieving high-security cryptographic communication.

The CPU 221 stores the random number data generated in the random number generating circuit 224 in the data storage unit 227 as a session key. The CPU 221 supplies the session key and the private key obtained from the private key storage unit 226 to the encryption processor 222. The encryption processor 222 encrypts the session key by using the private key.

The encrypted session key is stored in the data storage unit 227 as the session ID. The session ID is sent to the input/output I/F 204 of the reader/writer 201 via the input/output I/F 220, and is supplied to the CPU 205 of the reader/writer 201.

The CPU 205 sends a special read command to the random number processing apparatus 215 and obtains the private key from the private key storage unit 208. The CPU 205 then supplies the private key and the session ID to the encryption processor 206. The encryption processor 206 decrypts the session ID by using the private key so as to obtain the session key.

On the basis of an instruction from the CPU 221 of the IC card 202, the encryption processor 222 encrypts data to be sent by using the session key. The encrypted data is sent to the input/output I/F 204 of the reader/writer 201 via the input/output I/F 220 of the IC card 202, and is supplied to the CPU 205 of the reader/writer 201. On the basis of an instruction from the CPU 205, the encryption processor 206 decrypts the encrypted data by using the previously obtained session key so as to obtain plaintext data.

Communication in the opposite direction may be performed similarly. More specifically, on the basis of an instruction from the CPU 205, the encryption processor 206 encrypts data to be sent by using the previously obtained session key. The encrypted data is sent to the input/output I/F 220 of the IC card 202 via the input/output I/F 204 of the reader/writer 201, and is supplied to the CPU 221 of the reader/writer 202. On the basis of an instruction from the CPU 221, the encryption processor 222 decrypts the encrypted data by using the session key so as to obtain plaintext data.

As described above, in the communication system 200, the generation of random number data, storage of a unique ID, storage of a private key, storage of data, and storage of program data are implemented in one random number processing apparatus. Since the random number processing apparatus also serves as a non-volatile storage device, cryptographic communication is implemented without having to add a circuit for generating non-deterministic random numbers. Accordingly, the circuit scale is reduced, and the random number processing apparatus is applicable to mobile applications, such as IC cards.

Random number data generated in the random number generating circuit 207 is stored in a predetermined storage unit within the random number processing apparatus 215 without being read to the outside of the random number processing apparatus 215. In other words, random number data is generated and stored as closed processing within the random number processing apparatus 215. Accordingly, it is possible to reduce the possibility that, for example, a third person read random number data in the random number processing apparatus 215 from the outside (for example, the CPU 205), alter the random number data, and store the altered data in the storage unit. As a result, it is possible to reduce the possibility that a third person read random number data and copy it by writing it to another random number processing apparatus. This also applies to the random number processing apparatus 230 of the IC card 202.

The RAM 203 may be part of the memory cell array of the random number processing apparatus 215. The RAM 223 may be part of the memory cell array of the random number processing apparatus 230.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. In the foregoing description, details of the structures and/or functions may be changed substantially.

An aspect of the present disclosure may be applicable to, for example, an IC card, a cryptographic system, and a communication system.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A random number processing apparatus comprising:
   a memory cell in which a resistance value reversibly shifts between a plurality of resistance value ranges in accordance with an electric signal applied and in which the resistance value randomly changes over time while the resistance value is within a certain resistance value range, at least part of which is included in the plurality of resistance value ranges; and
   control circuitry that generates random number data on the basis of a plurality of items of resistance value information obtained, at a plurality of different times, from the memory cell whose resistance value is within the certain resistance value range.

2. The random number processing apparatus according to claim 1, further comprising:
a memory cell array including a first memory cell, which is the memory cell, and a second memory cell, which has the same resistance characteristics as the first memory cell, wherein
the plurality of items of resistance value information are a plurality of items of first resistance value information,
the control circuitry generates random number data on the basis of the plurality of items of first resistance value information and a plurality of items of second resistance value information obtained, at a plurality of different times, from the second memory cell whose resistance value is within the certain resistance value range.

3. The random number processing apparatus according to claim 1, wherein the control circuitry includes
a subtractor that determines a difference between two of the plurality of items of resistance value information obtained from the memory cell at two different times,
determination circuitry that determines whether or not the difference is within a first range, and
a generator that generates the random number data on the basis of a determination result of the determination circuitry.

4. The random number processing apparatus according to claim 1, wherein the control circuitry includes
determination circuitry that determines a magnitude relation between two of the plurality of items of resistance value information obtained from the memory cell at two different times, and
a generator that generates the random number data on the basis of a determination result of the determination circuitry.

5. The random number processing apparatus according to claim 1, wherein the control circuitry includes
a generator that generates digital data on the basis of the plurality of items of resistance value information, and
a calculator that generates the random number data by executing a predetermined algorithm with the digital data.

6. The random number processing apparatus according to claim 5, wherein the calculator generates the random number data by calculating a generator polynomial with the digital data as at least one of an input value and an initial value.

7. The random number processing apparatus according to claim 6, wherein:
the digital data is fixed-length data having a length of n; and
the calculator includes a shift register having n stages which are connected in accordance with rules (A), (B), and (C)
(A) output from an (x−1)-th stage or EXCLUSIVE OR between the output from the (x−1)-th stage and output from an n-th stage is input into an x-th stage, where x is an integer of two to n,
(B) output from the n-th stage or EXCLUSIVE OR between one of bits of the digital data and the output from the n-th stage is input into a first stage, and
(C) if the output from the n-th stage is input into the first stage, EXCLUSIVE OR between the output from the (x−1)-th stage and the output from the n-th stage is input into at least one of second through n-th stages, where x is an integer of two to n.

8. The random number processing apparatus according to claim 1, wherein the control circuitry includes
a generator that generates first digital data, which is fixed-length data, on the basis of the plurality of items of resistance value information,
inverting circuitry that generates a plurality of items of new digital data by inverting at least one selected from bits of the first digital data with different combinations,
a selector that sets, as second digital data, one item of data having a least frequency of appearance from among an item of the first digital data and the plurality of items of new digital data,
a calculator that generates the random number data by executing a predetermined algorithm with the second digital data, and
an adder that adds 1 to the frequency of appearance of the selected item of data.

9. The random number processing apparatus according to claim 1, wherein the control circuitry includes output circuitry, an accumulator and a generator,
the output circuitry outputs, as new resistance value information, a value obtained by multiplying a cumulative value input from the accumulator by a coefficient which is greater than 0 and smaller than 1,
the accumulator replaces the cumulative value with a new cumulative value obtained by adding the cumulative value to a value obtained by subtracting the new resistance value information from the resistance value information, and
the generator generates the random number data on the basis of a plurality of items of the new resistance value information.

10. The random number processing apparatus according to claim 1, wherein:
the plurality of resistance value ranges include a first resistance value range and a second resistance value range lower than the first resistance value range; and
the certain resistance value range is the first resistance value range.

11. The random number processing apparatus according to claim 1, wherein:
the plurality of resistance value ranges include a first resistance value range and a second resistance value range lower than the first resistance value range; and
the certain resistance value range is the second resistance value range.

12. The random number processing apparatus according to claim 1, wherein:
the plurality of resistance value ranges include a first resistance value range and a second resistance value range lower than the first resistance value range; and
the certain resistance value range is a range from a second reference value within the second resistance value range to a first reference value within the first resistance value range.

13. The random number processing apparatus according to claim 1, further comprising a first plurality of memory cells, in each of which the resistance value thereof reversibly shifts between the plurality of resistance value ranges in accordance with the electric signal applied, wherein
the control circuitry records the random number data in the first plurality of memory cells by setting the resistance value of each of the first plurality of memory cells to be within one of the plurality of resistance value ranges.

14. The random number processing apparatus according to claim 13, further comprising a second plurality of memory cells, each of which takes a variable state where the resistance value reversibly shifts between the plurality of resistance value ranges in accordance with the electric signal applied, or takes an initial state where the resistance value thereof is within an initial resistance value range and does not shift to any of the plurality of resistance value ranges unless a forming stress, which cause a shift from the initial state to the variable state, is applied, wherein:

the random number data is first random number data;

the control circuitry further records second random number data in a second plurality of memory cells in accordance with whether each of the second plurality of memory cells is in the initial state or in the state.

15. The random number processing apparatus according to claim 14, wherein the control circuitry generates and records the second random number data by applying a forming stress to at least some of the second plurality of memory cells which are in the initial state.

16. The random number processing apparatus according to claim 1, further comprising a first plurality of memory cells, each of which takes a variable state where the resistance value thereof reversibly shifts between the plurality of resistance value ranges in accordance with the electric signal applied, or takes an initial state where the resistance value thereof is within an initial resistance value range which does not overlap any of the plurality of resistance value ranges, wherein the control circuitry records the random number data in the first plurality of memory cells in accordance with whether or not the resistance value of each of the first plurality of memory cells is in the initial resistance value range.

17. A random number processing method comprising:
(a) obtaining, at a plurality of different times, a plurality of items of resistance value information from a memory cell whose resistance value is in a certain resistance value range; and
(b) generating random number data on the basis of the plurality of items of resistance value information,
wherein the memory cell has a characteristic in which the resistance value reversibly shifts between a plurality of resistance value ranges in accordance with an electric signal applied, and the memory cell also has a characteristic in which the resistance value randomly changes over time while the resistance value is within a certain resistance value range, at least part of which is included in the plurality of resistance value ranges.

18. The random number processing method according to claim 17, wherein:
the memory cell is a first memory cell included in a memory cell array;
the plurality of items of resistance value information are a plurality of items of first resistance value information;
the random number processing method further comprises
(a') obtaining, at a plurality of different times, a plurality of items of second resistance value information from a second memory cell whose resistance value is in the certain resistance value range, the second memory cell having the same resistance characteristics as the first memory cell; and
in the step (b), the random number data is generated on the basis of the plurality of items of first resistance value information and the plurality of items of second resistance value information.

19. The random number processing method according to claim 17, wherein the step (b) includes
(b1) determining a difference between two of the plurality of items of resistance value information obtained from the memory cell at two different times,
(b2) determining whether or not the difference is within a first range, and
(b3) generating the random number data on the basis of a determination result in the step (b2).

20. The random number processing method according to claim 17, wherein the step (b) includes
(b4) determining a magnitude relation between two of the plurality of items of resistance value information obtained from the memory cell at two different times, and
(b5) generating the random number data on the basis of a determination result in the step (b4).

* * * * *